United States Patent
Liu et al.

(10) Patent No.: US 12,324,327 B2
(45) Date of Patent: Jun. 3, 2025

(54) DISPLAY SUBSTRATE AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Biao Liu, Beijing (CN); Mengmeng Du, Beijing (CN); Hongwei Ma, Beijing (CN); Xiaoqing Shu, Beijing (CN); Zhenhua Zhang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 850 days.

(21) Appl. No.: 17/430,675

(22) PCT Filed: Sep. 29, 2020

(86) PCT No.: PCT/CN2020/118962
§ 371 (c)(1),
(2) Date: Aug. 12, 2021

(87) PCT Pub. No.: WO2021/218030
PCT Pub. Date: Nov. 4, 2021

(65) Prior Publication Data
US 2022/0052147 A1    Feb. 17, 2022

(51) Int. Cl.
*H10K 50/813*    (2023.01)
*G09G 3/3233*    (2016.01)
(Continued)

(52) U.S. Cl.
CPC ......... *H10K 59/131* (2023.02); *G09G 3/3233* (2013.01); *H10K 50/813* (2023.02);
(Continued)

(58) Field of Classification Search
CPC ............... H10K 50/813; H10K 59/353; H10K 59/80515; H10K 59/352
See application file for complete search history.

(56) References Cited

U.S. PATENT DOCUMENTS 9,245,932 B2   1/2016   Yoon et al.
10,381,381 B1  8/2019   Choi et al.
(Continued)

FOREIGN PATENT DOCUMENTS

CN   105789253 A   7/2016
CN   105895655 A   8/2016
(Continued)

OTHER PUBLICATIONS

Extended European Search Report for the European Patent Application No. 20904234.0 issued by the European Patent Office on Sep. 14, 2023.
(Continued)

*Primary Examiner* — Phat X Cao
(74) *Attorney, Agent, or Firm* — XSENSUS LLP

(57) ABSTRACT

A display substrate includes a base substrate and a plurality of sub-pixels. A sub-pixel includes a pixel electrode and an effective light-emitting region. The pixel electrode includes a main body portion and a connection portion that are interconnected. Shapes of the main body portion and the effective light-emitting region are the same, and at least partial borders of the main body portion and the pixel electrode coincide. The plurality of sub-pixels at least
(Continued)

includes a first sub-pixel and a second sub-pixel, and light emitted by the first sub-pixel and second sub-pixel is the same.

19 Claims, 26 Drawing Sheets

(51) Int. Cl.
    *H10K 59/121*     (2023.01)
    *H10K 59/131*     (2023.01)
    *H10K 59/35*     (2023.01)

(52) U.S. Cl.
    CPC ....... *H10K 59/1216* (2023.02); *H10K 59/353* (2023.02); *G09G 2300/0426* (2013.01); *G09G 2300/0452* (2013.01); *G09G 2300/0465* (2013.01); *G09G 2300/0819* (2013.01); *G09G 2300/0842* (2013.01); *H10K 59/351* (2023.02)

(56) References Cited

U.S. PATENT DOCUMENTS

| | | | |
|---|---|---|---|
| 10,943,967 B2* | 3/2021 | Kim | H10K 59/1216 |
| 11,348,523 B2 | 5/2022 | Chen et al. | |
| 11,903,274 B2 | 2/2024 | Yang et al. | |
| 2015/0048322 A1 | 2/2015 | So et al. | |
| 2016/0071916 A1 | 3/2016 | Kim et al. | |
| 2016/0203748 A1 | 7/2016 | Matsueda et al. | |
| 2016/0240810 A1 | 8/2016 | Oh et al. | |
| 2016/0260792 A1 | 9/2016 | Kim et al. | |
| 2016/0315127 A1 | 10/2016 | Yoon et al. | |
| 2016/0322448 A1 | 11/2016 | Kim | |
| 2017/0236882 A1 | 8/2017 | Matsunaga et al. | |
| 2018/0062107 A1 | 3/2018 | Kim et al. | |
| 2018/0159064 A1 | 6/2018 | Wu et al. | |
| 2018/0190752 A1 | 7/2018 | An et al. | |
| 2018/0350886 A1 | 12/2018 | An et al. | |
| 2020/0043990 A1 | 2/2020 | Huangfu et al. | |
| 2020/0075691 A1 | 3/2020 | Zhou et al. | |
| 2020/0142265 A1 | 5/2020 | Zhao et al. | |
| 2020/0168692 A1 | 5/2020 | Liu et al. | |
| 2020/0219943 A1 | 7/2020 | Hong et al. | |
| 2020/0257173 A1 | 8/2020 | Tsuchiya et al. | |
| 2020/0411611 A1 | 12/2020 | Liu et al. | |
| 2021/0134896 A1 | 5/2021 | Guo et al. | |
| 2021/0142707 A1 | 5/2021 | Zheng | |
| 2021/0193766 A1 | 6/2021 | Liu et al. | |
| 2023/0024556 A1* | 1/2023 | Ko | H01L 27/124 |

FOREIGN PATENT DOCUMENTS

| | | |
|---|---|---|
| CN | 106067476 A | 11/2016 |
| CN | 107799548 A | 3/2018 |
| CN | 108269520 A | 7/2018 |
| CN | 108538884 A | 9/2018 |
| CN | 109188805 A | 1/2019 |
| CN | 109301088 A | 2/2019 |
| CN | 109427851 A | 3/2019 |
| CN | 109801946 A | 5/2019 |
| CN | 110133885 A | 8/2019 |
| CN | 110137214 A | 8/2019 |
| CN | 110265442 A | 9/2019 |
| CN | 110265458 A | 9/2019 |
| CN | 110444569 A | 11/2019 |
| CN | 110491911 A | 11/2019 |
| CN | 110600509 A | 12/2019 |
| CN | 111063711 A | 4/2020 |
| CN | 111183390 A | 5/2020 |
| CN | 111490068 A | 8/2020 |
| EP | 3480807 A1 | 5/2019 |
| KR | 10-2019-0041863 A | 4/2019 |
| WO | 2019153938 A1 | 8/2019 |

OTHER PUBLICATIONS

Corrected Notice of Allowability for the U.S. Appl. No. 17/299,565 issued by the United States Patent and Trademark Office on Nov. 24, 2023.

Notice of Allowance issued for the U.S. Appl. No. 17/299,565 issued by the USPTO on Oct. 2, 2023.

Extended European Search Report on the European Patent Application No. 20929680.5 issued by the European Patent Office on Jul. 25, 2023.

International Search Report and Written Opinion of the International Searching Authority of International Application No. PCT/CN2020/086997 mailed on Jan. 12, 2021.

International Search Report and Written Opinion of the International Searching Authority of International Application No. PCT/CN2020/114559 mailed on Dec. 30, 2020.

International Search Report and Written Opinion of the International Searching Authority of International Application No. PCT/CN2020/114623 mailed on Jan. 13, 2021.

Extended European Search Report for the European Patent Application No. 20931708.0 issued by the European Patent Office on Jun. 4, 2024.

Office Action for the U.S. Appl. No. 18/539,847 issued by the USPTO on Jul. 16, 2024.

* cited by examiner

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2020/118962 filed on Sep. 29, 2020, which claims priority to International Patent Application No. PCT/CN2020/086997 filed on Apr. 26, 2020, and International Patent Application No. PCT/CN2020/114623 filed on Sep. 10, 2020, which are incorporated herein by reference in their entirety.

TECHNICAL FIELD

The present disclosure relates to the field of display technologies, and in particular, to a display substrate and a display apparatus.

BACKGROUND

Active-matrix organic light-emitting diode (AMOLED) display substrates have been widely used in display apparatuses due to their advantages of self-luminescence, wide color gamut, high contrast, flexibility and high response.

At present, under the trend of gradually increasing a distribution density of pixels in an AMOLED display substrate, a size of the pixel in the AMOLED display substrate is reduced, and thus space of the pixel for design is limited. On this basis, reasonably optimizing a structure of a pixel circuit and a manufacturing process thereof is conducive to improving a display effect of a display apparatus where the AMOLED display substrate is located.

SUMMARY

In one aspect, some embodiments of the present disclosure provide a display substrate. The display substrate includes a base substrate and a plurality of sub-pixels. A sub-pixel includes a pixel electrode and an effective light-emitting region. The pixel electrode includes a main body portion and a connection portion that are interconnected. Shapes of the main body portion and the effective light-emitting region are same, and at least partial borders of the main body portion and the pixel electrode coincide. The plurality of sub-pixels at least include a first sub-pixel and a second sub-pixel, and light emitted by the first sub-pixel and the second sub-pixel are same. Areas of orthogonal projections of two pixel electrodes of the first sub-pixel and the second sub-pixel on the base substrate are different. Two orthogonal projections of a connection portion and a main body portion of at least one of the first sub-pixel or the second sub-pixel on a straight line extending in a first direction are at least partially non-overlapped. An orthogonal projection of a pixel electrode of the second sub-pixel on a straight line extending in a second direction is located within an orthogonal projection of a pixel electrode of the first sub-pixel on the same straight line. The second direction intersects with the first direction, and an included angle between the second direction and the first direction is in a range from 80° to 100°.

In some embodiments, the main body portion includes a first edge, a second edge and a third edge that are connected in sequence, and the third edge extends in the second direction. The connection portion is connected to the second edge, and the connection portion and the first edge have a spacing therebetween. A region enclosed by the main body portion, the connection portion and a connecting straight line between any point on the first edge and any point on an edge of the connection portion extending in the second direction and away from the third edge in the first direction, is a notch region.

In some embodiments, the display substrate further includes a plurality of layers between the base substrate and the pixel electrode, and the plurality of layers include at least one metal pattern. In a thickness direction of the base substrate, at least portion of the notch region is non-overlapping with the metal pattern.

In some other embodiments, the display substrate further includes a plurality of layers between the base substrate and the pixel electrode, and the plurality of layers include a semiconductor pattern and at least one metal pattern. In a thickness direction of the base substrate, at least portion of the notch region is non-overlapping with the semiconductor pattern and the metal pattern.

In some embodiments, a connection portion of the pixel electrode of the first sub-pixel includes: a bending portion and a compensation portion connected to the bending portion. The compensation portion extends in the second direction. The bending portion is connected to the second edge, and the bending portion and the first edge have a spacing therebetween.

In some embodiments, a ratio of areas of two orthogonal projections of the notch region and the bending portion on the base substrate is in a range from 0.2 to 5.

In some embodiments, a maximum dimension of the compensation portion in the first direction is greater than a maximum dimension of the bending portion in the first direction.

In some embodiments, a maximum dimension of a connection portion of the pixel electrode of the second sub-pixel in the second direction is less than or equal to a maximum dimension of the bending portion of the pixel electrode of the first sub-pixel in the second direction.

In some embodiments, the sub-pixel further includes a pixel circuit. The pixel circuit includes a driving transistor. The display substrate further includes metal patterns at a same potential as a control electrode of the driving transistor. Orthogonal projections of the metal patterns on the base substrate are first projections. An area of a region where an orthogonal projection of the pixel electrode of the first sub-pixel on the base substrate and a first projection corresponding to the first sub-pixel overlap is a first area. An area of a region where an orthogonal projection of the pixel electrode of the second sub-pixel on the base substrate and a first projection corresponding to the second sub-pixel overlap is a second area. A ratio of the first area to the second area is in a range from 0.8 to 1.2.

In some embodiments, the display substrate further includes: a first gate metal layer located between the base substrate and the pixel electrode, and a first metal layer located between the first gate metal layer and the pixel electrode. The metal patterns at the same potential as the control electrode of the driving transistor include: first electrodes, located in the first gate metal layer, of capacitors, and first transfer electrodes located in the first metal layer.

An area of a region where orthogonal projections of the pixel electrode of the first sub-pixel and a first electrode of a corresponding capacitor on the base substrate overlap is less than an area of a region where orthogonal projections of the pixel electrode of the second sub-pixel and a first electrode of a corresponding capacitor on the base substrate overlap. An area of a region where orthogonal projections of the pixel electrode of the first sub-pixel and a corresponding first transfer electrode on the base substrate overlap is greater than an area of a region where orthogonal projections of the pixel electrode of the second sub-pixel and a corresponding first transfer electrode on the base substrate overlap.

In some embodiments, the display substrate further includes: a plurality of signal lines extending in the first direction. An orthogonal projection of the pixel electrode of the first sub-pixel on the base substrate is overlapped with orthogonal projections of at least three signal lines in a same layer on the base substrate.

In some embodiments, the at least three signal lines in the same layer include: at least one gate scanning signal line, at least one light-emitting control signal line, and at least one reset control signal line.

In some embodiments, the display substrate further includes: a first insulating layer and a plurality of connection electrodes. The first insulating layer is located between all pixel electrodes and the connection electrodes, and has a plurality of first via holes. A pixel electrode is correspondingly coupled to a connection electrode through a first via hole. The sub-pixel further includes a pixel circuit. All pixel circuits are arranged in the first direction to form rows, and are arranged in the second direction to form columns. Orthogonal projections of a plurality of first via holes corresponding to a plurality of pixel circuits in a same row on the base substrate are arranged along a first straight line. In a plurality of sub-pixels corresponding to the plurality of pixel circuits in the same row, effective light-emitting regions of first sub-pixels and effective light-emitting regions of second sub-pixels are respectively located at opposite sides of the first straight line.

In some embodiments, the display substrate further includes a second insulating layer and a plurality of driving electrodes. The second insulating layer is located between the plurality of connection electrodes and the driving electrodes, and has a plurality of second via holes. A connection electrode is correspondingly coupled to a driving electrode through a second via hole. Orthogonal projections of a first via hole and a second via hole corresponding to the same connection electrode on the base substrate have a spacing therebetween.

In some embodiments, orthogonal projections of a plurality of second via holes corresponding to the plurality of pixel circuits in the same row on the base substrate are arranged along a second straight line.

In some embodiments, a distance between an orthogonal projection of any one of the first via hole and the second via hole on the base substrate and an effective light-emitting region of a corresponding sub-pixel is greater than 2 µm.

In some embodiments, shapes of the orthogonal projections of the first via hole and the second via hole on the base substrate are approximately same, and areas of the orthogonal projections of the first via hole and the second via hole on the base substrate are approximately same. The orthogonal projections of the first via hole and the second via hole corresponding to the same connection electrode on the base substrate are arranged along a third straight line.

In some embodiments, shapes of orthogonal projections of a driving electrode and a connection electrode on the base substrate are approximately same, and an area of an orthogonal projection of the connection electrode on the base substrate is greater than an area of an orthogonal projection of the driving electrode on the base substrate.

In some embodiments, the orthogonal projection of the driving electrode on the base substrate is located within the orthogonal projection of the connection electrode on the base substrate, and partial borders of orthogonal projections of the driving electrode and the connection electrode approximately coincide.

In some embodiments, the orthogonal projection of the connection electrode on the base substrate has a portion being non-overlapping with the orthogonal projection of the driving electrode on the base substrate, and an orthogonal projection of the first via hole on the base substrate is overlapped with the portion.

In some embodiments, the display substrate further includes a semiconductor pattern layer and a third insulating layer. The semiconductor pattern layer is located between the base substrate and the driving electrodes. The third insulating layer is located between the driving electrodes and the semiconductor pattern layer, and has a plurality of third via holes. The driving electrode is coupled to a corresponding portion of the semiconductor pattern layer through a third via hole. Every two of three orthogonal projections of the third via hole, the second via hole and the first via hole corresponding to the same driving electrode on the base substrate have a spacing therebetween.

In some embodiments, a minimum distance between an orthogonal projection of any one of the first via hole and the second via hole on the base substrate and an orthogonal projection of the third via hole on the base substrate is in a range from 0.8 µm to 10 µm. A minimum distance between orthogonal projections of the first via hole and the second via hole on the base substrate is in a range from 1 µm to 10 µm.

In some embodiments, the display substrate further includes a plurality of data lines. The plurality of data lines and the driving electrodes are disposed in a same layer. The third insulating layer further has a plurality of fourth via holes. A data line is connected to a corresponding pixel circuit through a fourth via hole. The data line extends in the second direction, and the data line includes a plurality of protrusion portions protruding towards the corresponding pixel circuit in the first direction. An overlapping area of an orthogonal projection of the fourth via hole on the base substrate and an orthogonal projection of a protrusion portion on the base substrate is 70% to 100% of an area of the orthogonal projection of the fourth via hole on the base substrate.

In some embodiments, the display substrate further includes a plurality of power signal lines. The plurality of power signal lines include at least one first power signal line. The first power signal line and the connection electrode are disposed in a same layer. The first power signal line includes a plurality of first sub-power signal lines extending in the first direction and a plurality of second sub-power signal lines extending in the second direction. The first sub-power signal lines are interconnected with the second sub-power signal lines.

Two effective light-emitting regions of a first sub-pixel and a second sub-pixel closest to each other have a spacing therebetween. An orthogonal projection of a first sub-power signal line on the base substrate passes through the spacing between the two effective light-emitting regions of the first sub-pixel and the second sub-pixel. At least one second sub-power signal line has at least one break. A virtual connection line between two end points of the break in the second direction extends through the two effective light-emitting regions of the first sub-pixel and the second sub-pixel and the spacing therebetween. The second sub-power signal line having the break is non-overlapping with orthogonal projections of the two effective light-emitting regions of the first sub-pixel and the second sub-pixel and the spacing therebetween on the base substrate.

In some embodiments, the plurality of power signal lines further include a plurality of second power signal lines. The plurality of second power signal lines extend in the second direction. The plurality of second power signal lines and the driving electrodes are disposed in a same layer. The second insulating layer further has a plurality of fifth via holes. A second sub-power signal line is correspondingly coupled to a second power signal line through a fifth via hole.

Orthogonal projections of the second power signal line and the second sub-power signal line coupled thereto on the base substrate are at least partially overlapped. An orthogonal projection of the second power signal line on the base substrate is partially overlapped with an orthogonal projection of an effective light-emitting region of any one of the first sub-pixel and the second sub-pixel on the base substrate.

In some embodiments, a distance between an orthogonal projection of a fifth via hole on the base substrate and an orthogonal projection of any effective light-emitting region on the base substrate is greater than 2.5 μm.

In some embodiments, the first sub-pixel and the second sub-pixel closest to each other form a sub-pixel pair. The plurality of sub-pixels further include first color sub-pixels and third color sub-pixels. One first color sub-pixel, one sub-pixel pair and one third color sub-pixel that are sequentially arranged in the first direction form a sub-pixel group. The sub-pixel pair is configured to emit light with a second color. A center of an orthogonal projection of at least one of a first effective light-emitting region of the first color sub-pixel or a third effective light-emitting region of the third color sub-pixel on the base substrate is located within an orthogonal projection of a corresponding first sub-power signal line on the base substrate.

In some embodiments, distances from two second sub-power signal lines located at both sides of the first effective light-emitting region of the first color sub-pixel and adjacent to the first effective light-emitting region to a center line of the first effective light-emitting region extending in the second direction are different. The display substrate further includes a plurality of pad blocks and a plurality of supporting portions that are disposed in the same layer with the first power signal lines. The pad blocks extend in the second direction. A pad block is located between the first effective light-emitting region and the second sub-power signal line, and is correspondingly coupled to the second sub-power signal line through a supporting portion. A distance between the second sub-power signal line coupled to the pad block and the center line of the first effective light-emitting region extending in the second direction is greater than a distance between another second sub-power signal line adjacent to the first effective light-emitting region and the center line. The pad block is further correspondingly coupled to the first sub-power signal line.

In some embodiments, a shape of the pad block is approximately elongated. A center of an orthogonal projection of the pad block on the base substrate is located within the orthogonal projection of the first sub-power signal line coupled to the pad block on the base substrate.

In some embodiments, a ratio of a distance between an orthogonal projection of an effective light-emitting region of the first sub-pixel on the base substrate and an orthogonal projection of a first sub-power signal line on the base substrate and a distance between an orthogonal projection of an effective light-emitting region of the second sub-pixel on the base substrate and the orthogonal projection of the first sub-power signal line on the base substrate is in a range from 0.9 to 1.1, and the first sub-power signal line is located between the two effective light-emitting regions of the first sub-pixel and the second sub-pixel.

In another aspect, a display apparatus is provided. The display apparatus includes the display substrate as described in any one of the above embodiments.

BRIEF DESCRIPTION OF THE DRAWINGS

In order to describe technical solutions in some embodiments of the present disclosure more clearly, the accompanying drawings to be used in the description of some embodiments will be introduced briefly below. Obviously, the accompanying drawings to be described below are merely some embodiments of the present disclosure, and a person of ordinary skill in the art may obtain other drawings according to these drawings.

FIG. 6E' is a schematic diagram of a position relationship between a first metal layer and via holes in a second interlayer insulating layer 140, in accordance with some embodiments of the present disclosure;

FIG. 6G' is a schematic diagram of a position relationship between a second metal layer and via holes in a first planarization layer 122, in accordance with some embodiments of the present disclosure;

FIG. 6H' is a schematic diagram of a position relationship between the second metal layer and via holes in a second planarization layer 121, in accordance with some embodiments of the present disclosure;

FIG. 6I' is a schematic diagram of a position relationship between the second metal layer and a pixel electrode layer, in accordance with some embodiments of the present disclosure;

DETAILED DESCRIPTION

Figure 1:
FIG. 1 is a schematic diagram of a display apparatus, in accordance with some embodiments of the present disclosure.

Technical solutions in some embodiments of the present disclosure will be described clearly and completely below with reference to the accompanying drawings in some embodiments of the present disclosure. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, term "comprise" and other forms thereof such as the third-person singular form "comprises" and the present participle form "comprising" throughout the description and the claims are construed as open and inclusive, i.e., "including, but not limited to". In the description of the specification, the terms, such as "one embodiment", "some embodiments", "exemplary embodiments", "example", "specific example", and "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Hereinafter, orientation terms, such as "upper", "lower", "left", and "right", may include, but are not limited to, those defined relative to the schematic placement of the components in the drawings, and it is to be understood that these orientation terms may be relative concepts, which are used for descriptive and clarifying purposes, and may vary correspondingly according to the changes in the orientations of the components in the drawings.

Terms such as "first" and "second" are only used for descriptive purposes, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their extensions may be used. For example, the term "connected" may be used in the description of some embodiments to indicate that two or more components are in direct physical contact or electrical contact with each other. For another example, the term "coupled" may be used in the description of some embodiments to indicate that two or more components are in direct physical contact or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" means an open and inclusive expression, which does not exclude devices that are applicable to or configured to perform additional tasks or steps. In addition, use of "based on" means openness and inclusiveness, because processes, steps, calculations or other actions "based on" one or more of the stated conditions or values may be based on additional conditions or exceed the stated values in practice.

The term "about" or "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Moreover, in order to clearly illustrate layers and regions in the drawings, thicknesses of the layers in the drawings are enlarged to clearly illustrate relative positions of the layers. When a portion, such as a layer, film, region or plate, is expressed as being located "on" other portion(s), the expression includes not only a case where the portion is "all on" other portion(s), but also a case where other layer(s) exist therein.

Embodiments of the present disclosure provide a display apparatus. The display apparatus is, for example, a mobile phone, a pad, a computer, a smart wearable product (e.g., a smart watch, a smart bracelet), a portable electronic device, a virtual reality (VR) terminal, an augmented reality (AR) terminal. The embodiments of the present disclosure do not specifically limit a specific form of the display apparatus.

The display apparatus provided by the embodiments of the present disclosure will be described in detail below with reference to the accompanying drawings.

For convenience of description, hereinafter a display apparatus 01 is a mobile phone as shown in FIG. 1 for illustration. In this case, the display apparatus 01 at least includes a housing 11 and a display substrate 10 mounted in the housing 11. The housing 11 is generally provided with a receiving cavity (not shown in FIG. 1) capable of receiving a printed circuit board (PCB), a battery, a camera and other components.

Figure 2A:
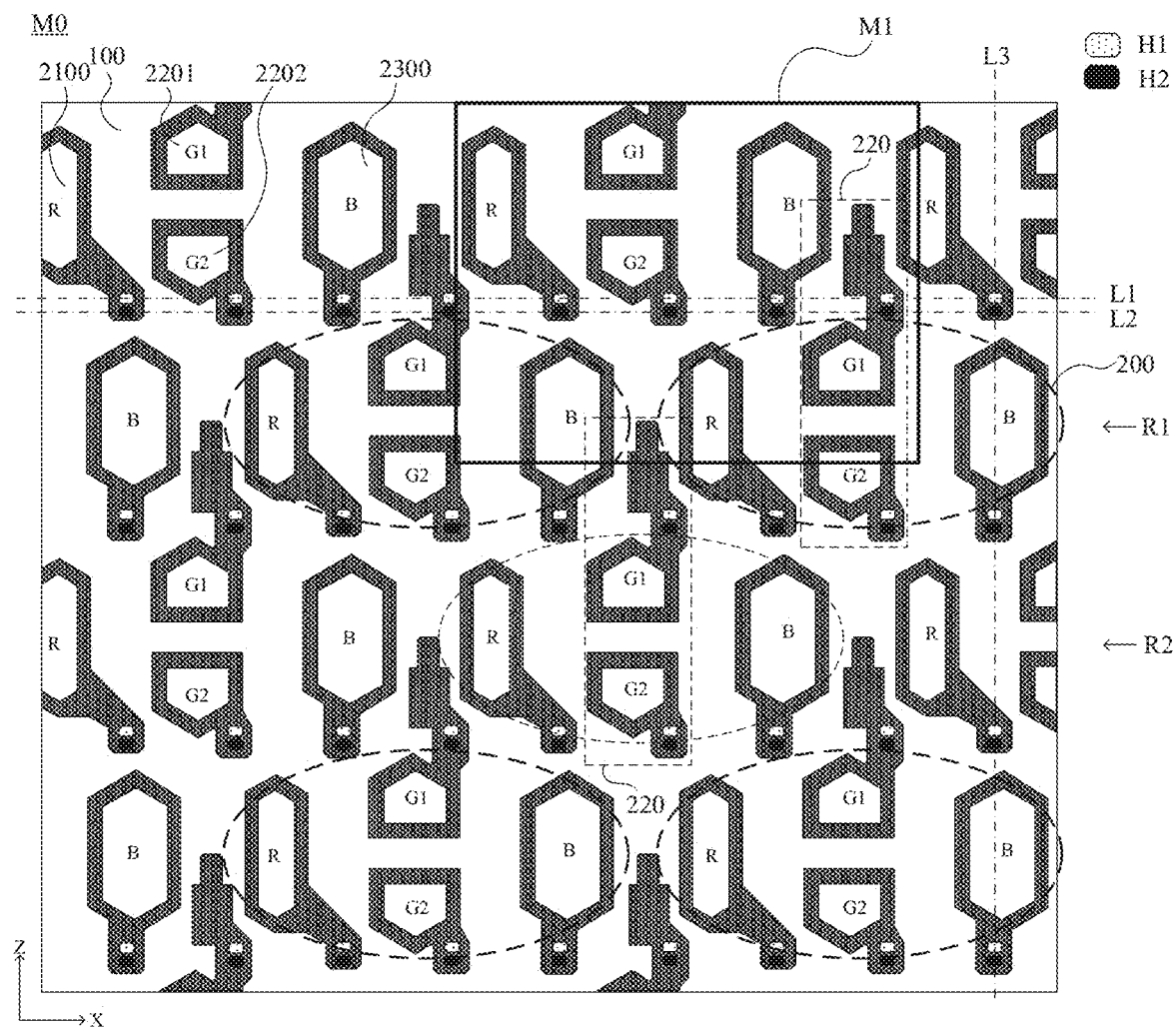
FIG. 2A is an enlarged schematic diagram of a display substrate in an M0 region, in accordance with some embodiments of the present disclosure.
Figure 2B:
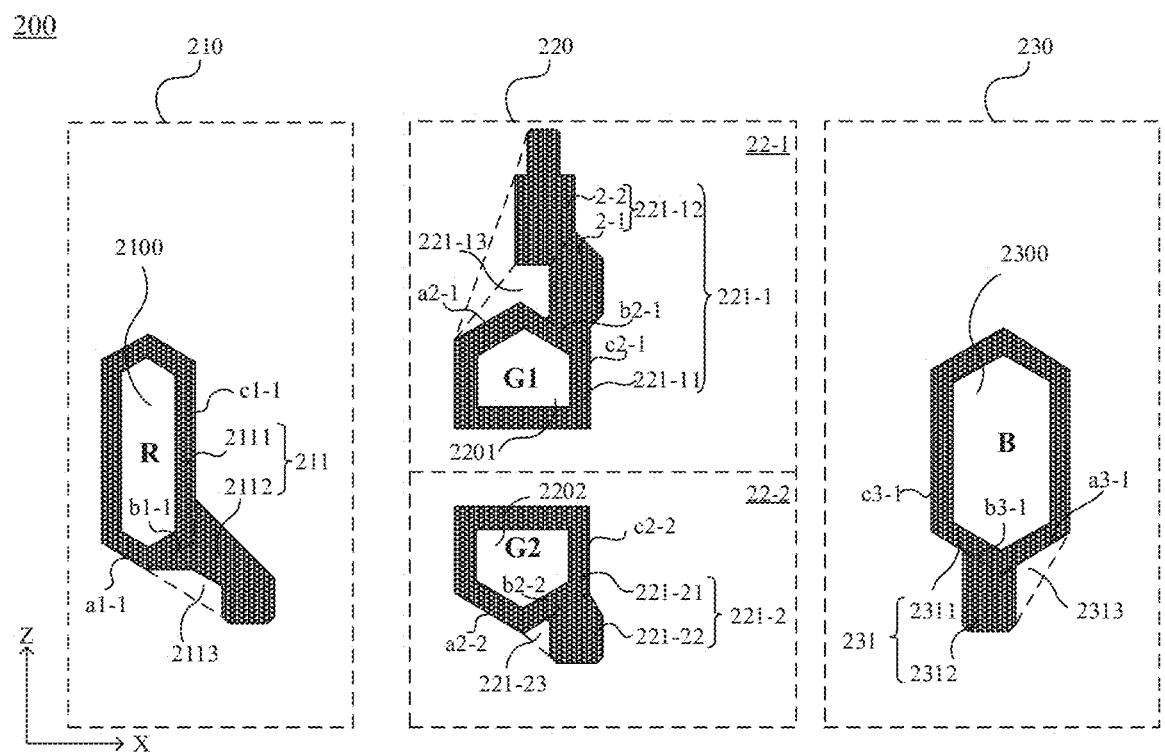
FIG. 2B is a schematic structural diagram of a sub-pixel group, in accordance with some embodiments of the present disclosure.

FIG. 2A is an enlarged schematic diagram of a display substrate 10 in an M0 region in FIG. 1. FIG. 2B is a schematic structural diagram of a sub-pixel group in the display substrate 10. Hereinafter, with reference to FIGS. 2A and 2B, the description will be made by taking an example where the display substrate 10 is an AMOLED display substrate, but the present disclosure is not limited thereto.

In some embodiments, as shown in FIGS. 2A and 2B, the display substrate 10 includes a base substrate 100 and a plurality of sub-pixel groups 200 on the base substrate 100. Each sub-pixel group may be composed of a plurality of sub-pixels, and each sub-pixel includes a pixel electrode and an effective light-emitting region. For example, as shown in FIG. 2B, each sub-pixel group 200 includes one first color sub-pixel 210, one second color sub-pixel pair 220 and one third color sub-pixel 230 that are all arranged in a first direction (an X direction shown in the figure). The second color sub-pixel pair 220 includes a first sub-pixel 22-1 and a second sub-pixel 22-2 that are arranged in a second direction (a Z direction shown in the figure), and the color of light emitted by them are the same. An effective light-emitting region of the first color sub-pixel 210 is a first effective light-emitting region 2100. In the second color sub-pixel pair 220, an effective light-emitting region of the first sub-pixel 22-1 is a first sub-effective light-emitting region 2201, and an effective light-emitting region of the second sub-pixel 22-2 is a second sub-effective light-emitting region 2202. An effective light-emitting region of the third color sub-pixel 230 is a third effective light-emitting region 2300.

A pixel electrode of a sub-pixel includes a main body portion and a connection portion that are interconnected. For example, as shown in FIG. 2B, a pixel electrode 211 of the first color sub-pixel 210 includes a main body portion 2111 and a connection portion 2112 that are interconnected; a pixel electrode 221-1 of the first sub-pixel 22-1 in the second color sub-pixel pair 220 includes a main body portion 221-11 and a connection portion 221-12 that are interconnected; a pixel electrode 221-2 of the second sub-pixel 22-2 in the second color sub-pixel pair 220 includes a main body portion 221-21 and a connection portion 221-22 that are interconnected; a pixel electrode 231 of the third color sub-pixel 230 includes a main body portion 2311 and a connection portion 2312 that are interconnected. It will be understood with reference to FIG. 2B that, a shape of a main body portion of each pixel electrode is approximately the same as a shape of an effective light-emitting region of a sub-pixel to which it belongs, and at least partial borders of the main body portion and the pixel electrode coincide.

Figure 2C:
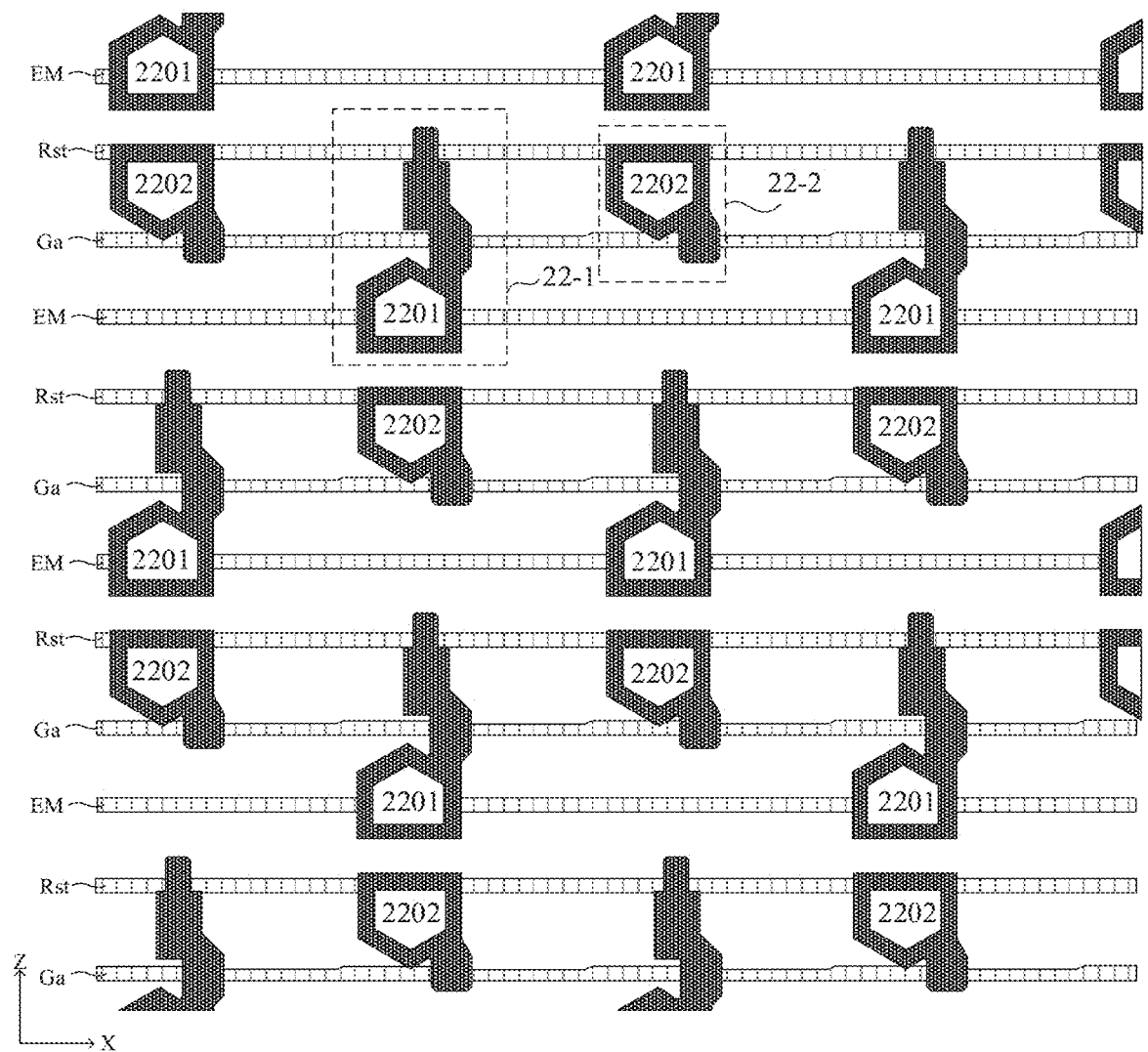
FIG. 2C is a schematic diagram of a distribution of a kind of sub-pixels on a base substrate, in accordance with some embodiments of the present disclosure.

It will be understood with reference to FIG. 2B that, in some embodiments, as shown in FIG. 2C, a plurality of sub-pixels on the base substrate 100 at least include one first sub-pixel 22-1 and one second sub-pixel 22-2, and the light emitted by them has the same color. Areas of orthogonal projections of two pixel electrodes of the first sub-pixel 22-1 and the second sub-pixel 22-2 on the base substrate 100 are different. Two orthogonal projections of the connection portion and the main body portion of at least one of the first sub-pixel 22-1 and the second sub-pixel 22-2 on a straight line extending in the first direction (e.g., the X direction) are at least partially not overlapped. An orthogonal projection of a pixel electrode of the second sub-pixel 22-2 on a straight line extending in the second direction (e.g., the Z direction) is located within an orthogonal projection of a pixel electrode of the first sub-pixel 22-1 on the same straight line. Herein, the second direction intersects with the first direction, and an included angle between the second direction and the first direction is in a range from 80° to 100°. In the embodiments of the present disclosure, a plurality of sub-pixels with the same color of light emitted by them adopt two different structures as shown in the first sub-pixel 22-1 and the second sub-pixel 22-2, and by designing shapes of pixel electrodes in the first sub-pixel 22-1 and the second sub-pixel 22-2, an overall layout design of pixel circuits in the display substrate 10 may be effectively simplified on a basis of increasing a distribution density of the sub-pixels, so as to improve light transmittance of the display substrate 10.

For convenience of description, the following description will be made by taking an example in which the display substrate 10 has a structure as shown in FIG. 2A.

With continued reference to FIG. 2A, a plurality of sub-pixel groups 200 are arranged in the first direction (e.g., the X direction) to form sub-pixel rows. The sub-pixel rows are arranged in the second direction (e.g., the Z direction), and sub-pixel groups in any two adjacent rows of the sub-pixel rows are staggered in the first direction, that is, there is a certain offset between any two adjacent sub-pixel rows in the first direction. Therefore, in any two adjacent sub-pixel rows, sub-pixels configured to emit light with the same color are not aligned in the second direction. An arrangement of second color sub-pixel pairs 220 is taken as an example, and as shown in FIG. 2A, in second color sub-pixel pairs 220 in any two adjacent rows in the second direction, a second color sub-pixel pair 220 in a second row R2 and a second color sub-pixel pair 220 in a first row R1 are staggered in the first direction, and the first row R1 and the second row R2 are arranged in the second direction.

In addition, in some examples, the first direction is a row direction, an arrangement manner of sub-pixel groups in odd-numbered sub-pixel rows are the same, and an arrangement manner of sub-pixel groups in even-numbered sub-pixel rows are the same.

Optionally, an offset of two adjacent sub-pixel rows in the first direction is approximately half of a dimension of the sub-pixel group 200 in the first direction. For example, the dimension of the sub-pixel group 200 in the first direction is a pitch of the sub-pixel group 200 in the first direction. Herein, the pitch refers to a distance between centers of effective light-emitting regions of two first color sub-pixels 210 in two adjacent sub-pixel groups 200 in the first direction. A center of an effective light-emitting region refers to a geometric center of a shape of an orthogonal projection of the effective light-emitting region on the base substrate. The shape of the orthogonal projection of the effective light-emitting region on the base substrate 100 is approximately a regular shape, e.g., a symmetrical shape.

Furthermore, it will be understood that a center involved in some embodiments of the present disclosure refers to a geometric center for a regular shape, and refers to an approximate geometric center for an irregular shape. For example, a regular shape with a high similarity to the irregular shape is simulated, and then a geometric center of the simulated shape is taken as the center of the irregular shape.

The first direction intersects with the second direction, and an included angle between the first direction and the second direction is in a range from 80° to 100°. For example, the first direction and the second direction are two directions perpendicular to each other in the same plane. For example, the plane is a plane in which the sub-pixels are arranged, i.e., a plane parallel to the base substrate 100.

The sub-pixel group serves as a repeating unit, and repetition only refers to repetition of arrangement of sub-pixels, and other structures may be different or the same. Moreover, the repetition means that positions, shapes and dimensions are approximate the same. In some cases, for wire or hole requirement, the shapes may be slightly different. For example, holes are provided at different positions.

In some examples, the first color sub-pixel 210 is a red sub-pixel R. The first sub-pixel 22-1 and the second sub-pixel 22-2 in the second color sub-pixel pair 220 is corresponding to a green sub-pixel G1 and a green sub-pixel G2. The third color sub-pixel 230 is a blue sub-pixel B. However, the present disclosure is not limited thereto, and colors of the color sub-pixels may be interchanged.

Figure 3:
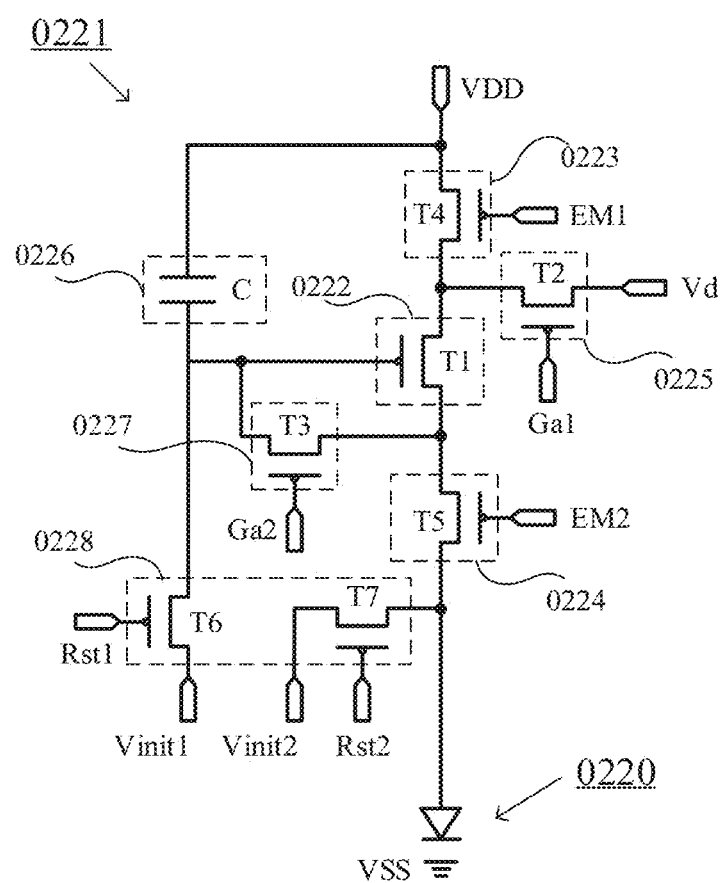
FIG. 3 is a schematic structural diagram of a pixel circuit, in accordance with some embodiments of the present disclosure.

It will be understood that referring to FIG. 3, in the AMOLED display substrate or an active light-emitting display substrate similar thereto, each sub-pixel includes a light-emitting device 0220 and a pixel circuit 0221 coupled to the light-emitting device 0220. The pixel circuit 0221 is capable of driving the light-emitting device 0220 to emit light. The light-emitting device 0220 generally includes an anode, a light-emitting layer and a cathode that are sequentially stacked. An electrode coupled to the pixel circuit 0221 in the light-emitting device 0220 refers to a pixel electrode of a corresponding sub-pixel, and the electrode is, for example, an anode. Hereinafter, the description will be made by taking an example in which the pixel electrode is an anode.

For example, as shown in FIG. 3, the pixel circuit 0221 includes a driving circuit 0222, a first light-emitting control circuit 0223, a second light-emitting control circuit 0224, a data writing circuit 0225, a storage circuit 0226, a threshold compensation circuit 0227 and a reset circuit 0228. The driving circuit 0222 includes a control terminal, a first terminal and a second terminal, and is configured to provide the light-emitting device 0220 with a driving current that drives the light-emitting device to emit light.

The first light-emitting control circuit 0223 is coupled to a first voltage terminal VDD and the first terminal of the driving circuit 0222, and is configured to realize a turn-on or turn-off between the driving circuit 0222 and the first voltage terminal VDD. The second light-emitting control circuit 0224 is coupled to the second terminal of the driving circuit 0222 and an anode of the light-emitting device 0220, and is configured to realize a turn-on or turn-off between the driving circuit 0222 and the light-emitting device 0220. The data writing circuit 0225 is coupled to the first terminal of the driving circuit 0222, and is configured to write a data signal to the storage circuit 0226 under control of a gate scanning signal. The storage circuit 0226 is coupled to the control terminal of the driving circuit 0222 and the first voltage terminal VDD, and is configured to store data signals. The threshold compensation circuit 0227 is coupled to the control terminal of the driving circuit 0222 and the second terminal of the driving circuit 0222, and is configured to perform threshold compensation on the driving circuit 0222. The reset circuit 0228 is coupled to the control terminal of the driving circuit 0222 and the anode of the light-emitting device 0220, and is configured to reset the control terminal of the driving circuit 0222 and the anode of the light-emitting device 0220 under control of a reset control signal.

Optionally, as shown in FIG. 3, the driving circuit 0222 includes a driving transistor T1. The control terminal of the driving circuit 0222 is a control electrode of the driving transistor T1, the first terminal of the driving circuit 0222 is a first electrode of the driving transistor T1, and the second terminal of the driving circuit 0222 is a second electrode of the driving transistor T1. The data writing circuit 0225 includes a data writing transistor T2. The storage circuit 0226 includes a capacitor C. The threshold compensation circuit 0227 includes a compensation transistor T3. The first light-emitting control circuit 0223 includes a first light-emitting control transistor T4. The second light-emitting control circuit 0224 includes a second light-emitting control transistor T5. The reset circuit 0228 includes a first reset transistor T6 and a second reset transistor T7, and the reset control signal may include a first sub-reset control signal and a second sub-reset control signal.

A first electrode of the data writing transistor T2 is coupled to the first electrode of the driving transistor T1, a second electrode of the data writing transistor T2 is configured to be coupled to a data line Vd to receive a data signal, and a control electrode of the data writing transistor T2 is configured to be coupled to a first gate scanning signal line Ga1 to receive a scanning signal. A first electrode of the capacitor C is coupled to the first voltage terminal VDD, and a second electrode of the capacitor C is coupled to the control electrode of the driving transistor T1. A first electrode of the compensation transistor T3 is coupled to the second electrode of the driving transistor T1, a second electrode of the compensation transistor T3 is coupled to the control electrode of the driving transistor T1, and a control electrode of the compensation transistor T3 is configured to be coupled to a second gate scanning signal line Ga2 to receive a compensation control signal. A first electrode of the first reset transistor T6 is configured to be coupled to a first reset power supply terminal Vinit1 to receive a first reset signal, a second electrode of the first reset transistor T6 is coupled to the control electrode of the driving transistor T1, and a control electrode of the first reset transistor T6 is configured to be coupled to a first reset control signal line Rst1 to receive the first sub-reset control signal. A first electrode of the second reset transistor T7 is configured to be coupled to a second reset power supply terminal Vinit2 to receive a second reset signal, a second electrode of the second reset transistor T7 is coupled to the anode of the light-emitting device 0220, and a control electrode of the second reset transistor T7 is configured to be coupled to a second reset control signal line Rst2 to receive the second sub-reset control signal. A first electrode of the first light-emitting control transistor T4 is coupled to the first voltage terminal VDD, a second electrode of the first light-emitting control transistor T4 is coupled to the first electrode of the driving transistor T1, and a control electrode of the first light-emitting control transistor T4 is configured to be coupled to a first light-emitting control signal line EM1 to receive a first light-emitting control signal. A first electrode of the second light-emitting control transistor T5 is coupled to the second electrode of the driving transistor T1, a second electrode of the second light-emitting control transistor T5 is coupled to the anode of the light-emitting device 0220, and a control electrode of the second light-emitting control transistor T5 is configured to be coupled to a second light-emitting control signal line EM2 to receive a second light-emitting control signal. A cathode of the light-emitting device 0220 is coupled to a second voltage terminal VSS.

Herein, one of the first voltage terminal VDD and the second voltage terminal VSS is a terminal with a high voltage, and the other is a terminal with a low voltage. For example, the first voltage terminal VDD is a voltage source to output a constant first voltage, and the first voltage is a positive voltage. The second voltage terminal VSS is a voltage source to output a constant second voltage, and the second voltage is a negative voltage. Or, for another example, the first voltage terminal VDD is a power signal line, and the power signal line is, for example, a first power signal line and a second power signal line that are located in different layers and are interconnected. The second voltage terminal VSS is grounded.

In some examples, the scanning signal and the compensation control signal may be the same.

Optionally, the control electrode of the data writing transistor T2 and the control electrode of the compensation transistor T3 are coupled to the same signal line, e.g., the first gate scanning signal line Ga1, to receive the same signal (e.g., a scanning signal). In this way, the second gate scanning signal line Ga2 may not be provided in the display substrate, and the total number of signal lines may be reduced.

Optionally, the control electrode of the data writing transistor T2 and the control electrode of the compensation transistor T3 are coupled to different signal lines, respectively. That is, the control electrode of the data writing transistor T2 is coupled to the first gate scanning signal line Ga1, and the control electrode of the compensation transistor T3 is coupled to the second gate scanning signal line Ga2. The signals transmitted by the first gate scanning signal line Ga1 and the second gate scanning signal line Ga2 are the same.

In some other examples, the scanning signal and the compensation control signal are different, so that the control electrode of the data writing transistor T2 and the control electrode of the compensation transistor T3 may be controlled independently, thereby improving control flexibility of the pixel circuit.

Similarly, in some examples, the first light-emitting control signal and the second light-emitting control signal are the same.

Optionally, the control electrode of the first light-emitting control transistor T4 and the control electrode of the second light-emitting control transistor T5 are coupled to the same signal line, e.g., the first light-emitting control signal line EM1, to receive the same signal (e.g., the first light-emitting control signal). In this way, the second light-emitting control signal line EM2 may not be provided in the display substrate, and the total number of signal lines may be reduced.

Optionally, the control electrode of the first light-emitting control transistor T4 and the control electrode of the second light-emitting control transistor T5 are coupled to different signal lines, respectively. The control electrode of the first light-emitting control transistor T4 is coupled to the first light-emitting control signal line EM1, and the control electrode of the second light-emitting control transistor T5 is coupled to the second light-emitting control signal line EM2. The signal transmitted by the first light-emitting control signal line EM1 and the second light-emitting control signal line EM2 are the same.

In some other examples, the first light-emitting control transistor T4 and the second light-emitting control transistor T5 are different types of transistors. For example, the first light-emitting control transistor T4 is a P-type transistor, and the second light-emitting control transistor T5 is an N-type transistor. The first light-emitting control signal and the second light-emitting control signal are different. The embodiments of the present disclosure do not limit thereto.

Similarly, in some examples, the first sub-reset control signal and the second sub-reset control signal are the same.

Optionally, the control electrode of the first reset transistor T6 and the control electrode of the second reset transistor T7 are coupled to the same signal line, e.g., the first reset control signal line Rst1, to receive the same signal (e.g., the first sub-reset control signal). In this way, the second reset control signal line Rst2 may not be provided in the display substrate, and the total number of signal lines may be reduced.

Optionally, the control electrode of the first reset transistor T6 and the control electrode of the second reset transistor T7 are coupled to different signal lines, respectively. The control electrode of the first reset transistor T6 is coupled to the first reset control signal line Rst1, and the control electrode of the second reset transistor T7 is coupled to the second reset control signal line Rst2. The signal transmitted by the first reset control signal line Rst1 and the second reset control signal line Rst2 are the same.

In some other examples, the first sub-reset control signal and the second sub-reset control signal may also be different.

In addition, in some examples, the second sub-reset control signal may be the same as the scanning signal. For example, the control electrode of the second reset transistor T7 may be coupled to the first gate scanning signal line Ga1 to receive the scanning signal as the second sub-reset control signal.

Moreover, the first reset power supply terminal Vinit1 coupled to the first electrode of the first reset transistor T6 and the second reset power supply terminal Vinit2 coupled to the first electrode of the second reset transistor T7 may be direct-current (DC) reference voltage terminals to output a constant DC reference voltage. The first reset power supply terminal Vinit1 and the second reset power supply terminal Vinit2 may be the same. For example, the first electrode of the first reset transistor T6 and the first electrode of the second reset transistor T7 are connected to the same reset power supply terminal. As long as the first reset power supply terminal Vinit1 and the second reset power supply terminal Vinit2 are able to provide the first reset signal and the second reset signal to reset the control electrode of the driving transistor T1 and the anode of the light-emitting device 0220, the first reset power supply terminal Vinit1 and the second reset power supply terminal Vinit2 may be high voltage terminals or low voltage terminals, which is not limited in the embodiments of the present disclosure. For example, the first electrode of the first reset transistor T6 and the first electrode of the second reset transistor T7 may be connected to a reset power signal line Init.

It will be noted that the driving circuit 0222, the data writing circuit 0225, the storage circuit 0226, the threshold compensation circuit 0227 and the reset circuit 0228 in the pixel circuit 0221 shown in FIG. 3 are only exemplary, and specific structures of the driving circuit 0222, the data writing circuit 0225, the storage circuit 0226, the threshold compensation circuit 0227 and the reset circuit 0228 may be arranged according to practical application requirements, which are not specifically limited in the embodiments of the present disclosure.

For example, transistors may be classified into N-type transistors and P-type transistors according to characteristics of the transistors. For the sake of clarity, the embodiments of the present disclosure describe the technical solution of the present disclosure in detail by taking an example in which transistors are P-type transistors (e.g., P-type MOS transistors). That is, in the description of the embodiments of the present disclosure, the driving transistor T1, the data writing transistor T2, the compensation transistor T3, the first light-emitting control transistor T4, the second light-emitting control transistor T5, the first reset transistor T6 and the second reset transistor T7, etc. may all be P-type transistors. However, the transistors in the embodiments of the present disclosure are not limited to P-type transistors, and those skilled in the art may also implement functions of one or more transistors in the embodiments of the present disclosure by using N-type transistors (e.g., N-type MOS transistors) according to actual needs.

It will be noted that the transistors used in the embodiments of the present disclosure may be thin film transistors, field effect transistors or other switching devices with the same characteristics. The thin film transistors may include oxide semiconductor thin film transistors, amorphous silicon thin film transistors, polysilicon thin film transistors, etc. A first electrode and a second electrode of the transistor may be symmetrical in structure, and thus the first electrode and the second electrode thereof may be indistinguishable in physical structure. In the embodiments of the present disclosure, a gate of a transistor is a control electrode thereof, a first electrode thereof is one of a source or a drain, and a second electrode thereof is the other of the source or the drain. With respect to all or some of the transistors in the embodiments of the present disclosure, the first electrode and the second electrode of a transistor may be interchanged as needed.

It will be noted that, in the embodiments of the present disclosure, in addition to a 7T1C (i.e., seven transistors and one capacitor) structure shown in FIG. 3, the pixel circuit 0221 may also have a structure including another number of transistors, e.g., a 7T2C structure, a 6T1C structure, a 6T2C structure or a 9T2C structure, which is not limited in the embodiments of the present disclosure.

A pixel electrode of the light-emitting device 0220 is coupled to the pixel circuit 0221, and a shape of the light-emitting device 0220 may be designed according to actual requirements, so as to optimize a wire design of the pixel circuit 0221 and ensure that sub-pixels have a high distribution density, thereby improving a display effect of the display apparatus.

Figure 4:
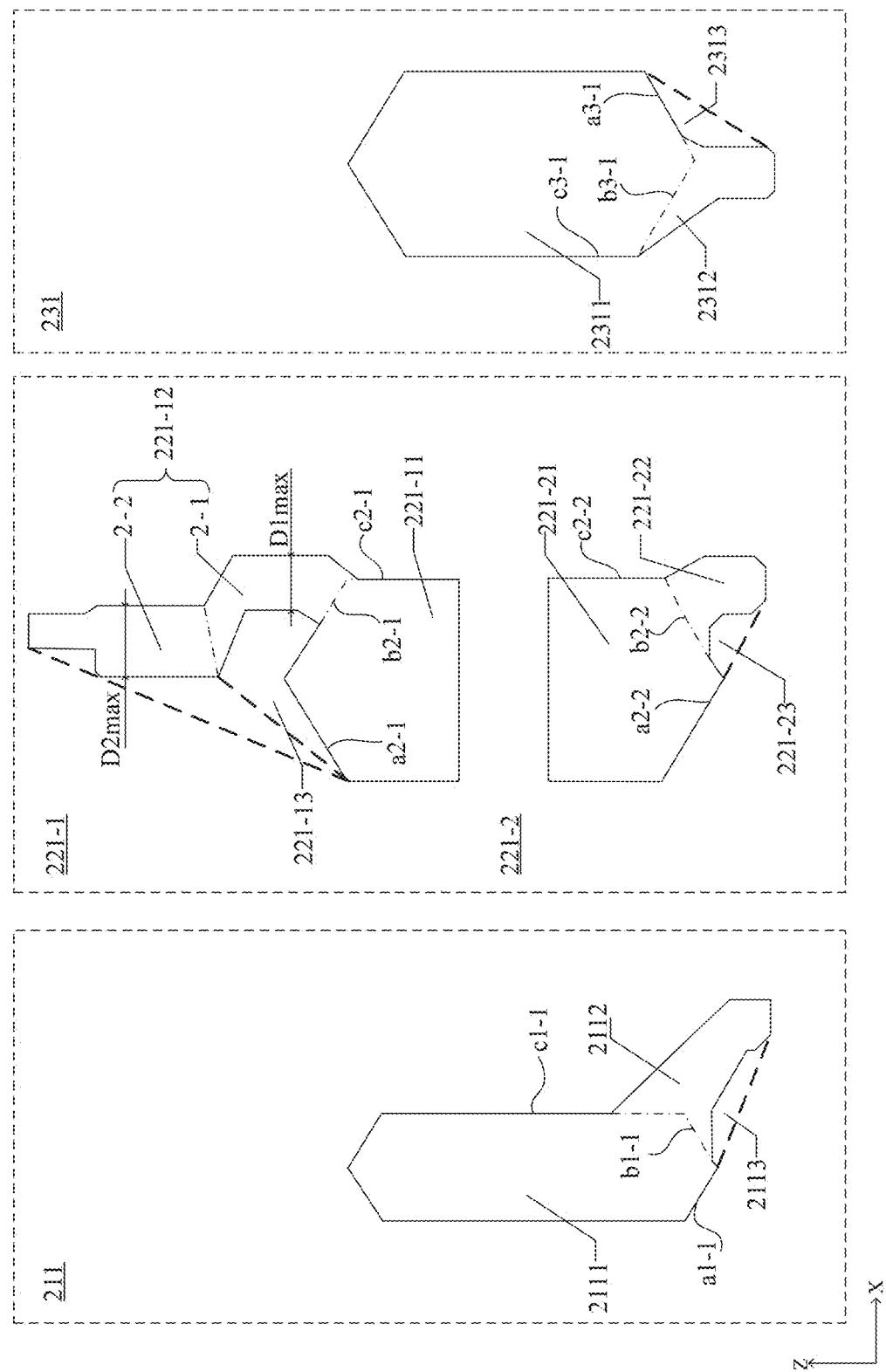
FIG. 4 is a schematic diagram of structures of pixel electrodes in a sub-pixel group, in accordance with some embodiments of the present disclosure.

In some embodiments, referring to FIGS. 2B and 4, in at least two sub-pixels of the sub-pixel group 200, e.g., in the first sub-pixel 22-1 and the second sub-pixel 22-2 of the second color sub-pixel pair 220, the pixel electrode includes a main body portion and a connection portion that are interconnected. The first sub-pixel 22-1 and the second sub-pixel 22-2 in the second color sub-pixel pair 220 are the closest first sub-pixel 22-1 and second sub-pixel 22-2 among a plurality of first sub-pixels 22-1 and a plurality of second sub-pixels 22-2, and the first sub-pixel 22-1 and the second sub-pixel 22-2 are arranged in the second direction.

A shape of the main body portion is approximately the same as a shape of the effective light-emitting region of the light-emitting device 0220 where the main body portion is located. A portion of a border of the main body portion is a corresponding border of the pixel electrode, that is, partial borders of the main body portion and the pixel electrode coincide. A portion where the connection portion is connected to the main body portion is provided with a notch. For example, the main body portion includes a first edge, a second edge and a third edge that are connected in proper sequence. The third edge extends in the second direction, the second edge is connected to the connection portion, and there is spacing between the first edge and the connection portion, that is, the first edge is not connected to the connection portion. In this way, a region enclosed by a connecting straight line from any point on the first edge to any point on an edge of the connection portion extending in the second direction and away from the third edge in the first direction, together with the main body portion and the connection portion, is a region where the notch is located, i.e., a notch region. Herein, the first edge, the second edge and the third edge may be straight edges or folded edges, which are distinguished by whether they are connected to the connection portion.

A pixel electrode of each sub-pixel in FIG. 2B has the same structure as a pixel electrode of a sub-pixel with the same color in FIG. 4, but shapes thereof are slightly different. For example, a shape of a connection portion of each pixel electrode in FIG. 2B is more regular, and a shape of a connection portion of each pixel electrode in FIG. 4 is more curved. The embodiments of the present disclosure do not limit thereto.

For example, as shown in FIGS. 2B and 4, in the second color sub-pixel pair 220, the pixel electrode 221-1 of the first sub-pixel 22-1 includes a main body portion 221-11 and a connection portion 221-12. The connection portion 221-12 includes: a bending portion 2-1 connected to the main body portion 221-11, and a compensation portion 2-2 connected to the bending portion 2-1. The main body portion 221-11, the bending portion 2-1 and the compensation portion 2-2 are of an integral structure. The compensation portion 2-2 extends in the second direction. A maximum dimension D2max of the compensation portion 2-2 in the first direction is greater than a maximum dimension D1max of the bending portion 2-1 in the first direction. Herein, the bending portion 2-1 is located between the main body portion 221-11 and the compensation portion 2-2, and transition positions of the bending portion 2-1 interconnected with the main body part 221-11 and the compensation part 2-2 are processed smoothly. The maximum dimension of the bending portion 2-1 in the first direction is a dimension of a cross-section thereof in the first direction. Thus, the bending portion 2-1 may have a smaller line width than the compensation portion 2-2.

In the first sub-pixel 22-1, the main body portion 221-11 includes a first edge a2-1, a second edge b2-1 and a third edge c2-1 that are connected in proper sequence. The third edge c2-1 extends in the Z direction, the second edge b2-1 is connected to the bending portion 2-1 of the connection portion 221-12, and there is spacing between the first edge a2-1 and the connection portion 221-12. A region enclosed by a connecting straight line from any point on the first edge a2-1 to any point on an edge of the connection portion 221-12 extending in the Z direction and away from the third edge c2-1 in the X direction, together with the main body portion 221-11 and the connection portion 221-12, is a notch region 221-13.

Herein, any point on the edge of the connection portion 221-12 extending in the Z direction and away from the third edge c2-1 in the X direction, for example, is an end point of the bending portion 2-1 connected to the compensation portion 2-2 and away from the third edge c2-1 in the X direction, or is an end point of a free end of the compensation portion 2-2 away from the third edge c2-1 in the X direction, which is not limited thereto.

A small line width of the bending portion 2-1 is advantageous for ensuring a large area of an orthogonal projection of the notch region 221-13 on the base substrate 100. In some examples, a ratio of an area of the orthogonal projection of the notch region 221-13 on the base substrate 100 to an area of an orthogonal projection of the bending portion 2-1 on the base substrate 100 may be in a range from 0.2 to 5. For example, the ratio of the area of the orthogonal projection of the notch region 221-13 on the base substrate 100 to the area of the orthogonal projection of the bending portion 2-1 on the base substrate 100 is one of 0.2, 1.5, 3 and 5. In this way, providing the notch region 221-13 with a larger area in the first sub-pixel 22-1 may avoid providing a metal pattern in the notch region 221-13, thereby improving the light transmittance of the display substrate 10.

Areas of orthogonal projections of both the pixel electrode 221-2 of the second sub-pixel 22-2 and the pixel electrode 221-1 of the first sub-pixel 22-1 on the base substrate 100 are different, and structures of the two are different. For example, two orthogonal projections of the connection portion and the main body portion of at least one of the first sub-pixel 22-1 and the second sub-pixel 22-2 on a straight line extending in the first direction are at least partially not overlapped.

For example, as shown in FIGS. 2B and 4, the pixel electrode 221-2 of the second sub-pixel 22-2 includes a main body portion 221-21 and a connection portion 221-22. The main body portion 221-21 and the connection portion 221-22 are of an integral structure. The main body portion 221-21 includes a first edge a2-2, a second edge b2-2 and a third edge c2-2 that are connected in proper sequence. The third edge c2-2 extends in the Z direction, the second edge b2-2 is connected to the connection portion 221-22, and there is spacing between the first edge a2-2 and the connection portion 221-22. At least one edge of the connection portion 221-22 may be bent, for example, an edge of the connection portion 221-22 away from the third edge c2-2 in the X direction is bent. A connecting straight line from any point on the first edge a2-2 of the main body portion 221-21 to any point on an edge of the connection portion 221-22 extending in the Z direction and away from the third edge c2-2 in the X direction, encloses a notch region 221-23 with the main body portion 221-21 and the connection portion 221-22. Similarly, providing the notch region 221-23 in the second sub-pixel 22-2 may avoid providing a metal pattern in the notch region 221-23, thereby further improving the light transmittance of the display substrate 10.

Optionally, with continued reference to FIGS. 2B and 4, a maximum dimension of the connection portion 221-22 of the pixel electrode 221-2 of the second sub-pixel 22-2 in the second direction is less than or equal to a maximum dimension of the bending portion 2-1 of the pixel electrode 221-1 of the first sub-pixel 22-1 in the second direction. In this way, in a case where a dimension of the main body portion 221-21 of the pixel electrode 221-2 of the second sub-pixel 22-2 is approximately the same as a dimension of the main body portion 221-11 of the pixel electrode 221-1 of the first sub-pixel 22-1, a dimension of the pixel electrode 221-2 of the second sub-pixel 22-2 in the second direction is less than a dimension of the pixel electrode 221-1 of the first sub-pixel 22-1 in the same direction.

It will be understood with reference to FIG. 2A that, in the second color sub-pixel pairs 220 in any two adjacent rows in the second direction (e.g., the Z direction), the second color sub-pixel pair 220 in the second row R2 and the second color sub-pixel pair 220 in the first row R1 are staggered in the first direction (e.g., the X direction). The connection portion 221-12 of the pixel electrode 221-1 of the first sub-pixel 22-1 in the second color sub-pixel pair 220 in the second row R2 extends to be located between the pixel electrodes 221-2 of two correspondingly adjacent second sub-pixels 22-2 in the second color sub-pixel pairs 220 in the first row R1. For example, the bending portion 2-1 of the pixel electrode 221-1 of the first sub-pixel 22-1 in the second color sub-pixel pair 220 in the second row R2 and the connection portion 221-22 of the pixel electrode 221-2 of the second sub-pixel 22-2 in the second sub-pixel pair 220 in the first row R1 are approximately located on the same straight line extending in the first direction. The compensation portion 2-2 of the pixel electrode 221-1 of the first sub-pixel 22-1 in the second color sub-pixel pair 220 in the second row R2 is located between the main body portions 221-21 of the pixel electrodes 221-2 of two correspondingly adjacent second sub-pixels 22-2 in the second color sub-pixel pairs 220 in the first row R1. In this way, an orthogonal projection of the pixel electrode 221-2 of the second sub-pixel 22-2 in the second color sub-pixel pair 220 in the first row R1 on a straight line extending in the second direction is within an orthogonal projection of the pixel electrode 221-1 of the first sub-pixel 22-1 in the second color sub-pixel pair 220 in the second row R2 on the same straight line.

Figure 5:
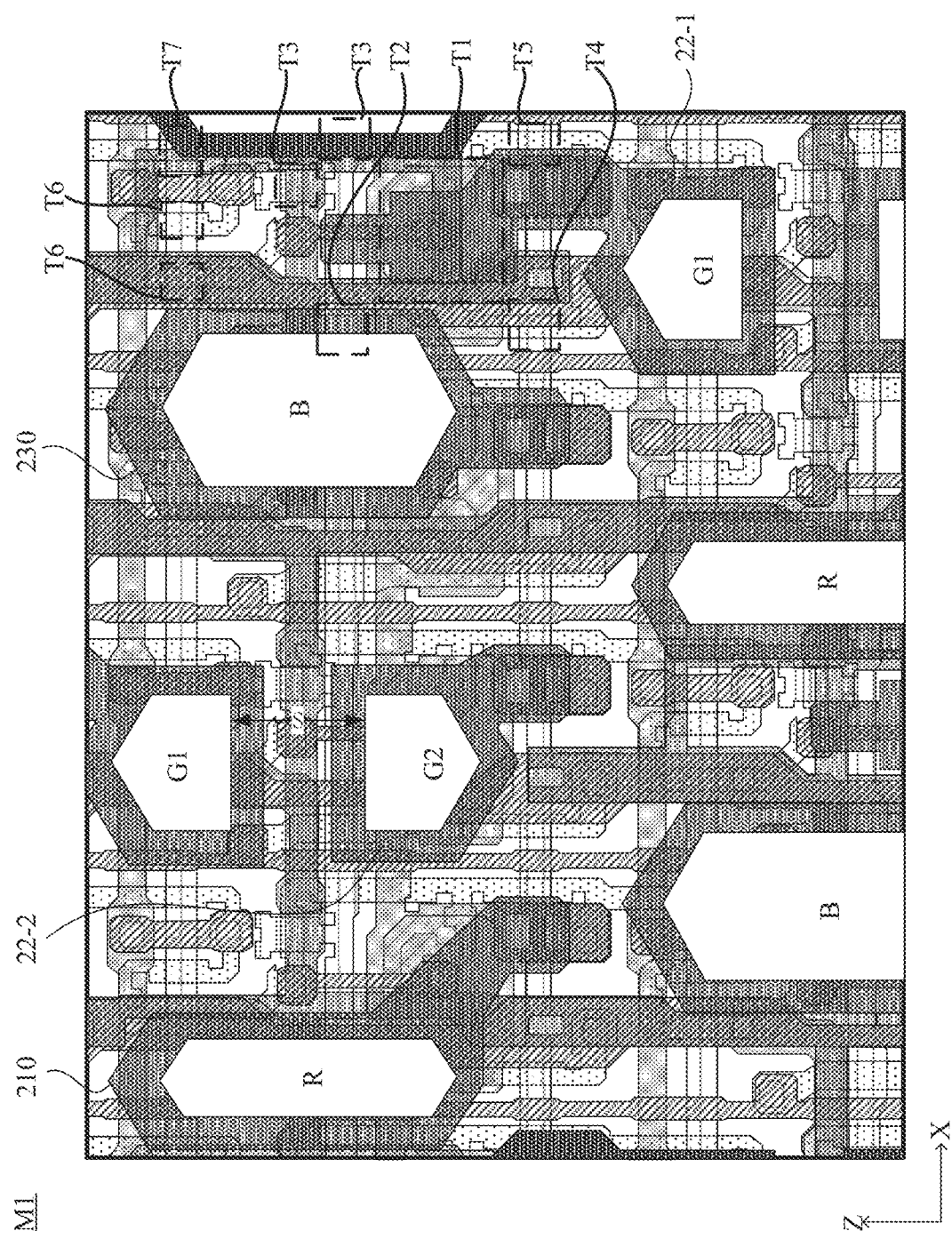
FIG. 5 is an enlarged schematic diagram of a display substrate in an M1 region, in accordance with some embodiments of the present disclosure.

It will be understood with reference to FIG. 5 that, pixel electrodes of the first sub-pixel 22-1 and second sub-pixel 22-2 in the second color sub-pixel pair 220 are designed as above, which is favorable for arranging four pixel circuits 0221 in the first direction in a space corresponding to each sub-pixel group 200. Therefore, the overall layout design of pixel circuits 0221 in the display substrate 10 may be simplified on the basis of increasing the distribution density of the sub-pixels.

In some embodiments, a pixel electrode 211 of the first color sub-pixel 210 and a pixel electrode 231 of the third color sub-pixel 230 each may also be designed with reference to a structure of the pixel electrode 221-2 of the second sub-pixel 22-2.

For example, as shown in FIGS. 2B and 4, the pixel electrode 211 of the first color sub-pixel 210 includes a main body portion 2111 and a connection portion 2112. The main body portion 2111 and the connection portion 2112 are of an integral structure. The main body portion 2111 includes a first edge a1-1, a second edge b1-1 and a third edge c1-1 that are connected in proper sequence. The third edge c1-1 extends in the Z direction, the second edge b1-1 is connected to the connection portion 2112, and there is spacing between the first edge a1-1 and the connection portion 2112. An edge of at least one side of the connection portion 2112 may be bent, for example, an edge of the connection portion 2112 away from the third edge c1-1 in the X direction is bent. A connecting straight line from any point on the first edge a1-1 of the main body portion 2111 to any point on an edge of the connection portion 2112 extending in the Z direction and away from the third edge c1-1 in the X direction, encloses a notch region 2113 with the main body portion 2111 and the connection portion 2112.

For example, as shown in FIGS. 2B and 4, the pixel electrode 231 of the third color sub-pixel 230 includes a main body portion 2311 and a connection portion 2312. The main body portion 2311 and the connection portion 2312 are of an integral structure. The main body portion 2311 includes a first edge a3-1, a second edge b3-1 and a third edge c3-1 that are connected in proper sequence. The third edge c3-1 extends in the Z direction, the second edge b3-1 is connected to the connection portion 2312, and there is spacing between the first edge a3-1 and the connection portion 2312. An edge of at least one side of the connection portion 2312 may be bent, for example, for example, an edge of the connection portion 2312 away from the third edge c3-1 in the X direction is bent. A connecting straight line from any point on the first edge a3-1 of the main body portion 2311 to any point on an edge of the connection portion 2312 extending in the Z direction and away from the third edge c3-1 in the X direction, encloses a notch region 2313 with the main body portion 2311 and the connection portion 2312.

Therefore, providing the notch region 2113 in the first color sub-pixel 210 and providing the notch region 2313 in the third color sub-pixel 230 may further improve the light transmittance of the display substrate 10.

In addition, as shown in FIG. 2B, in each sub-pixel group 200, the connection portion 2112 of the first color sub-pixel 210 is located at a side of the main body portion 2111 thereof proximate to the second color sub-pixel pair 220. Areas of anodes of the first sub-pixel 22-1 and the second sub-pixel 22-2 in the second color sub-pixel pair 220 are different. The connection portion 221-12 and the connection portion 221-22 in the second color sub-pixel pair 220 are located at a side of the main body portions thereof away from the first color sub-pixel 210. For example, orthogonal projections of the connection portion and the main body portion of at least one of the first sub-pixel 22-1 and the second sub-pixel 22-2 on a straight line extending in the first direction are at least partially not overlapped. An orthogonal projection of the connection portion 2312 of the third color sub-pixel 230 on a straight line extending in the first direction is located within an orthogonal projection of the main body portion 2311 thereof on the same straight line. For example, a center line of the third effective light-emitting region 2300 of the third color sub-pixel 230 in the second direction passes through the main body portion 2311 and the connection portion 2312 thereof.

In each sub-pixel group 200, the shape of the main body portion of the pixel electrode of the sub-pixel is approximately the same as the shape of the corresponding effective light-emitting region, and the area of the orthogonal projection of the main body portion of the pixel electrode of the sub-pixel on the base substrate 100 is greater than the area of the orthogonal projection of the corresponding effective light-emitting region on the base substrate 100. For example, the geometric center of the main body portion of the pixel electrode of the sub-pixel approximately coincides with the geometric center of the corresponding effective light-emitting region. For example, the shape of the main body portion 2111 of the pixel electrode 211 of the first color sub-pixel 210 and the shape of the main body portion 2311 of the pixel electrode 231 of the third color sub-pixel 230 are approximately hexagonal or elliptical, and shapes of the main body portions of the pixel electrodes of the first sub-pixel 22-1 and second sub-pixel 22-2 in the second color sub-pixel pair 220 are approximately pentagonal, circular or water drop-shaped.

In some embodiments, a plurality of pixel circuits 0221 are arranged in the first direction to form rows, and are arranged in the second direction to form columns. Transistors in the pixel circuit 0221 have a top-gate structure, and a part of the transistors, e.g., the compensation transistor T3 and the first reset transistor T6, may have a double-gate structure. However, the present disclosure is not limited thereto. Hereinafter, taking this as an example, structures of the layers in the display substrate 10 are illustrated. In a case where the transistor has another structure, the structures of the layers in the display substrate 10 may be adjusted accordingly.

FIG. 5 is a schematic diagram of a top view structure of a plurality of sub-pixels in some embodiments of the present disclosure. FIGS. 6A to 6I are schematic diagrams of top view structures of some layers in a process of manufacturing the sub-pixels. Four adjacent pixel circuits corresponding to the first color sub-pixel 210, the second sub-pixel 22-2 in the second color sub-pixel pair 220, the third color sub-pixel 230, and the first sub-pixel 22-1 in another second color sub-pixel pair 220 in an adjacent staggered row are taken as an example, positions of transistors of the pixel circuit 0221 included in one sub-pixel are illustrated, and positions of components included in the pixel circuits 0221 in other sub-pixels are approximately the same as the positions of the transistors included in the sub-pixel.

In addition, the display substrate 10 generally includes a plurality of layers located between the base substrate 100 and the pixel electrodes. The plurality of layers include at least one metal layer and at least one insulating layer. The structures of the layers in the display substrate 10 are understood with reference to the layers shown in FIGS. 7A to 7G. The drawings of the present disclosure illustrate sectional views of the structures of the layers of the display substrate 10, but are not limited thereto. The structures of the layers of the display substrate 10 may be adaptively varied according to structures of the pixel circuits.

As shown in FIG. 5, the pixel circuit 0221 includes the driving transistor T1, the data writing transistor T2, the compensation transistor T3, the first light-emitting control transistor T4, the second light-emitting control transistor T5, the first reset transistor T6, the second reset transistor T7 and the capacitor C as shown in FIG. 3 The positions of the capacitor C and driving transistor T1 overlap, which is not marked schematically.

Figure 6A:
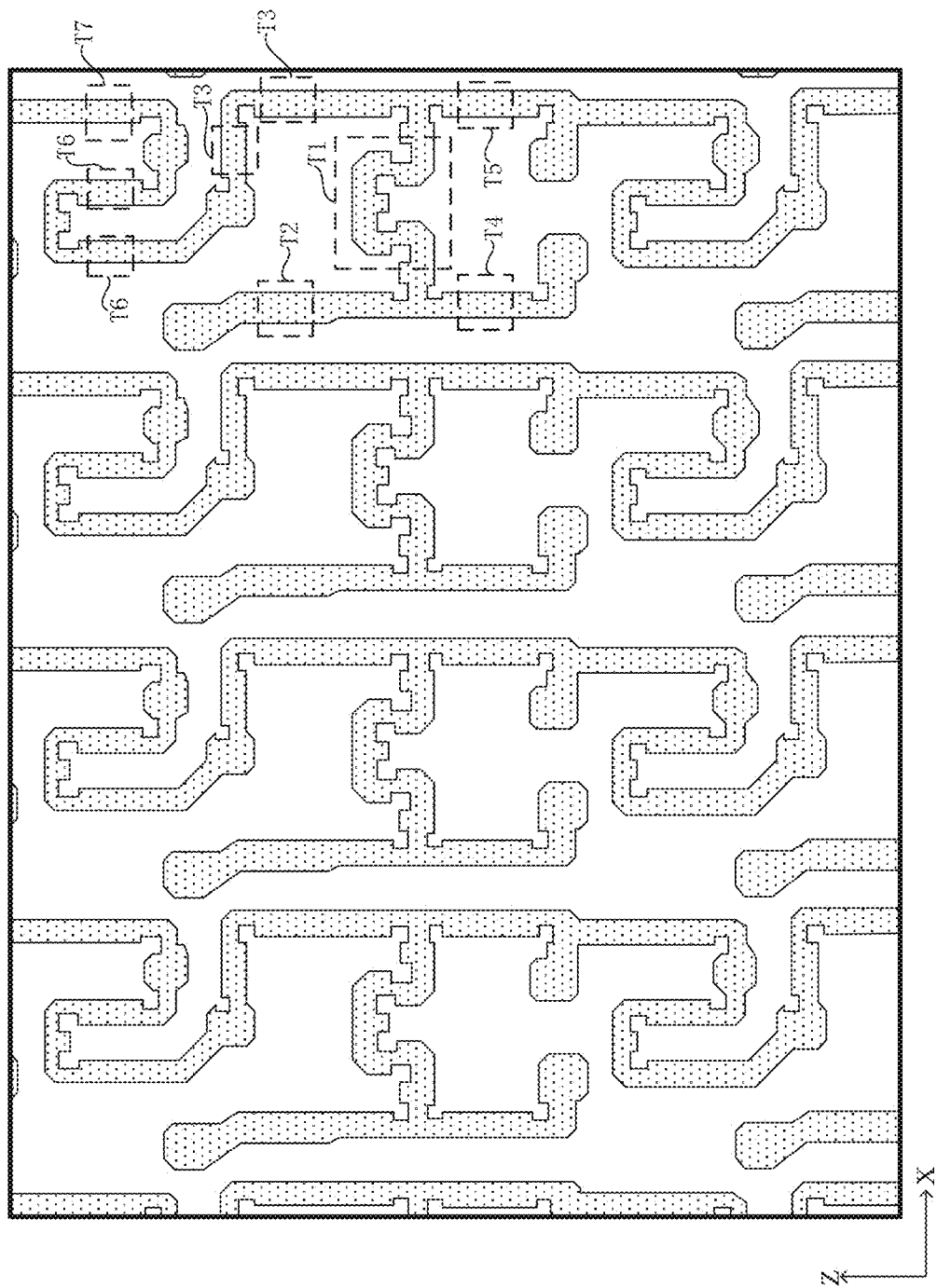
FIGS. 6A, 6B, 6C, 6D, 6E, 6F, 6G, 6H and 6I are schematic top views of different layers of a display substrate during its manufacturing process, in accordance with some embodiments of the present disclosure.

FIG. 6A shows a top view structure of a semiconductor pattern layer 310 in the display substrate 10. The semiconductor pattern layer 310 may be formed by patterning a semiconductor material. The semiconductor pattern layer 310 may be used to manufacture active layers in the driving transistor T1, the data writing transistor T2, the compensation transistor T3, the first light-emitting control transistor T4, the second light-emitting control transistor T5, the first reset transistor T6 and the second reset transistor T7. The semiconductor pattern layer 310 includes active layer patterns (channel regions) and doped region patterns (source-drain doped regions) of the transistors of the sub-pixels, and active layer patterns and doped region patterns of transistors in the same pixel circuit are integrally provided.

It will be noted that the active layer may include an integrally formed low-temperature polysilicon layer, and a source region and a drain region thereof may be obtained by doping or the like, after this, which are conductive. Thus, active layers of transistors of each sub-pixel are an overall pattern formed of p-silicon. The transistors in the same pixel circuit each include a doped region pattern (i.e., a source region and a drain region) and an active layer pattern, and active layers of different transistors are separated by a doped structure.

For example, the semiconductor pattern layer 310 may be made of amorphous silicon, polysilicon, oxide semiconductor material, or the like. It will be noted that the source region and the drain region may be regions doped with n-type impurities or p-type impurities.

For example, active semiconductor layers in pixel circuits of different color sub-pixels arranged in the first direction are not connected, and are disconnected from each other. The active semiconductor layers in the pixel circuits of the sub-pixels arranged in the second direction may be integrally provided or may be disconnected from each other.

Figure 6B:
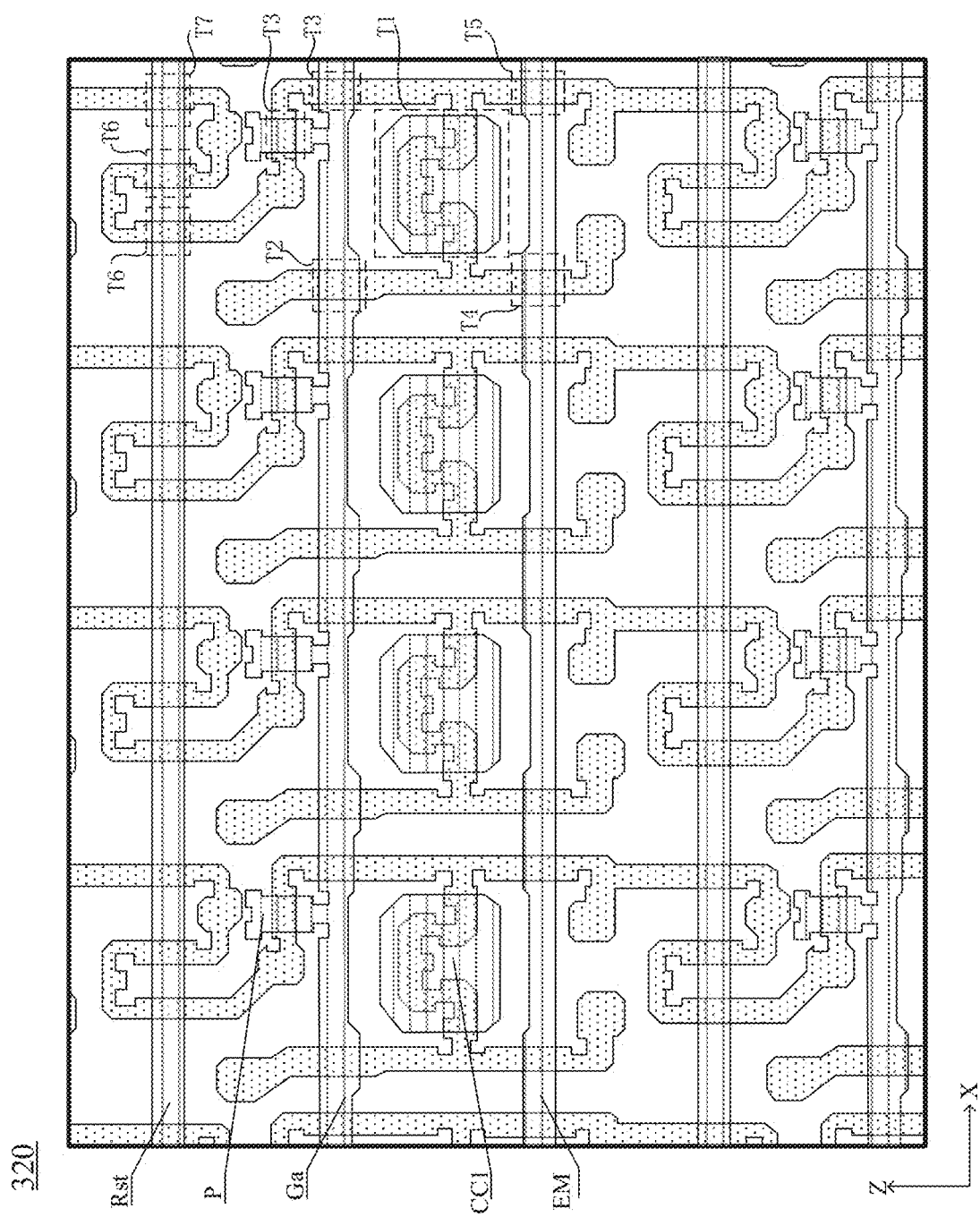

FIG. 6B shows a top view structure of a first gate metal layer 320 in the display substrate 10. The first gate metal layer 320 is a patterned metal film. A gate insulating layer 160 is formed on the semiconductor pattern layer 310. The first gate metal layer 320 is located on the gate insulating layer 160, and is insulated from the semiconductor pattern layer 310.

For example, the first gate metal layer 320 is used to manufacture gates of the driving transistor T1, the data writing transistor T2, the compensation transistor T3, the first light-emitting control transistor T4, the second light-emitting control transistor T5, the first reset transistor T6 and the second reset transistor T7, and a first electrode CC1 of the capacitor C.

Herein, signal lines such as scanning signal lines Ga (including the first gate scanning signal line Ga1 and the second gate scanning signal line Ga2), reset control signal lines Rst (including the first reset control signal line Rst1 and the second reset control signal line Rst2), and light-emitting control signal lines EM (including the first light-emitting control signal line EM1 and the second light-emitting control signal line EM2), which are coupled to gates of transistors in the pixel circuit 0221, may be formed by the first gate metal layer 320.

In some examples, the first gate scanning signal line Ga1 and the second gate scanning signal line Ga2 are the same signal line Ga, the first reset control signal line Rst1 and the second reset control signal line Rst2 are the same signal line Rst, and the first light-emitting control signal line EM1 and the second light-emitting control signal line EM2 are the same signal line EM. However, the present disclosure is not limited thereto.

For example, the display substrate 10 further includes a plurality of signal lines extending in the first direction. An orthogonal projection of the pixel electrode 221-1 of the first sub-pixel 22-1 on the base substrate overlaps with orthogonal projections of at least three signal lines located in the same layer on the base substrate 100. For example, the reset control signal line, the gate scanning signal line and the light-emitting control signal line are disposed in the same layer, extend in the first direction, and are arranged in the second direction. The orthogonal projection of the pixel electrode 221-1 of the first sub-pixel 22-1 on the base substrate overlaps with orthogonal projections of one reset control signal line, one gate scanning signal line and one light-emitting control signal line on the base substrate 100.

For example, as indicated by the dashed-line boxes in FIG. 6B, a gate of the data writing transistor T2 may be a portion of the scanning signal line Ga which is opposite to the semiconductor pattern layer 310. A gate of the first light-emitting control transistor T4 may be a first portion of the light-emitting control signal line EM which is opposite to the semiconductor pattern layer 310, and a gate of the second light-emitting control transistor T5 may be a second portion of the light-emitting control signal line EM which is opposite to the semiconductor pattern layer 310. A gate of the first reset transistor T6 is a first portion of the reset control signal line Rst which is opposite to the semiconductor pattern layer 310. A gate of the second reset transistor T7 is a second portion of the reset control signal line Rst which is opposite to the semiconductor pattern layer 310. The compensation transistor T3 may be a thin film transistor with a double-gate structure, a first gate of the compensation transistor T3 may be a portion of the scanning signal line Ga which is opposite to the semiconductor pattern layer 310, and a second gate of the compensation transistor T3 may be a portion of a protruding structure P protruding from the scanning signal line Ga which is opposite to the semiconductor pattern layer 310. It will be understood in combination with FIG. 3 that a gate of the driving transistor T1 may be the first electrode CC1 of the capacitor C.

It will be noted that portions of the semiconductor pattern layer 310 directly opposite to the gates of the transistors are channels of the transistors, and semiconductor pattern portions at both sides of each channel may be used as a first electrode and a second electrode of a corresponding transistor after being processed such as ion doping, after this, which are conductive.

Moreover, for example, as shown in FIG. 6B, the scanning signal line Ga, the reset control signal line Rst and the light-emitting control signal line EM are arranged in the second direction (the Z direction). The scanning signal line Ga is located between the reset control signal line Rst and the light-emitting control signal line EM. In this way, with respect to each pixel circuit 0221, the first electrode CC1 of the capacitor C (i.e., the gate of the driving transistor T1) is located between the scanning signal line Ga and the light-emitting control signal line EM in the second direction. The protruding structure P protruding from the scanning signal line Ga is located at a side of the scanning signal line Ga away from the light-emitting control signal line EM in the second direction. The gate of the data writing transistor T2, the gate of the compensation transistor T3, the gate of the first reset transistor T6 and the gate of the second reset transistor T7 are all located at a first side of the gate of the driving transistor T1. The gate of the first light-emitting control transistor T4 and the gate of the second light-emitting control transistor T5 are both located at a second side of the gate of the driving transistor T1.

Herein, the first side and the second side of the gate of the driving transistor T1 are two opposite sides of the gate of the driving transistor T1 in the second direction. For example, in an XZ plane, the first side of the gate of the driving transistor T1 may be an upper side of the gate of the driving transistor T1, and the second side of the gate of the driving transistor T1 may be a lower side of the gate of the driving transistor T1. Optionally, a side of the display substrate for bonding an integrated circuit (IC) is a lower side of the display substrate, and the lower side of the gate of the driving transistor T1 is a side thereof closer to the IC. The upper side of the gate of the driving transistor T1 is an opposite side of the lower side thereof, e.g., a side of the gate of the driving transistor T1 farther away from the IC.

With respect to each pixel circuit 0221, in the first direction, the gate of the data writing transistor T2 and the gate of the first light-emitting control transistor T4 are both located at a third side of the gate of the driving transistor T1, and the first gate of the compensation transistor T3, the gate of the second light-emitting control transistor T5 and the gate of the second reset transistor T7 are all located at a fourth side of the gate of the driving transistor T1. Herein, the third side and the fourth side of the gate of the driving transistor T1 are two opposite sides of the gate of the driving transistor T1 in the first direction X. For example, in the XZ plane shown in FIG. 6B, the third side of the gate of the driving transistor T1 may be a left side of the gate of the driving transistor T1, and the fourth side of the gate of the driving transistor T1 may be a right side of the gate of the driving transistor T1.

It will be noted that a structure of the pixel circuit 0221 may be a mirror image structure of the structure shown in FIG. 6B, that is, the structures of the layers of the pixel circuit 0221 are reversed in the left and right directions based on a channel region of the driving transistor T1. Thus, a relationship between the left side and the right side of the above gate may be reversed.

Figure 6C:
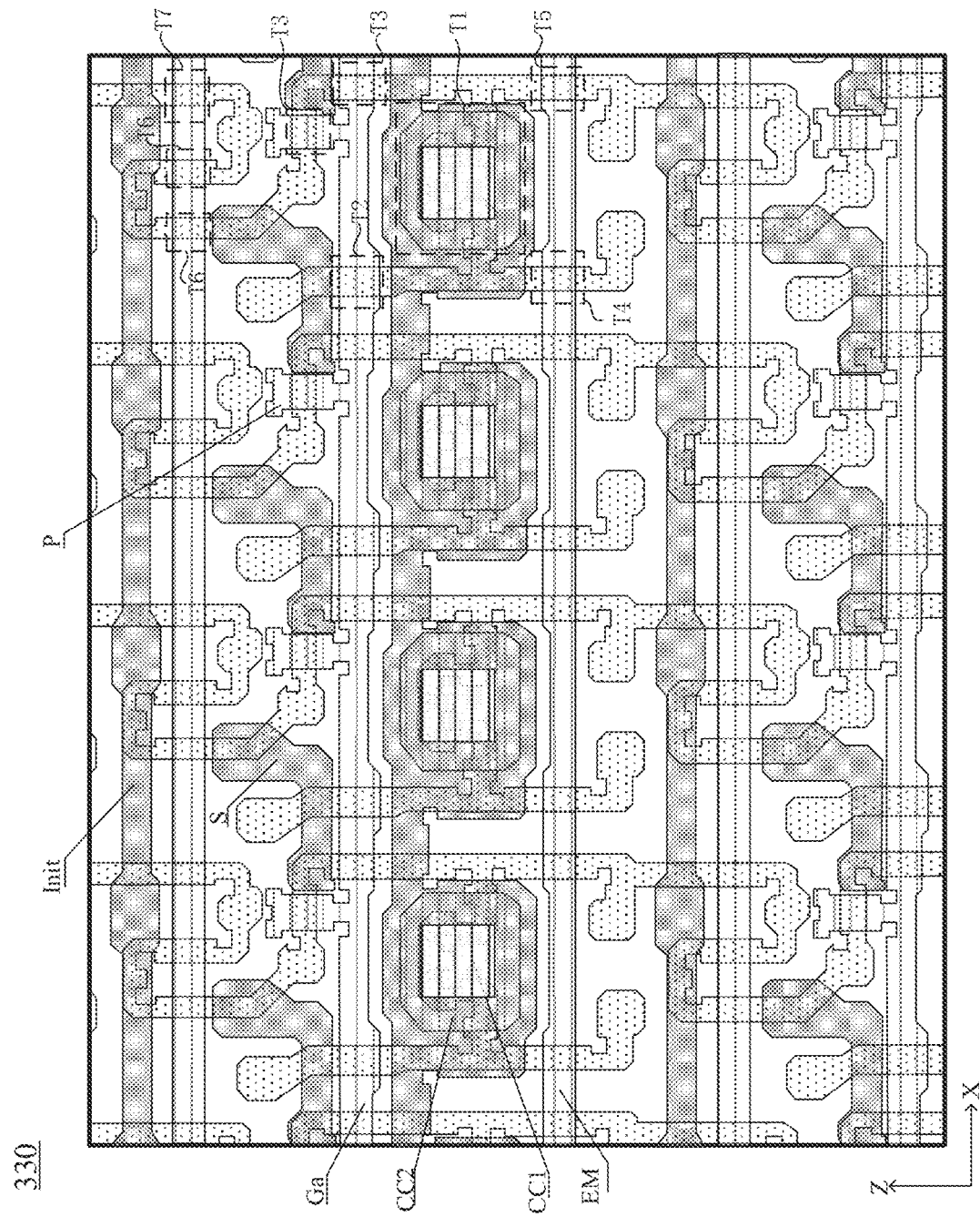

FIG. 6C shows a top view structure of a second gate metal layer 330 in the display substrate 10. The second gate metal layer 330 is a patterned metal film. A first interlayer insulating layer 150 is formed on the first gate metal layer 320.

The second gate metal layer 330 is located on the first interlayer insulating layer 150, and is insulated from the first gate metal layer 320.

For example, the second gate metal layer 330 is used to manufacture a second electrode CC2 of the capacitor C, the reset power signal line Init, and a light-shielding portion S. Orthogonal projections of the second electrode CC2 of the capacitor C and the first electrode CC1 of the capacitor C on the base substrate 100 are at least partially overlapped to form the capacitor C. Optionally, an opening is provided in the second electrode CC2 of the capacitor C, and an orthogonal projection of the opening on the base substrate 100 is located within an orthogonal projection of the first electrode CC1 of the capacitor C on the base substrate 100; and an orthogonal projection of a portion except the opening in the second electrode CC2 of the capacitor C on the base substrate 100 is partially overlapped with the orthogonal projection of the first electrode CC1 of the capacitor C on the base substrate 100.

In addition, for example, as shown in FIG. 6C, the second electrode CC2 of the capacitor C is formed by the second gate metal layer 330. In this way, in the pixel circuits 0221 in the same row, interconnecting the second electrodes CC2 of the capacitors C may reduce resistance of corresponding metal connection lines in the second gate metal layer 330, thereby reducing a voltage drop (IR drop) of the power supply voltage.

In addition, in some examples, the compensation transistor T3 is a double-gate transistor, and when the compensation transistor T3 is turned off, a semiconductor pattern portion between two channels of the compensation transistor T3 is in a floating state, which is likely to jump due to influence of voltages of peripheral lines, thereby influencing a leakage current of the compensation transistor T3, and further influencing a light-emitting brightness thereof. In order to keep a voltage of the semiconductor pattern portion between the two channels of the compensation transistor T3 stable, the light-shielding portion S is designed to form a capacitor with the semiconductor pattern portion between the two channels of the compensation transistor T3, and the light-shielding portion S is connected to the second power signal line, so that a constant voltage may be obtained, and the voltage of the semiconductor pattern portion in the floating state may be kept stable.

An orthogonal projection of the light-shielding portion S on the base substrate 100 overlaps with an orthogonal projection of the semiconductor pattern portion between the two channels of the compensation transistor T3 on the base substrate 100, which may prevent the semiconductor pattern portion from suffering a problem of a change in electrical characteristics due to illumination.

Figure 6D:
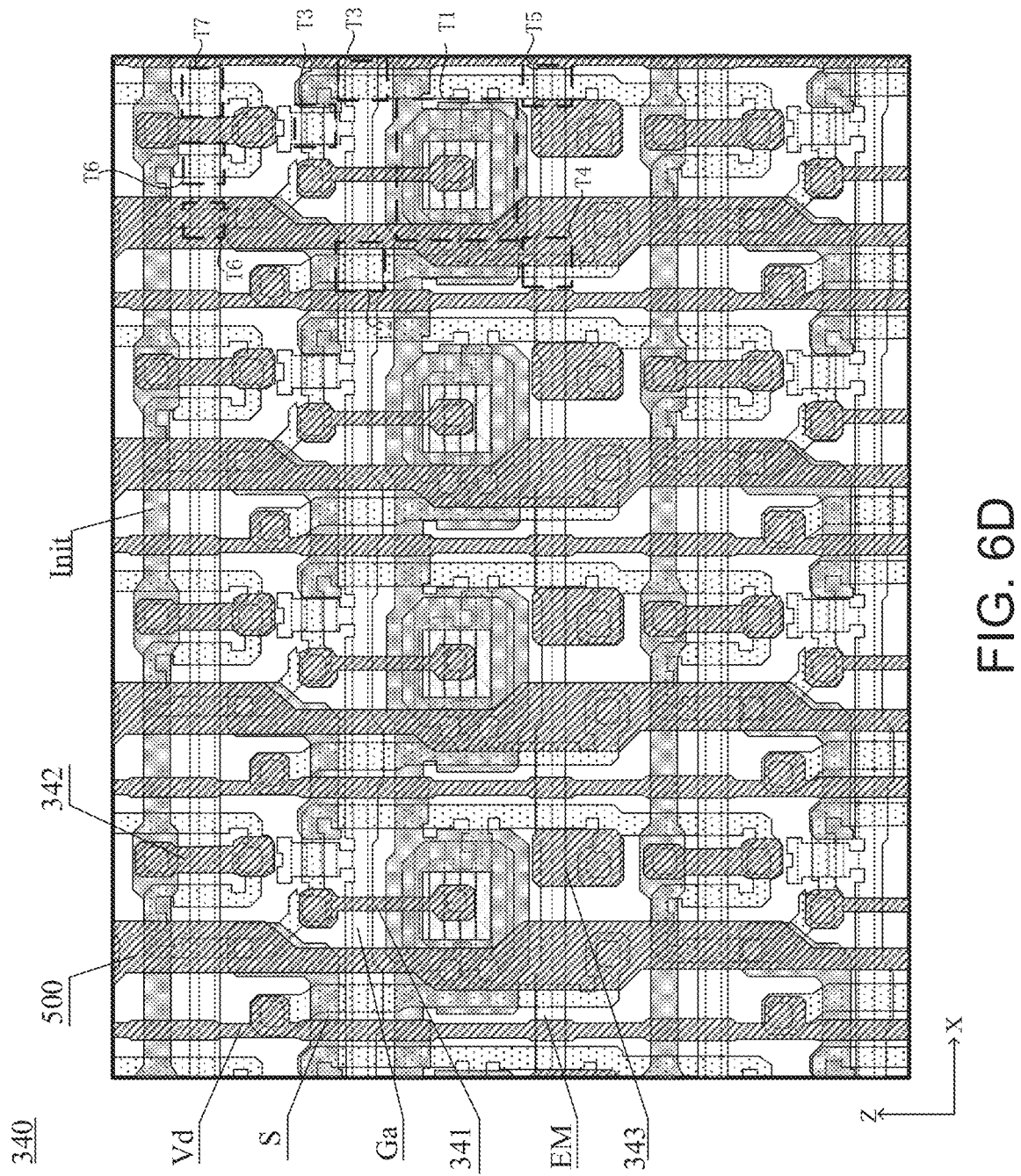
Figure 6E:
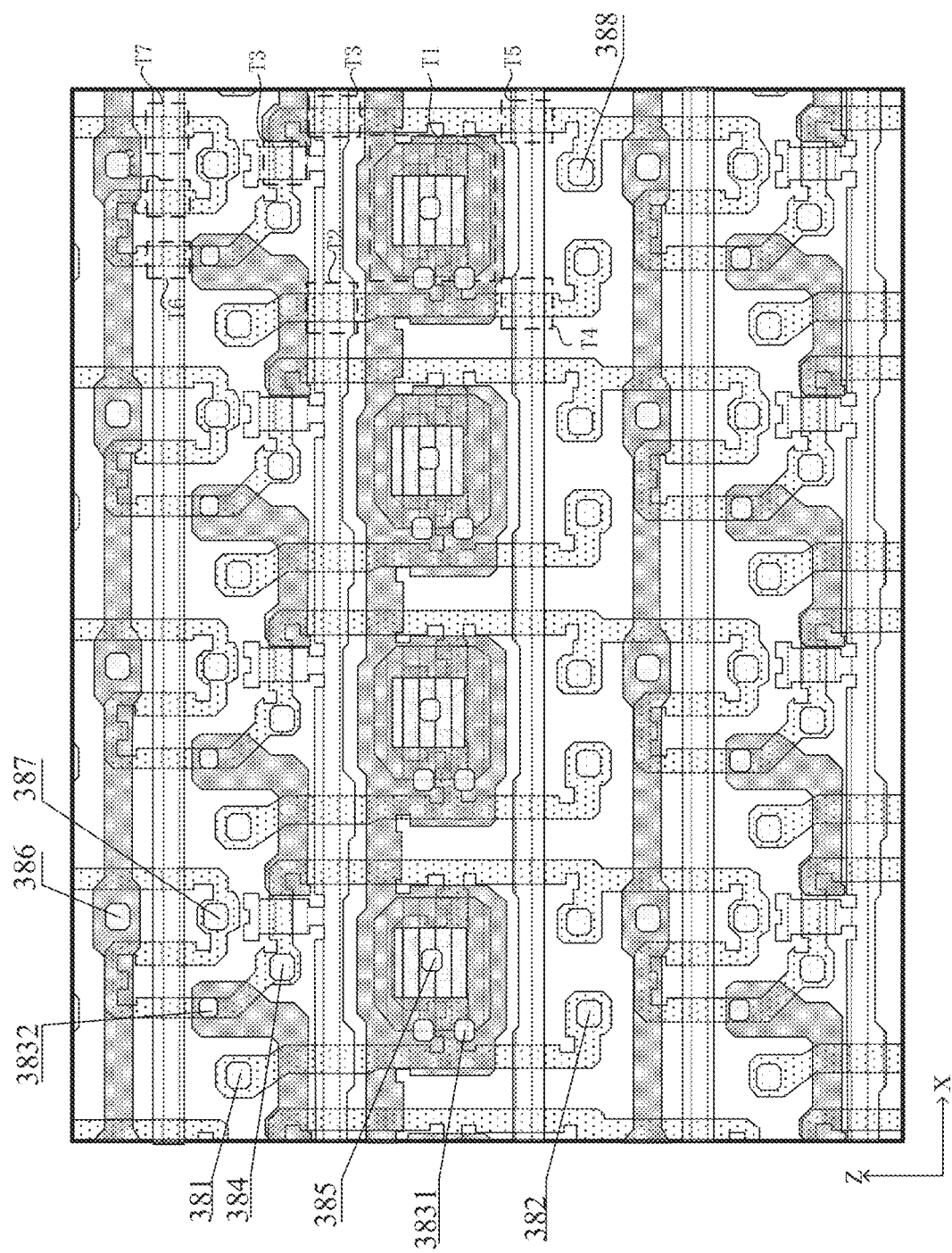
Figure 6E:
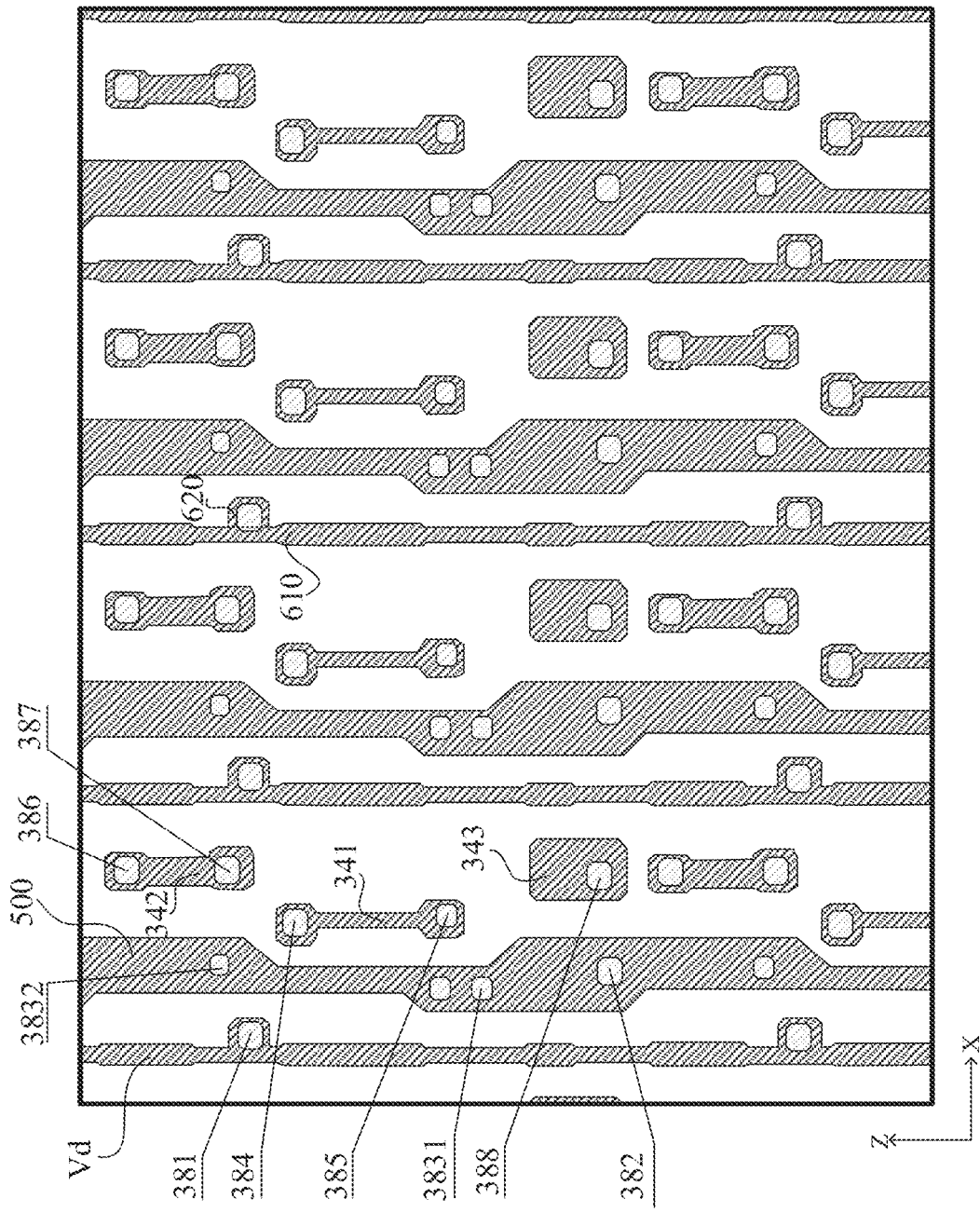

For example, a second interlayer insulating layer 140 and a first metal layer are sequentially stacked on the second gate metal layer 330 in a direction away from the base substrate 100. FIG. 6D shows a top view structure of a first metal layer 340 in the display substrate 10. FIG. 6E shows distribution of a plurality of via holes required to achieve electrical connection between the first metal layer 340 and the semiconductor pattern layer 310, between the first metal layer 340 and the first gate metal layer 320, and between the first metal layer 340 and the second gate metal layer 330. FIG. 6E' shows relative positions between the first metal layer 340 and the via holes in FIG. 6E. The first metal layer 340 is a patterned metal film. The first metal layer 340 may be used to manufacture a data line Vd, a second power signal line 500, a first transfer electrode 341, a second transfer electrode 342 and a driving electrode 343. The data line Vd and the second power signal line 500 both extend in the second direction, and there is spacing between the data line Vd and the second power signal line 500 corresponding to the same pixel circuit 0221.

As shown in FIGS. 6D, 6E and 6E', the data line Vd is electrically connected to a second electrode T2-2 of the data writing transistor T2 through a via hole 381 passing through the gate insulating layer 160, the first interlayer insulating layer 150 and the second interlayer insulating layer 140. The second power signal line 500 is electrically connected to a first electrode T4-1 of the first light-emitting control transistor T4 through a via hole 382 passing through the gate insulating layer 160, the first interlayer insulating layer 150 and the second interlayer insulating layer 140. The second power signal line 500 and the data line Vd are alternately arranged in the first direction. The second power signal line 500 is electrically connected to the second electrode CC2 of the capacitor C through a via hole 3831 passing through the second interlayer insulating layer 140. The second power signal line 500 is electrically connected to the light-shielding portion S through a via hole 3832 passing through the second interlayer insulating layer 140, so as to supply a constant voltage to the light-shielding portion S. One end of a first transfer electrode 341 is electrically connected to the second electrode of the compensation transistor T3 through a via hole 384 passing through the gate insulating layer 160, the first interlayer insulating layer 150 and the second interlayer insulating layer 140. The other end of the first transfer electrode 341 is electrically connected to the gate of the driving transistor T1 (i.e., the first electrode CC1 of the capacitor C) through a via hole 385 passing through the first interlayer insulating layer 150 and the second interlayer insulating layer 140. One end of the second transfer electrode 342 is electrically connected to the reset power signal line Init through a via hole 386 passing through the second interlayer insulating layer 140. The other end of the second transfer electrode 342 is electrically connected to the first electrode of the second reset transistor T7 through a via hole 387 passing through the gate insulating layer 160, the first interlayer insulating layer 150 and the second interlayer insulating layer 140. A driving electrode 343 is electrically connected to the second electrode of the second light-emitting control transistor T5 through a via hole 388 passing through the gate insulating layer 160, the first interlayer insulating layer 150 and the second interlayer insulating layer 140.

In some examples, as shown in FIG. 6E', the data line Vd includes a body 610 extending in the second direction, and a protrusion portion 620 protruding towards a corresponding pixel circuit 0221 in the first direction. Optionally, an overlapping area of an orthogonal projection of the via hole 381 on the base substrate 100 and an orthogonal projection of the protrusion portion 620 on the base substrate 100 may be 70% to 100%, e.g., 70%, 80% or 100%, of an area of the orthogonal projection of the via hole 381 on the base substrate 100. That is, an electrical connection between the data line Vd and the pixel circuit 0221 is mainly achieved by an electrical connection between the protrusion portion 620 and the pixel circuit 0221. In this way, in a case where a line width of the body 610 of the data line Vd is narrow, the protrusion portion 620 may be used to ensure a good electrical connection between the data line Vd and the pixel circuit 0221.

For example, a passivation layer 123 and a first planarization layer 122 may be sequentially stacked on the first metal layer 340 in the direction away from the base substrate 100, so as to insulatively protect the first metal layer 340.

However, the present disclosure is not limited thereto. For example, positions of the passivation layer 123 and the first planarization layer 122 may be interchanged, or a side of the first metal layer 340 away from the base substrate 100 is provided with only the first planarization layer 122, without the passivation layer 123.

Hereinafter, description will be made by taking an example in which the passivation layer 123 and the first planarization layer 122 are stacked on the first metal layer 340, and the first planarization layer 122 is located on a side of the passivation layer 123 away from the base substrate 100.

Figure 6F:
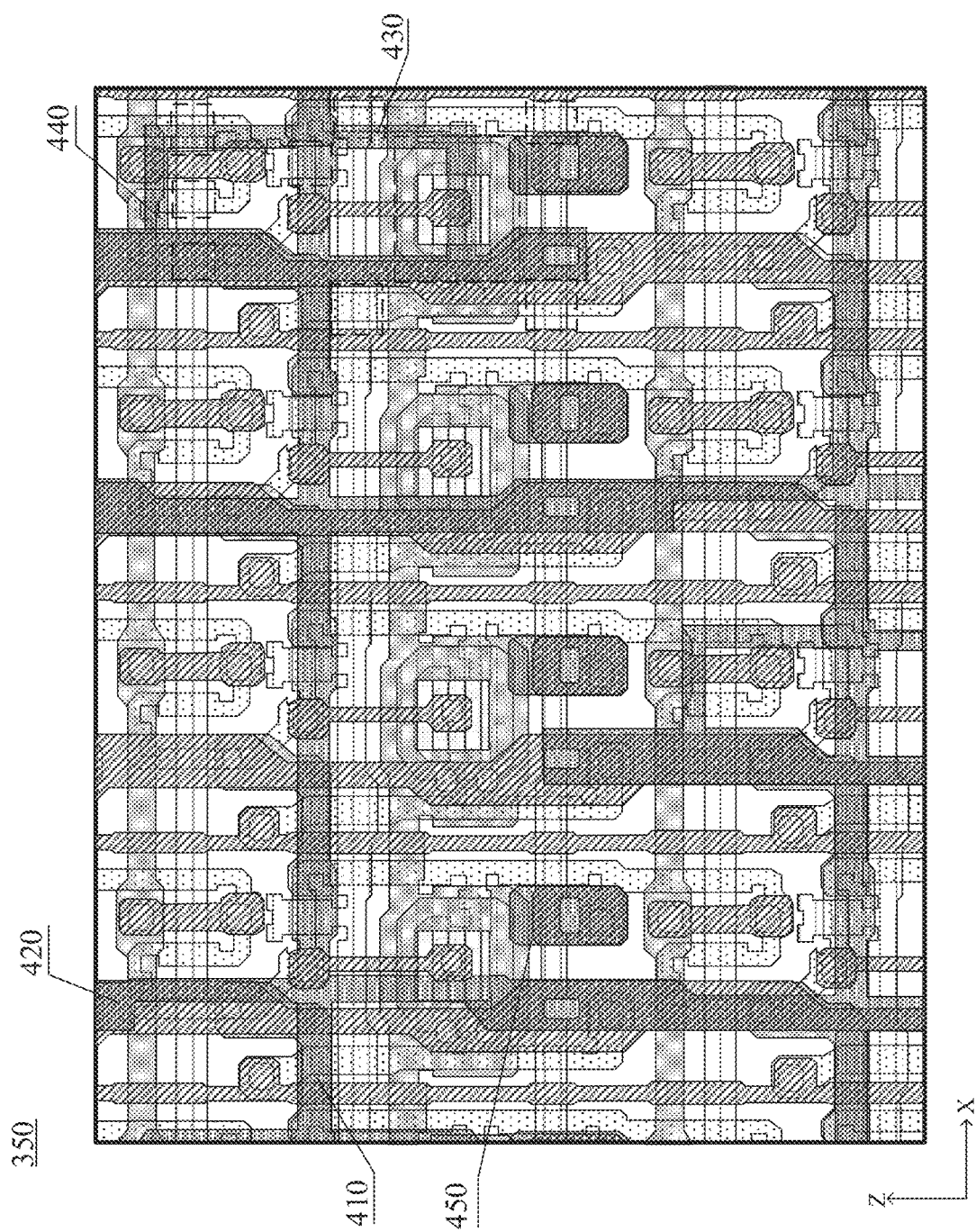
Figure 6G:
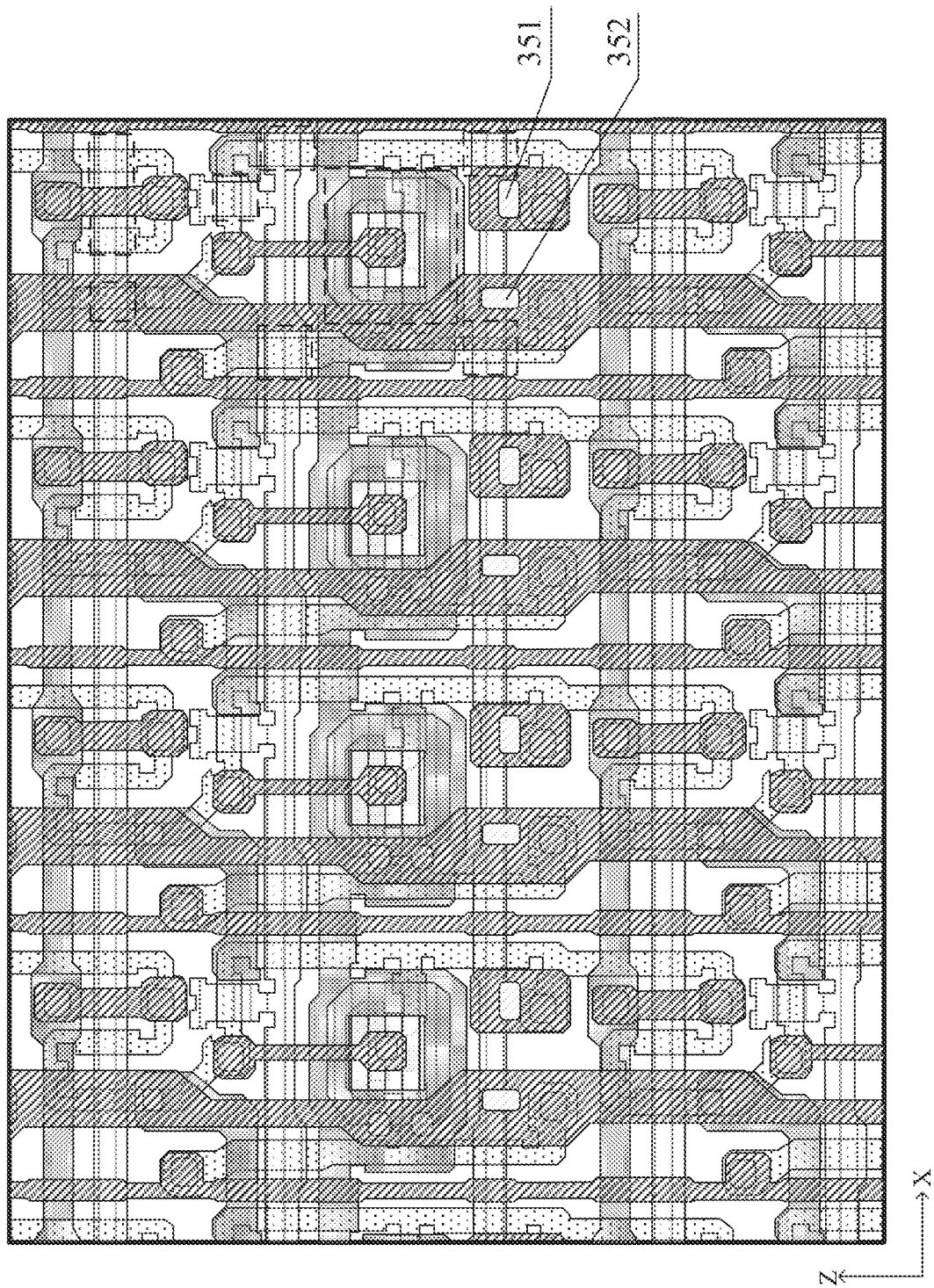
Figure 6G:
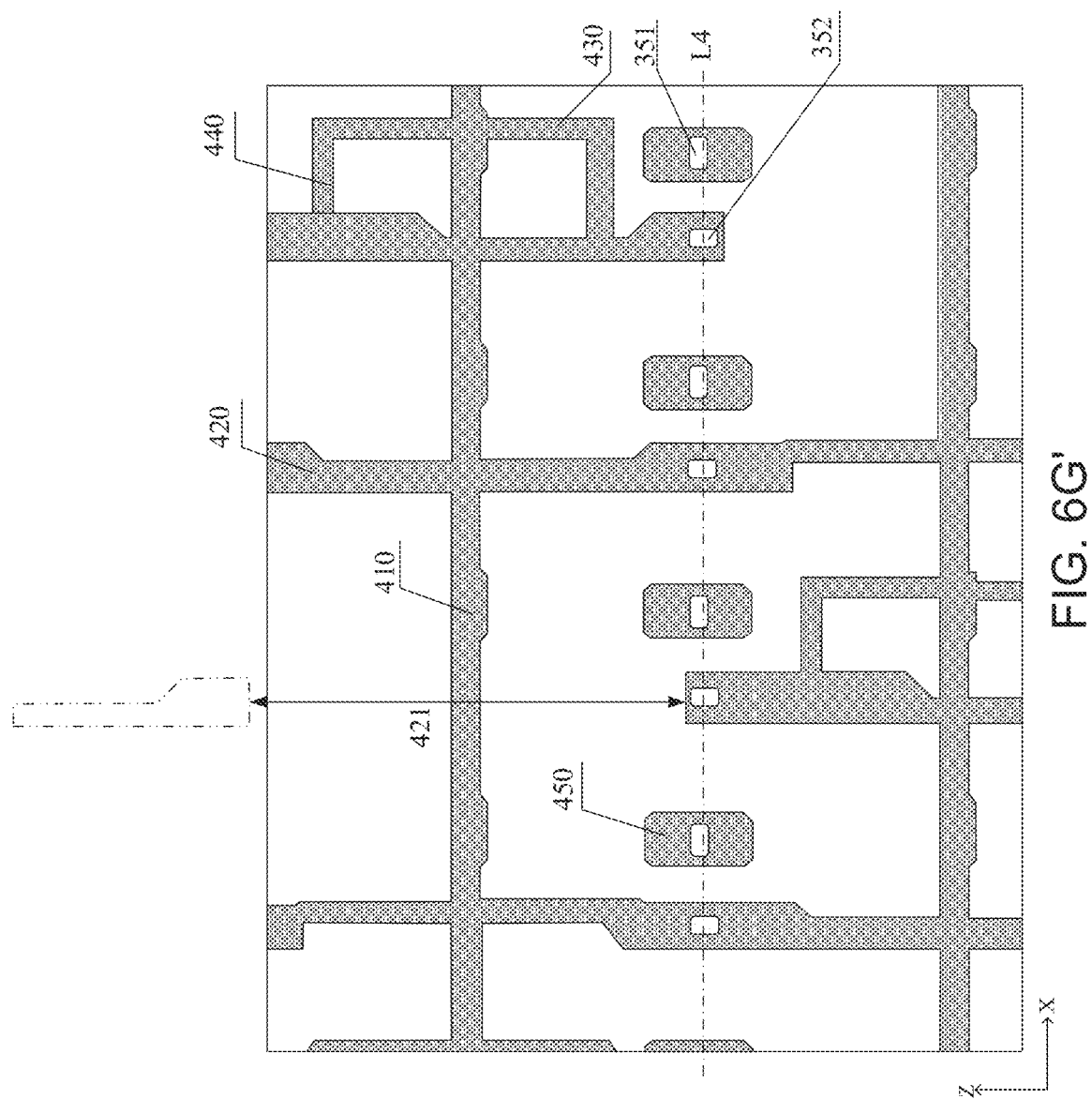

For example, a second metal layer is formed on the first planarization layer 122. FIG. 6F shows a top view structure of a second metal layer 350 in the display substrate 10. FIG. 6G shows distribution of a plurality of via holes required to achieve electrical connection between the second metal layer 350 and the first metal layer 340. FIG. 6G' shows relative positions between the second metal layer 350 and the via holes in FIG. 6G. The second metal layer 350 is a patterned metal film. The second metal layer 350 may be used to manufacture first power signal lines 400 and connection electrodes 450. The connection electrodes 450 are arranged in one-to-one correspondence with the driving electrodes 343 in the first metal layer 340, and the connection electrodes 450 are electrically connected to the driving electrodes 343 through via holes 352 passing through the first planarization layer 122 and the passivation layer 123.

Figure 6H:
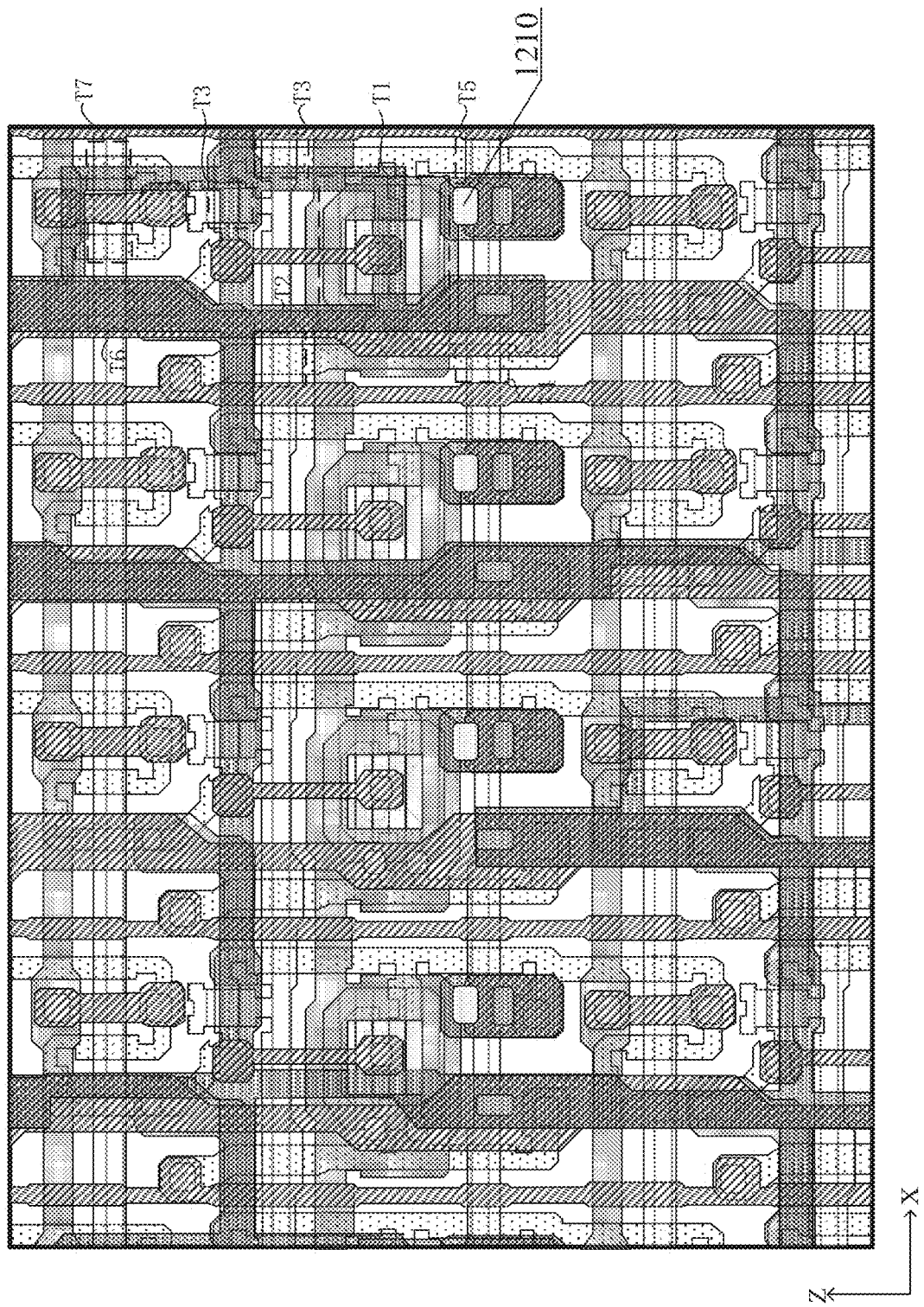
Figure 6H:
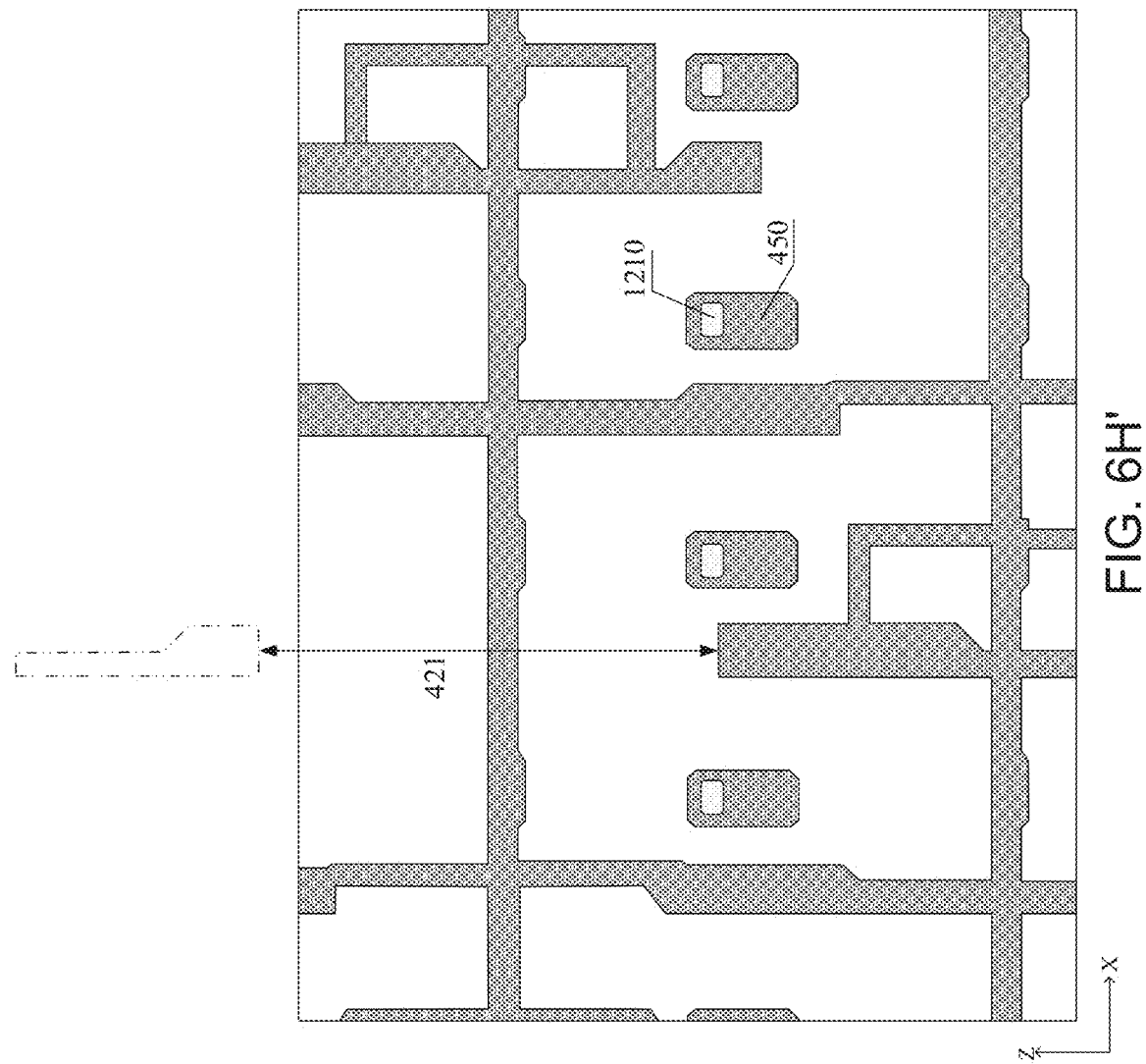
Figure 6I:
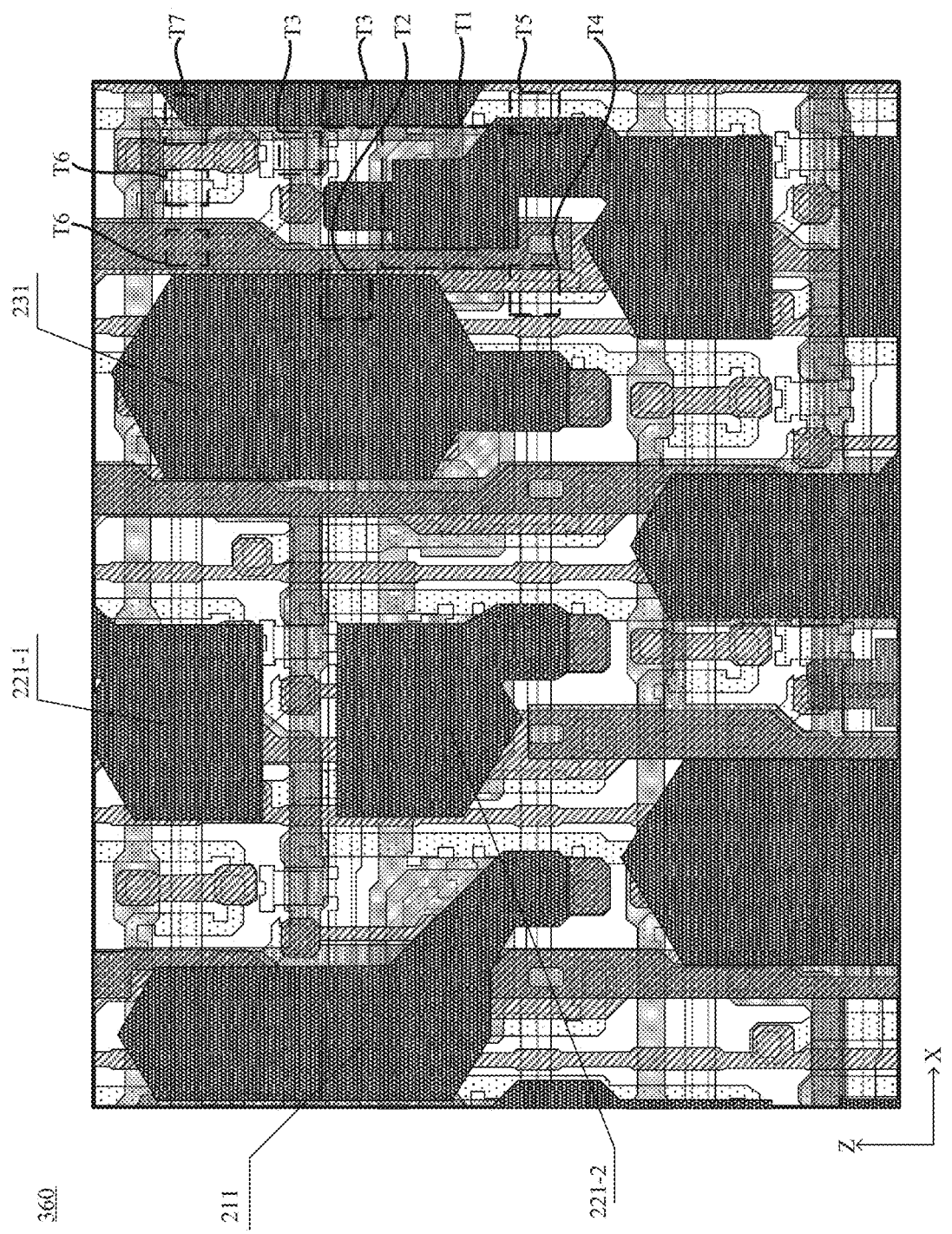
Figure 6I:
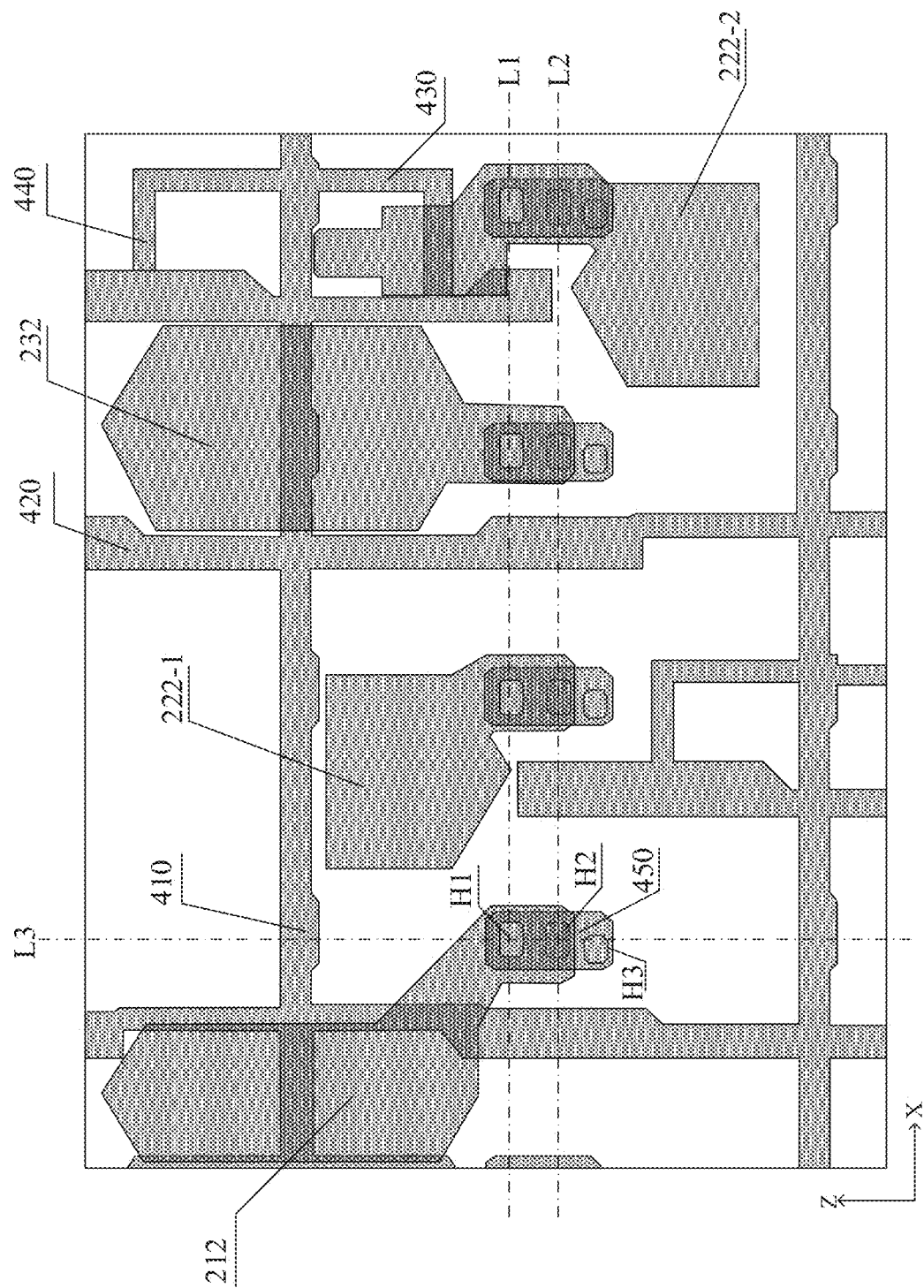

For example, a second planarization layer 121 and a pixel electrode layer 360 are sequentially stacked on the second metal layer 350 in the direction away from the base substrate 100. FIG. 6H shows distribution of a plurality of via holes in the second planarization layer 121. FIG. 6H' shows relative positions between the second metal layer 350 and the via holes in the second planarization layer 121. FIG. 6I shows distribution of the pixel electrodes in the pixel electrode layer 360. FIG. 6I' shows positional relationship of the pixel electrode layer 360, the second metal layer 350, a first via hole H1 and a second via hole H2. Herein, the first via hole H1 is a via hole 1210 passing through the second planarization layer 121. The second via hole H2 is a via hole 352 passing through the first planarization layer 122 and the passivation layer 123. The pixel electrode layer 360 is a patterned metal film. The pixel electrode layer 360 may be used to manufacture the pixel electrodes of the sub-pixels. Structures of the pixel electrodes of the sub-pixels is as described above according to arrangement of the sub-pixels in the sub-pixel group 200. The pixel electrodes are electrically connected to the connection electrodes 450 through via holes 1210 passing through the second planarization layer 121.

In some embodiments, it will be understood with reference to FIGS. 2A and 6I' that orthogonal projections of first via holes H1 corresponding to a plurality of pixel circuits located in the same row in the first direction on the base substrate 100 are arranged along a first straight line L1. Orthogonal projections of a plurality of second via holes H2 corresponding to the plurality of pixel circuits located in the same row in the first direction on the base substrate 100 are arranged along a second straight line L2. The effective light-emitting regions 2201 and 2202 of the first and second sub-pixels 22-1 and 22-2 corresponding to the plurality of pixel circuits located in the same row in the first direction are respectively located at two sides of the first straight line L1. There is a spacing D2 between orthogonal projections of the first via hole H1 and the second via hole H2 corresponding to the same connection electrode 450 on the base substrate.

In this way, in a process of manufacturing the second via hole H2, the connection electrode 450 and the first via hole H1, following problems caused by an overlap of the orthogonal projections of the first via hole H1 and the second via hole H2 on the base substrate 100 may be avoided, for example, the second metal layer 350 sags at the position of the second via hole H2, the second planarization layer 121 cannot be completely etched, and the pixel electrode layer 360 sags at the position of the first via hole H1. Therefore, it is advantageous to ensure flatness of the pixel electrode in the pixel electrode layer 360 and electrical connection performance between the pixel electrode and the connection electrode 450, so as to improve the display effect of the display substrate.

It will be added that the passivation layer 123 and the first planarization layer 122 are sequentially stacked on a surface of each transistor away from the base substrate, and the second via hole H2 passes through the first planarization layer 122 and the passivation layer 123, and has a certain hole depth. After the second metal layer 350 is formed, the second metal layer 350 is likely to sag at the position of the second via hole H2. The second planarization layer 121 is formed on a surface of the second metal layer 350 away from the base substrate 100, and it is generally difficult for the second planarization layer 121 to completely fill up the recess of the second metal layer 350 at the position of the second via hole H2. Therefore, if the orthogonal projections of the first via hole H1 and the second via hole H2 formed in the second planarization layer 121 on the base substrate 100 overlap, it is likely to cause a serious sinking problem of the pixel electrode in the pixel electrode layer 360 at the position of the first via hole H1 subsequently. The embodiments of the present disclosure may effectively solve the above problem by providing a spacing D2 between the orthogonal projections of the first via hole H1 and the second via hole H2 on the base substrate.

Moreover, as shown in FIGS. 2A and 6I', optionally, orthogonal projections of first via holes H1 corresponding to a plurality of pixel circuits located in the same column in the second direction on the base substrate 100 are arranged along a third straight line L3. Optionally, orthogonal projections of the first via hole H1 and the second via hole H2 corresponding to the same connection electrode 450 on the base substrate 100 are arranged along the third straight line L3. In this way, the first via holes H1 and the second via holes H2 are distributed in an array in the display substrate 10, which is convenient for manufacturing and also beneficial to simplifying a layout design of a corresponding mask.

It will be understood that, in some examples, a shape and an area of an orthogonal projection of the first via hole H1 on the base substrate 100 are approximately the same as a shape and an area of an orthogonal projection of the second via hole H2 on the base substrate 100. Herein, shapes of the first via hole H1 and the second via hole H2 may be regular rectangles or circles, so that it is convenient to determine lapping areas between the connection electrode 450 and the pixel electrode and between the connection electrode 450 and the driving electrode 343, so as to ensure that a connection line between the pixel electrode and the pixel circuit (e.g., the connection electrode 450 and the driving electrode 343) has a small resistance value.

In some embodiments, a shape of an orthogonal projection of the connection electrode 450 on the base substrate 100 is approximately the same as a shape of an orthogonal projection of the driving electrode 343 on the base substrate 100. Optionally, an area of the orthogonal projection of the connection electrode 450 on the base substrate 100 is greater than an area of the orthogonal projection of the driving electrode 343 on the base substrate 100. For example, the orthogonal projection of the driving electrode 343 on the base substrate 100 is located within the orthogonal projection of the corresponding connection electrode 450 on the base substrate 100, and portions of borders of orthogonal projections of the two electrodes coincide or approximately coincide. For example, there is a non-overlapping portion between the orthogonal projection of the connection electrode 450 on the base substrate 100 and the orthogonal projection of the driving electrode 343 on the base substrate 100, and the orthogonal projection of the first via hole H1 on the base substrate 100 overlaps with the non-overlapping portion. Therefore, it is convenient to arrange the first via hole H1 and the second via hole H2 in a straight line in the first direction and the second direction and improve a space utilization rate of the display substrate reasonably, so that the display substrate has high light transmittance.

In some embodiments, it will be understood with reference to FIGS. 6I' and 8 that the driving electrode 343 is electrically connected to the second electrode of the second light-emitting control transistor T5 through the via hole 388 passing through the gate insulating layer 160, the first interlayer insulating layer 150 and the second interlayer insulating layer 140. The via hole 388 passing through the gate insulating layer 160, the first interlayer insulating layer 150 and the second interlayer insulating layer 140 is a third via hole H3, and there is spacing between every two of three orthogonal projections of the third via hole H3, the second via hole H2 and the first via hole H1 corresponding to the same driving electrode 343 on the base substrate 100.

Figure 8:
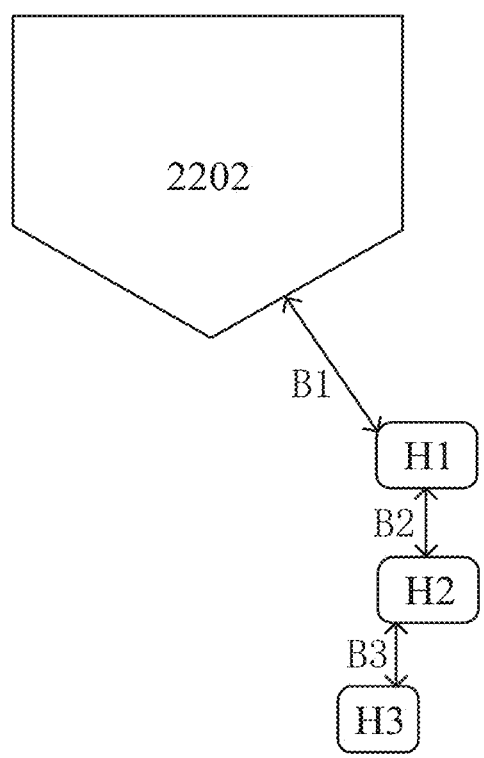
FIG. 8 is a schematic diagram of a position relationship among a first via hole, a second via hole, a third via hole and a pixel electrode, in accordance with some embodiments of the present disclosure.

Optionally, a distance B1 between the orthogonal projection of any one of the first via hole H1 and the second via hole H2 on the base substrate 100 and an effective light-emitting region of a corresponding sub-pixel is greater than 2 µm, and a value range thereof is, for example, 2 µm to 20 µm. For example, as shown in FIG. 8, the distance B1 between the orthogonal projection of any one of the first via hole H1 and the second via hole H2 on the base substrate 100 and an effective light-emitting region K of the corresponding sub-pixel is greater than or equal to 2.5 µm.

Optionally, a minimum distance between an orthogonal projection of at least one of the first via hole H1 and the second via hole H2 on the base substrate 100 and an orthogonal projection of a corresponding third via hole H3 on the base substrate 100 is greater than 0.8 µm, and a value range thereof is, for example, 0.8 µm to 10 µm. A minimum distance between the orthogonal projections of the first via hole H1 and the second via hole H2 on the base substrate 100 is greater than 1 µm, and a value range thereof is, for example, 1 µm to 10 µm. For example, as shown in FIG. 8, a minimum distance B2 between the orthogonal projection of the first via hole H1 on the base substrate 100 and an orthogonal projection of a corresponding second via hole H2 on the base substrate 100 is 1.2 µm; a minimum distance B3 between the orthogonal projection of the second via hole H2 on the base substrate 100 and the orthogonal projection of the corresponding third via hole H3 on the base substrate 100 is 0.9 µm. The first via hole H1 and the second via hole H2 are arranged along a straight line in the second direction, and the minimum distance between the orthogonal projection of the first via hole H1 on the base substrate 100 and the orthogonal projection of the corresponding third via hole H3 on the base substrate 100 is 2.1 µm (a sum of 0.9 µm and 1.2 µm).

In a process of manufacturing the third via hole H3, the driving electrode 343 and the second via hole H2, the following problems due to an overlap of orthogonal projections of the second via hole H2 and the third via hole H3 on the base substrate 100 may be avoided, for example, the first metal layer 340 sags at the position of the third via hole H3, the passivation layer 123 and the first planarization layer 122 cannot be completely etched, and the connection electrode 450 sags at the position of the second via hole H2, etc. Therefore, it is advantageous to ensure flatness of the connection electrode 450 and electrical connection performance between the connection electrode 450 and the driving electrode 343, so as to improve the display effect of the display substrate.

Furthermore, optionally, a shape of the orthogonal projection of the third via hole H3 on the base substrate 100 may be approximately the same as the shapes of the orthogonal projections of the first via hole H1 and the second via hole H2 on the base substrate 100. For example, a shape of the third via hole H3 may be a regular rectangle or circle.

Optionally, orthogonal projections of third via holes H3 corresponding to the plurality of pixel circuits located in the same column in the second direction on the base substrate 100 are arranged along the same straight line.

Optionally, orthogonal projections of third via holes H3 corresponding to the plurality of pixel circuits located in the same row in the first direction on the base substrate 100 are arranged along the same straight line.

In this way, in some embodiments, a plurality of third via holes H3 are distributed in an array in the display substrate 10, which is not only convenient for manufacturing, but also beneficial to realizing a design of relative distribution positions between the third via holes H3, the second via holes H2 and the first via holes H1, so as to reasonably improve the space utilization rate of the display substrate, and enable the display substrate to have high light transmittance.

In addition, in some embodiments, the via hole 381 passing through the gate insulating layer 160, the first interlayer insulating layer 150 and the second interlayer insulating layer 140 is a fourth via hole H4. Orthogonal projections of fourth via holes H4 corresponding to the plurality of pixel circuits located in the same column in the second direction on the base substrate 100 may be arranged along the same straight line, so as to be convenient for manufacturing, and reasonably improve the space utilization rate of the display substrate, and enable the display substrate to have high light transmittance.

In some embodiments, as shown in FIG. 6G', a first power signal line 400 includes a plurality of first sub-power signal lines 410 extending in the first direction and a plurality of second sub-power signal lines 420 extending in the second direction. The first sub-power signal lines 410 are interconnected with the second sub-power signal lines 420. That is, the first power signal lines 400 are arranged in a grid shape.

It will be understood with reference to FIGS. 5 and 6G' that, in the same second color sub-pixel pair 220, there is spacing between the effective light-emitting region of the first sub-pixel 22-1 and the effective light-emitting region of the second sub-pixel 22-2. An orthogonal projection of the first sub-power signal line 410 on the base substrate 100 passes through the spacing between the effective light-emitting region of the first sub-pixel 22-1 and the effective light-emitting region of the second sub-pixel 22-2. That is, in the same second color sub-pixel pair 220, an orthogonal projection of the spacing between effective light-emitting regions of the first sub-pixel 22-1 and the second sub-pixel 22-2 on a straight line extending in the second direction is not overlapped with orthogonal projections of the effective light-emitting regions in the second color sub-pixel pair on the same straight line.

In some examples, a center of an orthogonal projection of at least one of the first effective light-emitting region 2100 of the first color sub-pixel 210 and the third effective light-emitting region 2300 of the third color sub-pixel 230 on the base substrate 100 is located within the orthogonal projection of the first sub-power signal line 410 on the base substrate 100. That is, the first sub-power signal line 410 may be used as a symmetric center of the first effective light-emitting region 2100 and the third effective light-emitting region 2300, so that portions of the first effective light-emitting region 2100 and portions of the third effective light-emitting region 2300 located at both sides of the first sub-power signal line 410 have the same application environment, thereby ensuring that intensities of light emitted from the first effective light-emitting region 2100 and the third effective light-emitting region 2300 are uniform to improve color shift.

In some examples, a ratio of a distance from an orthogonal projection of an effective light-emitting region of the first sub-pixel 22-1 in the a second color sub-pixel pair 220 on the base substrate to an orthogonal projection of a corresponding first sub-power signal line 410 on the base substrate 100 to a distance from an orthogonal projection of an effective light-emitting region of the second sub-pixel 22-2 in the same second color sub-pixel pair 220 on the base substrate to the orthogonal projection of the corresponding first sub-power signal line 410 on the base substrate 100 is in a range from 0.9 to 1.1. That is, in the same second color sub-pixel pair 220, a distance from the first sub-effective light-emitting region 2201 of the first sub-pixel 22-1 to the first sub-power signal line 410 and a distance from the second sub-effective light-emitting region 2202 of the second sub-pixel 22-2 to the same first sub-power signal line 410 are approximately the same. For example, the first sub-effective light-emitting region 2201 of the first sub-pixel 22-1 and the second sub-effective light-emitting region 2202 of the second sub-pixel 22-2 are symmetrically arranged with the first sub-power signal line 410 as a center. In this way, the two effective light-emitting regions in the second color sub-pixel pair 220 not only have the same light-emitting area, but also have the same application environment relative to the first sub-power signal line 410 to improve color shift.

At least one second sub-power signal line 420 has a break 421, that is, the second sub-power signal line 420 is not a continuous signal line. The second sub-power signal line 420 includes a plurality of signal line segments disconnected from each other, and spacing between any two adjacent signal line segments in an extending direction of the second sub-power signal line 420 is the break 421. The effective light-emitting regions of the first sub-pixel 22-1 and the second sub-pixel 22-2 in the second color sub-pixel pair 220 and spacing therebetween are located at the break 421. For example, an orthogonal projection of the second sub-power signal line 420 on the base substrate 100 does not extend through orthogonal projections of the effective light-emitting regions of the first sub-pixel 22-1 and the second sub-pixel 22-2 and the spacing therebetween on the base substrate 100. An orthogonal projection of a virtual connection line between two end points of the break 421 in the second direction on the base substrate 100 extends through the orthogonal projections of the effective light-emitting regions of the first sub-pixel 22-1 and the second sub-pixel 22-2 and the spacing therebetween on the base substrate 100.

Optionally, the orthogonal projection of the second sub-power signal line 420 having the break 421 on the base substrate 100 is not overlapped with the orthogonal projections of the two effective light-emitting regions in the corresponding second color sub-pixel pair and the spacing therebetween on the base substrate 100.

Optionally, an orthogonal projection of the first power signal line 400 on the base substrate 100 is not overlapped with the orthogonal projections of the effective light-emitting regions of the first sub-pixel 22-1 and the second sub-pixel 22-2 in the second color sub-pixel pair 220 on the base substrate 100. That is, the orthogonal projections of the effective light-emitting regions of the first sub-pixel 22-1 and the second sub-pixel 22-2 in the second color sub-pixel pair 220 on the base substrate 100 may be overlapped with an orthogonal projection of a corresponding break 421 in the second sub-power signal line 420 on the base substrate 100, but are not overlapped with orthogonal projections of material portions of the first sub-power signal line 410 and the second sub-power signal line 420 on the base substrate 100. In this way, it is beneficial to improve flatness of a film layer located in the effective light-emitting region and located at a side of the pixel electrode away from the base substrate 100 in the second color sub-pixel pair 220, thereby avoiding color shift of the second color sub-pixel pair 220 during display as much as possible.

In addition, extending directions of the second sub-power signal line 420 and the second power signal line 500 are the same. The second sub-power signal line 420 is electrically connected to the second power signal line 500 through the via hole 352 passing through the first planarization layer 122 and the passivation layer 123. Thus, a parallel connection of the second power signal line 500 and the first power signal line 400 may be realized to reduce a resistance of the metal wires in the second metal layer 350, thereby reducing the IR drop of the power supply voltage.

Optionally, orthogonal projections of the second power signal line 500 and the second sub-power signal line 420 coupled thereto on the base substrate 100 at least partially overlaps. An orthogonal projection of the second power signal line 500 on the base substrate 100 is partially overlapped with the orthogonal projections of the effective light-emitting regions of the first sub-pixel 22-1 and the second sub-pixel 22-2 in the second color sub-pixel pair 220 on the base substrate 100. For example, the orthogonal projection of the second sub-power signal line 420 on the base substrate 100 is located within the orthogonal projection of the second power signal line 500 on the base substrate 100. For example, the second power signal line 500 may approximately coincide with portions of the second sub-power signal line 420 except the breaks 421, but a line width of the second sub-power signal line 420 is partially adjusted and thus the second sub-power signal line 420 does not completely coincide with the second power signal line 500. For example, an area of an overlapping portion of the second power signal line 500 and the second sub-power signal line 420 accounts for more than 70% of an area of the orthogonal projection of the second power signal line 500 on the base substrate 100.

Optionally, a width of the second sub-power signal line 420 in the first direction may be slightly different at different positions of the second sub-power signal line 420 in the extending direction thereof. For example, the width of the second sub-power signal line 420 at positions corresponding to some color sub-pixels is reduced. Similarly, the width of the second power signal line 500 in the first direction is slightly different at different positions of the second power signal line 500 in the extending direction thereof.

In some examples, the second power signal line 500 coincides with a portion of the second sub-power signal line 420 with a wider line width. It will be understood with reference to FIG. 6G' that, in this way, the via hole 352 passing through the first planarization layer 122 and the passivation layer 123 is a fifth via hole H5, and orthogonal projections of a plurality of fifth via holes H5 located in the same row in the first direction on the base substrate 100 may be arranged along a fourth straight line L4. In addition, a distance from an orthogonal projection of the fifth via hole H5 on the base substrate 100 to an orthogonal projection of any effective light-emitting region on the base substrate 100 is greater than 2.5 µm.

In some embodiments, distances from two second sub-power signal lines 420 that are located at both sides of the first effective light-emitting region 2100 of the first color sub-pixel 210 and adjacent to the first effective light-emitting region 2100 to a center line of the first effective light-emitting region 2100 extending in the second direction are different. For example, the second sub-power signal line 420 is adjacent to the first effective light-emitting region 2100 in the first direction, and a distance from the second sub-power signal line 420 to the center line of the first effective light-emitting region 2100 extending in the second direction is greater than a distance from the other second sub-power signal line 420 adjacent to the first effective light-emitting region 2100 in the first direction to the center line of the first effective light-emitting region 2100 extending in the second direction.

On this basis, the display substrate 10 further includes a plurality of pad blocks 430 disposed in the same layer as the first power signal lines 400, and a plurality of supporting portions 440 disposed in the same layer as the pad blocks 430. The second metal layer 350 may also be used to manufacture the pad blocks 430 and the supporting portions 440. The pad blocks 430 extend in the second direction and are correspondingly coupled to the first sub-power signal lines 410. The pad block 430 is located between the first effective light-emitting region 2100 and the second sub-power signal line 420. The pad block 430 may have an elongated structure extending in the second direction. Two ends of the pad block 430 in the second direction are coupled to the second sub-power signal line through the supporting portion 440 to form a closed loop structure. Optionally, a center of an orthogonal projection of the pad block 430 on the base substrate 100 is located within the orthogonal projection of the first sub-power signal line 410 on the base substrate 100. That is, the first sub-power signal line 410 may be a symmetric center of the pad block 430. Distances from the first effective light-emitting region 2100 to the pad block 430 and the second sub-power signal line 420 that are located at two sides of the first effective light-emitting region are approximately the same in the first direction, for example, a ratio of the two distances is in a range from 0.9 to 1.1, so that it may be ensured that two sides of the first effective light-emitting region 2100 have a relatively consistent application environment, and intensity of the light emitted from the first effective light-emitting region 2100 is uniform, which is beneficial to improving the color shift.

In addition, the pad block 430 is electrically connected to the first power signal line 400, and thus the pad block 430 may be prevented from being in a floating state, which may affect the normal operation of the light-emitting device 0220.

Optionally, the orthogonal projection of the pad block 430 on the base substrate 100 is not overlapped with the orthogonal projection of the first effective light-emitting region 2100 on the base substrate, which may prevent the pad block 430 from affecting the display of the first color sub-pixel 210.

Optionally, orthogonal projections of the pad block 430 and the pixel electrode 211 of the first color sub-pixel 210 on the base substrate 100 are not overlapped with each other, or an area of a region where the two orthogonal projections overlap with each other is small, which is beneficial to reducing color shift.

Optionally, a dimension of the pad block 430 in the second direction is greater than a dimension thereof in the first direction. The dimension of the pad block 430 in the second direction is less than a dimension of the first effective light-emitting region 2100 in the same direction. When the display substrate in the embodiments of the present disclosure is applied to under-screen fingerprint detection, the dimension of the pad block 430 in the second direction may be designed to be less than the dimension of the first effective light-emitting region in the same direction, so as to improve the light transmittance of the display substrate.

In some embodiments, in a direction perpendicular to the base substrate 100, in film layers between the base substrate 100 and the pixel electrode layer 360, at least partial region of the notch region of a pixel electrode is not overlapped with metal patterns in metal layers, so that light transmittance of this partial region is greater than 60%.

Optionally, in the direction perpendicular to the base substrate 100, in the film layers between the base substrate 100 and the pixel electrode layer 360, at least partial region of the notch region is not overlapped with the metal patterns in the metal layers and semiconductor patterns in the semiconductor pattern layer, so that the light transmittance of this partial region is greater than 70%.

In this way, when the display substrate 10 is applied to under-screen optical fingerprint detection, a light-transmitting portion of the notch region may be utilized to reflect light, so as to achieve detection of a fingerprint pattern. It will be noted that, there may also be other light-transmissive regions in the display substrate 10, for example, in the direction perpendicular to the base substrate 100 (i.e., thickness direction of the base substrate 100), any region that is not overlapped with the metal layers in the display substrate 10. This is not described in detail in the embodiments of the present disclosure.

The under-screen optical fingerprint detection technology generally uses light emitted from the display substrate 10 as a light source, and a fingerprint sensor is generally disposed at a non-display side of the display substrate, e.g., at a side of the light-emitting device 0220 proximate to the base substrate 100, so as to achieve an under-screen fingerprint detection function.

For example, light emitted by the sub-pixels may be used for display and as light for the under-screen fingerprint detection, and a top film layer for placing a finger may be further provided at a side of the sub-pixels away from the base substrate 100. The fingerprint sensor for collecting a fingerprint image may be disposed at the same side of the display substrate 10 with the sub-pixels, and the fingerprint sensor is disposed at a side of the light-emitting device 0220 of the sub-pixel proximate to the base substrate 100, and is used for detecting reflected light reflected from a fingerprint on a surface of the top film layer. The fingerprint sensor may include a plurality of detecting units arranged in an array. In order to achieve the under-screen fingerprint detection function, at least a portion of the film layers such as the top film layer and the base substrate are transparent, and a light transmission region is provided between adjacent sub-pixels, so that the reflected light of the fingerprint on the surface of the top film layer may be incident on the fingerprint sensor to obtain the fingerprint image. Since the anodes of the light-emitting devices of sub-pixels easily affect the light transmittance, and sensitivity of fingerprint detection is further affected, the light transmittance of the display substrate may be effectively improved by providing a notch in the pixel electrode of the light-emitting device.

It will be added that, in some embodiments, in two pixel circuits of the first sub-pixel 22-1 and the second sub-pixel 22-2, metal at the same potential as the control electrode of the driving transistor T1 include the first electrode CC1 of the capacitor C in the first gate metal layer 320, and the first transfer electrode 341 in the first metal layer 340. Orthogonal projections of the first electrode CC1 of the capacitor C and the first transfer electrode 341 in each pixel circuit on the base substrate 100 is taken as a first projection, a projection area of a region where an orthogonal projection of the pixel electrode of the first sub-pixel 22-1 on the base substrate 100 overlaps with the first projection is taken as a first area, and a projection area of a region where an orthogonal projection of the pixel electrode of the second sub-pixel 22-2 on the base substrate 100 overlaps with the first projection is taken as a second area, an area ratio of the first area to the second area may be in a range from 0.8 to 1.2. That is, the first area and the second area are approximately the same. In this way, it is beneficial to ensure that loads of the two pixel circuits of the first sub-pixel 22-1 and the second sub-pixel 22-2 are the same, thereby avoiding a problem of non-uniform brightness of light emitted by the first sub-pixel 22-1 and the second sub-pixel 22-2.

The orthogonal projection of the first electrode CC1 of the capacitor C on the base substrate 100 is partially overlapped with an orthogonal projection of the first transfer electrode 341 on the base substrate 100 in each pixel circuit, and shapes of two pixel electrodes of the first sub-pixel 22-1 and the second sub-pixel 22-2 are different. Therefore, optionally, an area of a region where orthogonal projections of both the pixel electrode 221-1 of the first sub-pixel 22-1 and the first electrode CC1 of the capacitor C on the base substrate 100 overlap is less than an area of a region where orthogonal projections of both the pixel electrode 221-2 of the second sub-pixel 22-2 and the first electrode CC1 of the capacitor C on the base substrate 100 overlap, and an area of a region where orthogonal projections of both the pixel electrode 221-1 of the first sub-pixel 22-1 and the first transfer electrode 341 on the base substrate 100 overlap is greater than an area of a region where orthogonal projections of both the pixel electrode 221-2 of the second sub-pixel 22-2 and the first transfer electrode 341 on the base substrate 100 overlap.

Figure 9:
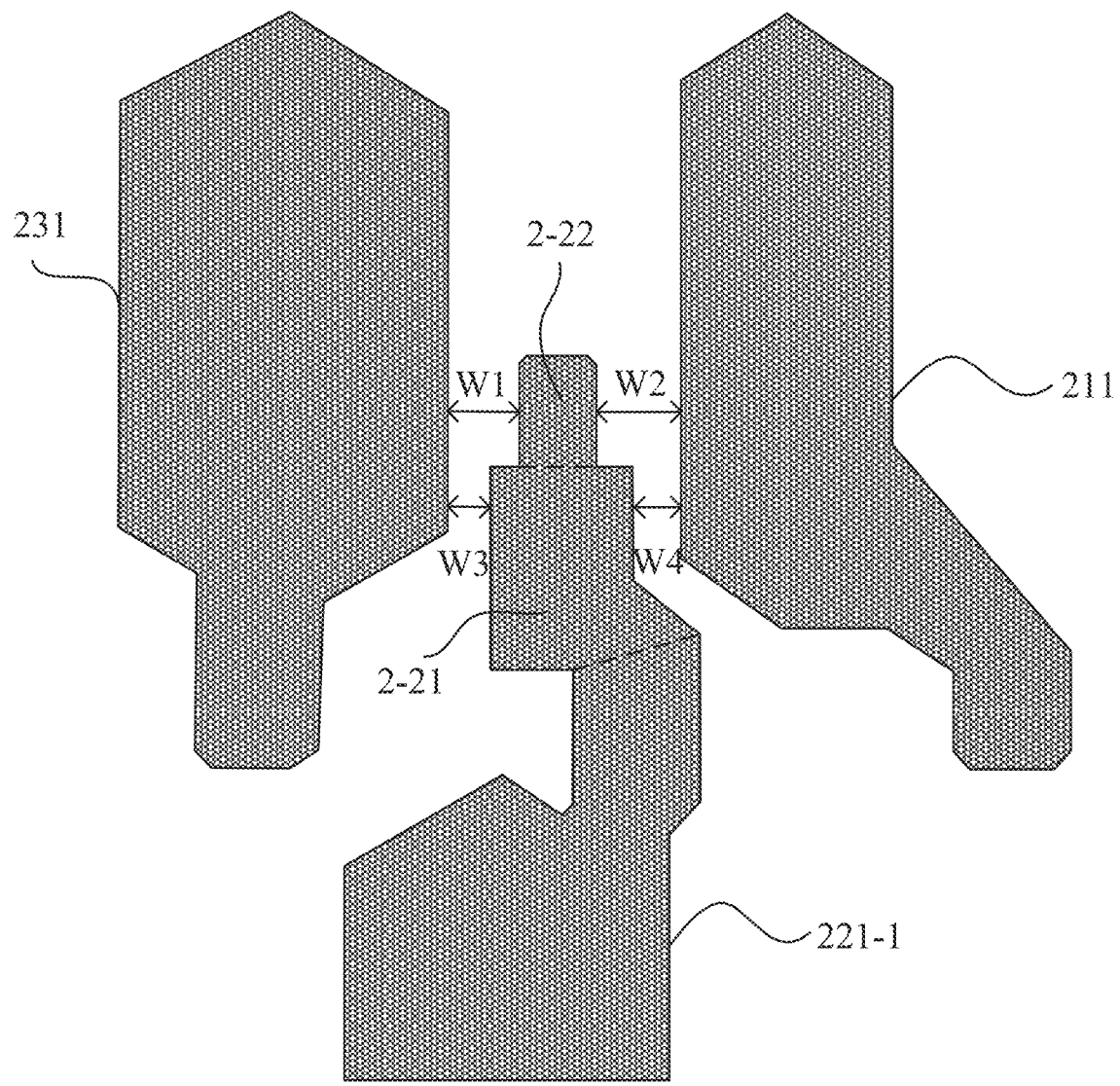
FIG. 9 is a schematic diagram of a position relationship between a pixel electrode of a first sub-pixel and an adjacent pixel electrode, in accordance with some embodiments of the present disclosure.

In addition, in some embodiments, as shown in FIG. 9, the compensation portion 2-2 of the pixel electrode 221-1 of the first sub-pixel 22-1 includes a first compensation portion 2-21 electrically connected to the bending portion 2-1, and a second compensation portion 2-22 that is located at a side of the first compensation portion 2-21 away from the bending portion 2-1 and electrically connected to the first compensation portion 2-21. The first compensation portion 2-21 and the second compensation portion 2-22 may have an elongated structure extending in the second direction. An orthogonal projection of the second compensation portion 2-22 on the base substrate 100 is not overlapped with the orthogonal projection of the first electrode CC1 of the capacitor C on the base substrate 100. A dimension of the second compensation portion 2-22 in the first direction is less than a dimension of the first compensation portion 2-21 in the same direction, which is beneficial to obtaining more light-transmissive regions in the display substrate 10 to improve the light transmittance of the display substrate 10.

Moreover, as shown in FIG. 9, in some examples, the compensation portion 2-2 of the pixel electrode 221-1 of the first sub-pixel 22-1 is located between the pixel electrode 231 of the adjacent third color sub-pixel 230 and the pixel electrode 211 of the adjacent first color sub-pixel 210. A first distance W1 from the second compensation portion 2-22 to the pixel electrode 231 of the third color sub-pixel 230 in the first direction may be approximately the same as a second distance W2 from the second compensation portion 2-22 to the pixel electrode 211 of the first color sub-pixel 210 in the first direction. A third distance W3 from the first compensation portion 2-21 to the pixel electrode 231 of the third color sub-pixel 230 in the first direction may be approximately the same as a fourth distance W4 from the first compensation portion 2-21 to the pixel electrode 211 of the first color sub-pixel 210 in the first direction. The first distance W1 is greater than the third distance W3, and the second distance W2 is greater than the fourth distance W4. For example, a ratio of the second distance W2 to the first distance W1 is in a range from 0.9 to 1.1. For example, the first distance W1 is in a range from 4.5 μm to 6.5 μm, e.g., 5.47 μm. The second distance W2 is in a range from 4.5 μm to 6.5 μm, e.g., 5.73 μm. A ratio of the fourth distance W4 to the third distance W3 is in a range from 0.9 to 1.1. For example, the third distance W3 is in a range from 2.5 μm to 4.0 μm, e.g., 3.0 μm. The second distance W2 is in a range from 2.5 μm to 4.0 μm, e.g., 3.0 μm.

Structures of sub-pixels in the display substrate 10 are as described above. In some embodiments, by reducing an area of an electrode in a region outside the effective light-emitting region in each sub-pixel, an area of a region where light is shielded may be reduced to improve the light transmittance of the display substrate. For example, in a case where an area of an effective light-emitting region of each sub-pixel is ensured to be unchanged, an influence of the pixel electrode on light shielding may be reduced by changing a shape of a portion, e.g., the connection portion, of the pixel electrode located in the region outside the effective light-emitting region, i.e., by increasing an area ratio of the effective light-emitting region to the pixel electrode, thereby improving the light transmittance of the display substrate.

For example, in the first color sub-pixel 210, an area ratio of the first effective light-emitting region 2100 to the pixel electrode 211 is in a range from 53% to 55%. In the second color sub-pixel pair 220, an area ratio of the first sub-effective light-emitting region 2201 to the pixel electrode 221-1 is in a range from 43.5% to 48%, and an area ratio of the second sub-effective light-emitting region 2202 to the pixel electrode 221-2 is in a range from 43.5% to 48%. In the third color sub-pixel 230, an area ratio of the third effective light-emitting region 2300 to the pixel electrode 231 is in a range from 67.5% to 69%. For example, in the first color sub-pixel 210, the area ratio of the first effective light-emitting region 2100 to the pixel electrode 211 is 54.9%. In the second color sub-pixel pair 220, the area ratio of the first sub-effective light-emitting region 2201 to the pixel electrode 221-1 is 47%, and the area ratio of the second sub-effective light-emitting region 2202 to the pixel electrode 221-2 is 47%. In the third color sub-pixel 230, the area ratio of the third effective light-emitting region 2300 to the pixel electrode 231 is 68.3%. Therefore, the overall display substrate 10 may be ensured to have good light transmittance, thereby further enhancing the sensitivity of fingerprint detection.

In addition, optionally, an area ratio of the first effective light-emitting region 2100, the effective light-emitting regions of the second color sub-pixel pair 220 and the third effective light-emitting region 2300 is approximately 1:1.27:1.47. An area ratio of the pixel electrode 211 of the first color sub-pixel 210, the pixel electrodes of the second color sub-pixel pair 220 and the pixel electrode 231 of the third color sub-pixel 230 is approximately 1:1.48:1.18. Herein, the "area ratio" refers to a ratio of areas of orthogonal projections on the base substrate.

Figure 7A:
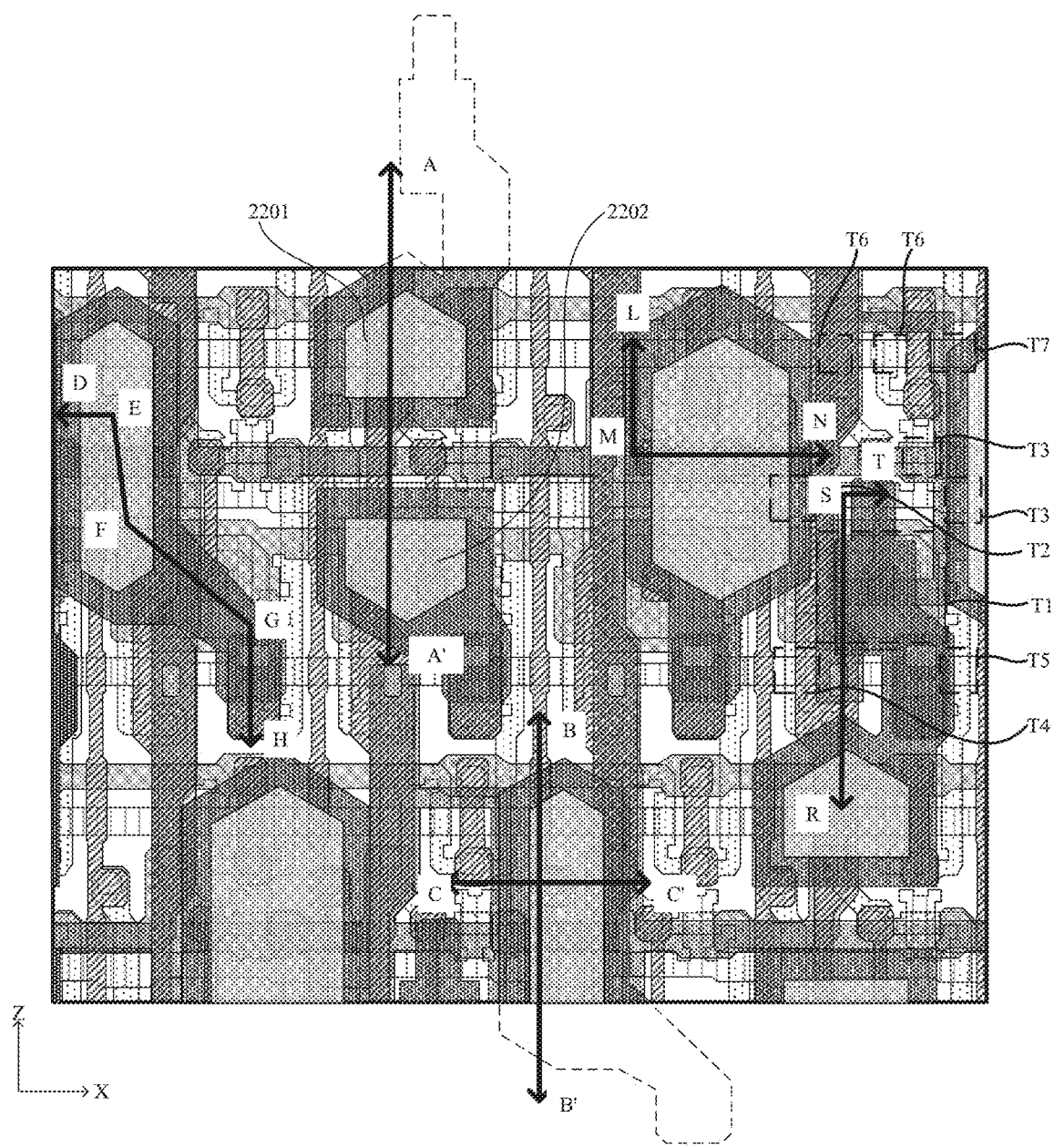
FIG. 7A is a partial schematic diagram of a display substrate, in accordance with some embodiments of the present disclosure.
Figure 7B:
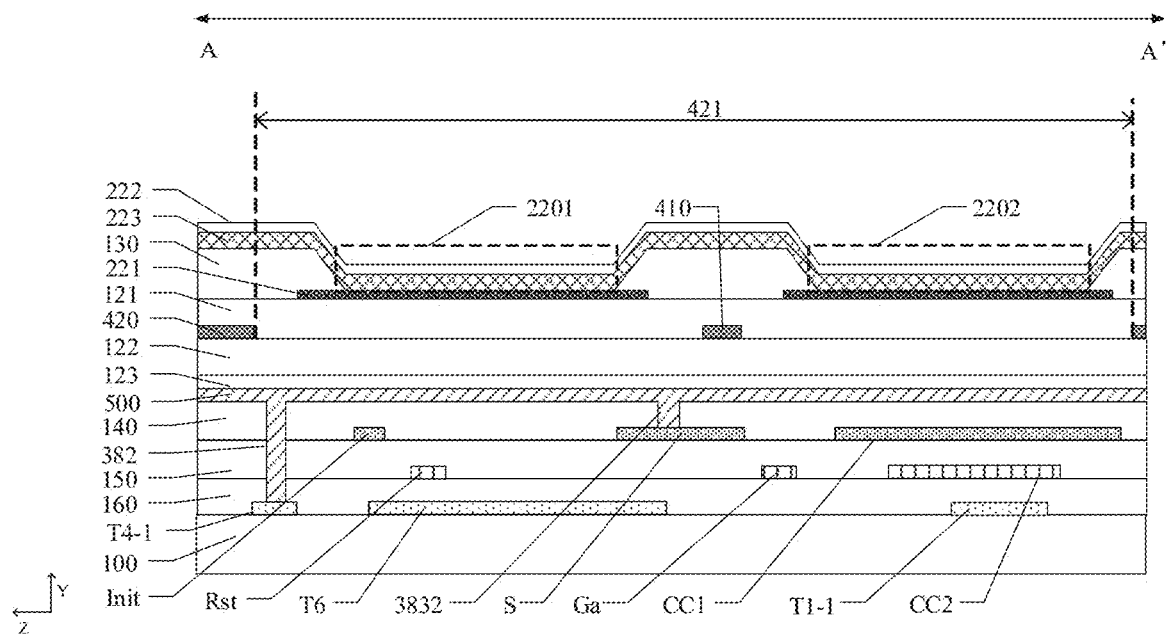
FIG. 7B is a schematic sectional view of a display substrate taken along an AA' line, in accordance with some embodiments of the present disclosure.
Figure 7C:
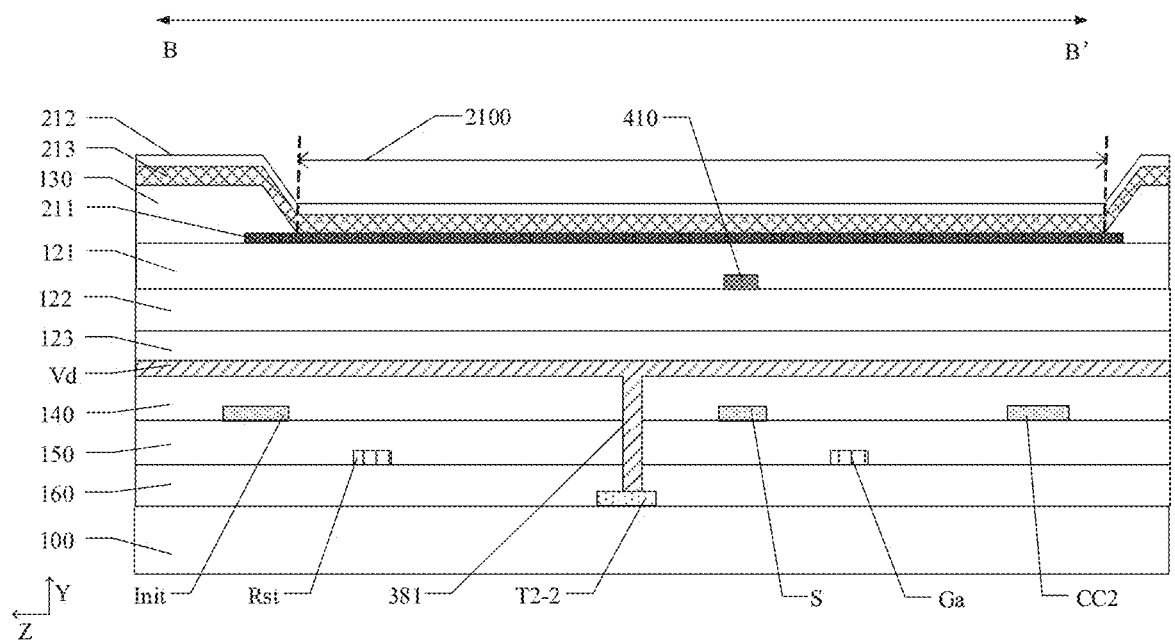
FIG. 7C is a schematic sectional view of a display substrate taken along a BB' line, in accordance with some embodiments of the present disclosure.
Figure 7D:
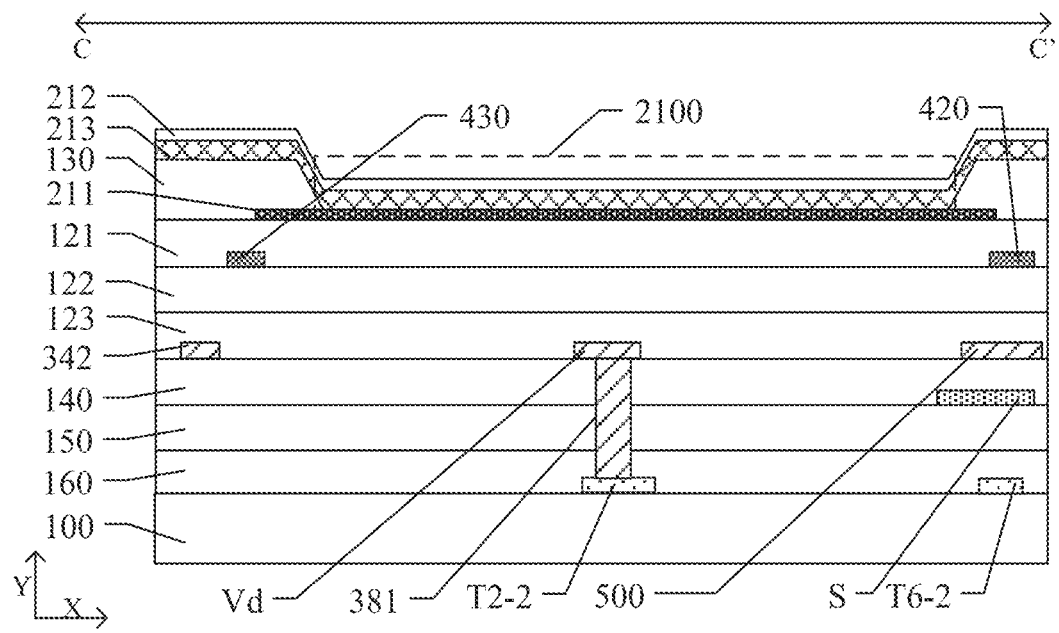
FIG. 7D is a schematic sectional view of a display substrate taken along a CC' line, in accordance with some embodiments of the present disclosure.
Figure 7E:
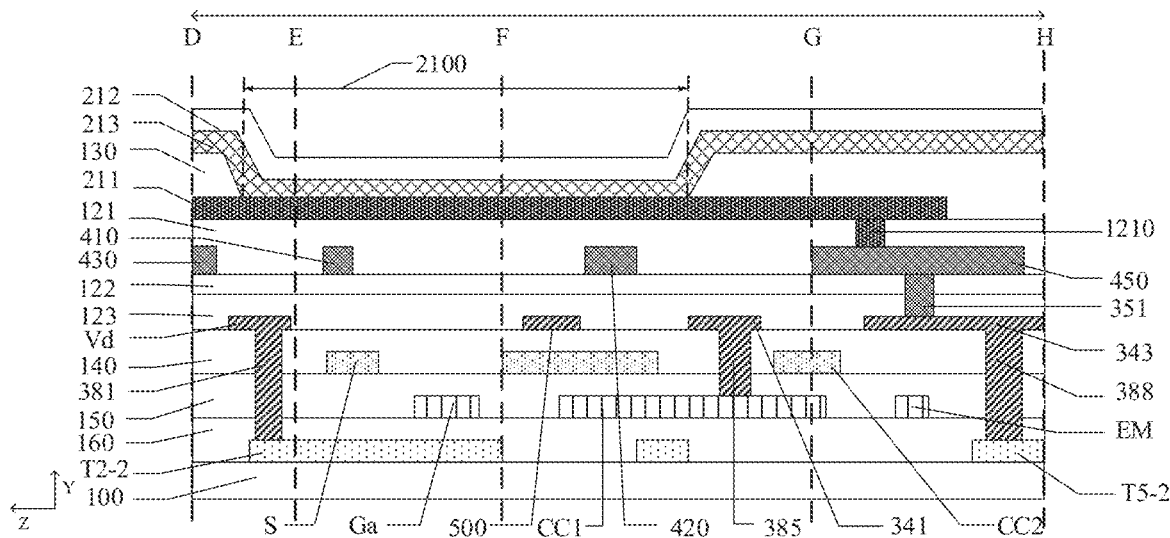
FIG. 7E is a schematic sectional view of a display substrate taken along a D-E-F-G-H line, in accordance with some embodiments of the present disclosure.
Figure 7F:
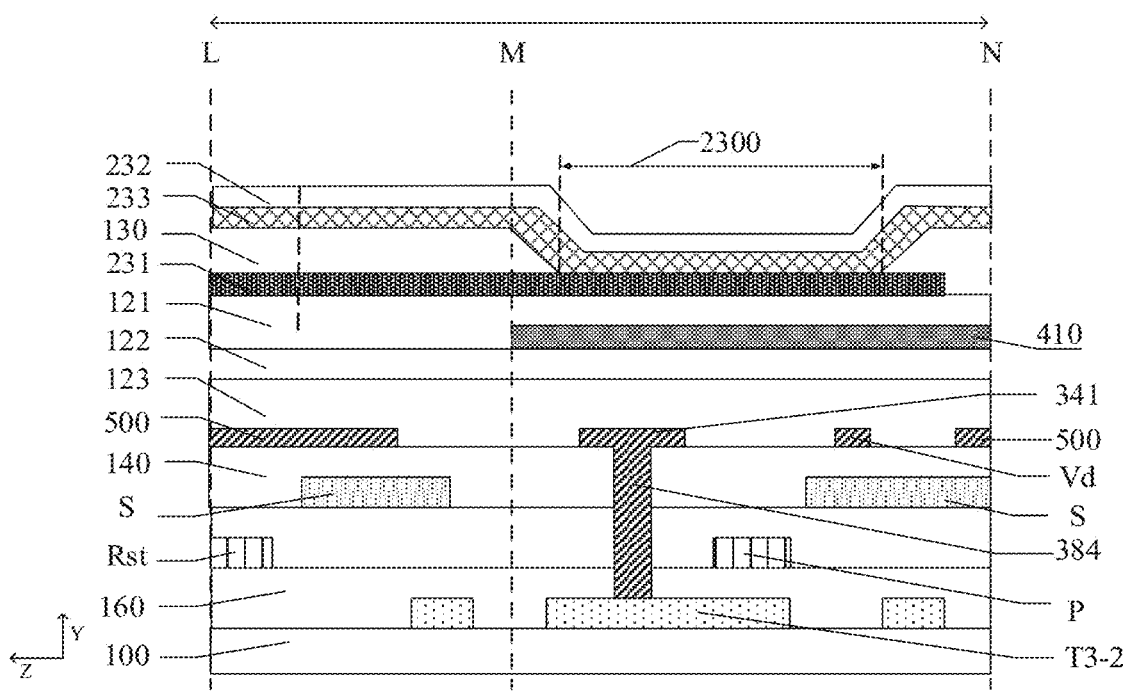
FIG. 7F is a schematic sectional view of a display substrate taken along an L-M-N line, in accordance with some embodiments of the present disclosure.
Figure 7G:
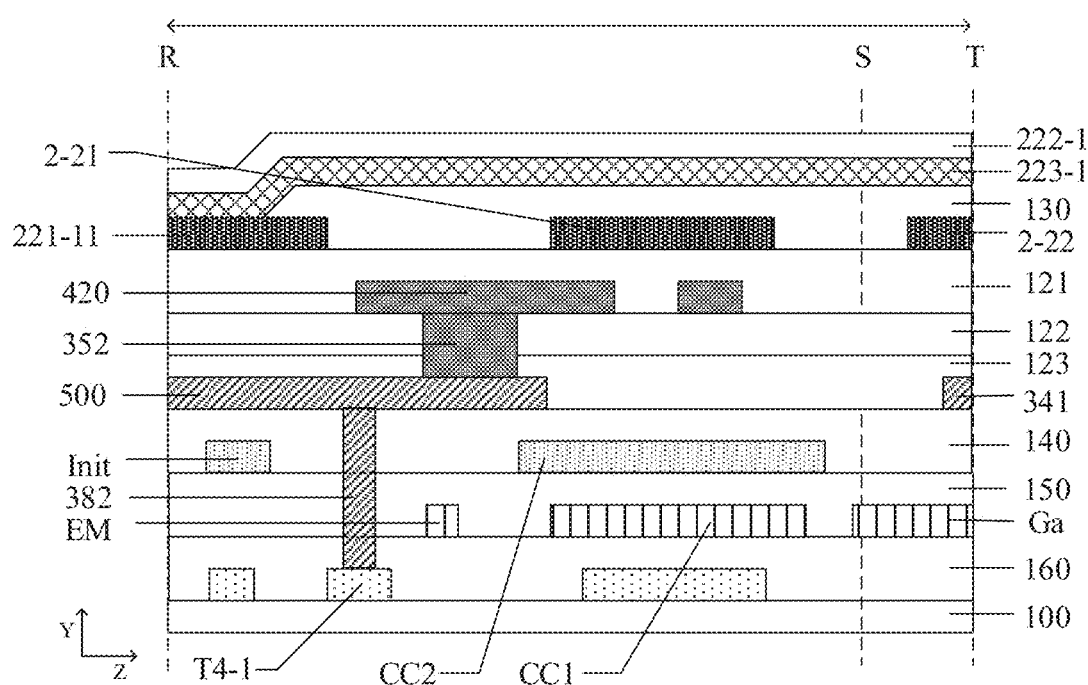
FIG. 7G is a schematic sectional view of a display substrate taken along an R-S-T line, in accordance with some embodiments of the present disclosure.

In order to clearly describe a layer structure of the display substrate 10 in some embodiments of the present disclosure, referring to FIG. 7A, some embodiments of the present disclosure further illustrate sections of a plurality of local regions in the display substrate 10. FIG. 7B is a schematic sectional view of the display substrate 10 shown in FIG. 7A taken along the AA' line. FIG. 7C is a schematic sectional view of the display substrate 10 shown in FIG. 7A taken along the BB' line. FIG. 7D is a schematic sectional view of the display substrate 10 shown in FIG. 7A taken along the CC' line. FIG. 7E is a schematic sectional view of the display substrate 10 shown in FIG. 7A taken along the D-E-F-G-H line. FIG. 7F is a schematic sectional view of the display substrate 10 shown in FIG. 7A taken along the L-M-N line. FIG. 7G is a schematic sectional view of the display substrate 10 shown in FIG. 7A taken along the R-S-T line. The following description will be understood with reference to FIGS. 6A to 6I and FIGS. 7A to 7G.

Herein, the sectional views in FIGS. 7B to 7G are all illustrated by taking an example in which the passivation layer 123 and the first planarization layer 122 are formed between the first metal layer 340 and the second metal layer 350, and the first planarization layer 122 is located on a side of the passivation layer 123 away from the base substrate 100. But the embodiments of the present disclosure are not limited thereto.

It will be understood with reference to FIGS. 7B to 7G, the display substrate 10 further includes a pixel defining layer 130 disposed on the pixel electrode layer 360. The pixel defining layer 130 has a plurality of openings for defining the effective light-emitting regions of the sub-pixels. A light-emitting device 0220 includes an anode, a light-emitting layer and a cathode that are sequentially stacked. The anode of the light-emitting device 0220 is coupled to the pixel circuit 0221. An opening in the pixel defining layer 130 exposes the anode of the light-emitting device 0220. At least a portion of the light-emitting layer of the light-emitting device 0220 is located within the opening, and the cathode is located at a side of the pixel defining layer 130 facing the base substrate. In a case where the light-emitting layer of the light-emitting device 0220 is formed in the opening of the pixel defining layer 130, a portion of the light-emitting layer in contact with the anode is able to emit light under driving of voltages of the anode and the cathode to form an effective light-emitting region.

Herein, the "effective light-emitting region" may refer to a two-dimensional planar region, which is parallel to the base substrate 100. It will be noted that, a size of a portion of the opening of the pixel defining layer 130 away from the base substrate 100 is slightly greater than a size of a portion thereof proximate to the base substrate 100 due to process reasons, or a size of the opening of the pixel defining layer 130 in a direction from a side thereof proximate to the base substrate 100 to a side thereof away from the base substrate 100 gradually increases, and thus a size of the effective light-emitting region may be slightly different from sizes of the opening of the pixel defining layer 130 at different positions, but shapes and sizes of the regions are approximately equivalent. For example, an orthogonal projection of the effective light-emitting region on the base substrate 100 approximately coincides with an orthogonal projection of a corresponding opening in the pixel defining layer 130 on the base substrate 100. For example, the orthogonal projection of the effective light-emitting region on the base substrate 100 is completely located within the orthogonal projection of the corresponding opening in the pixel definition layer 130 on the base substrate 100, and shapes of the two orthogonal projections are similar, and an area of the orthogonal projection of the effective light-emitting region on the base substrate 100 is slightly less than an area of the orthogonal projection of the corresponding opening in the pixel definition layer 130 on the base substrate 100.

As shown in FIG. 7A, there is spacing between the first sub-effective light-emitting region 2201 and the second sub-effective light-emitting region 2202 included in the second color sub-pixel pair 220. The "spacing" refers to a material portion of the pixel definition layer 130 between two openings defined by the pixel definition layer 130.

In addition, in the same second color sub-pixel pair 220, a dimension of spacing between the first sub-effective light-emitting region 2201 and the second sub-effective light-emitting region 2202 in the second direction is less than a dimension of the first effective light-emitting region 2100 in the second direction, and the dimension of the spacing in the second direction is less than a dimension of the third effective light-emitting region 2300 in the second direction.

Optionally, in the second direction, the dimension of the first effective light-emitting region 2100 is greater than the dimension of the third effective light-emitting region 2300. For example, the dimension of the first effective light-emitting region 2100 may be 45 micrometers to 49 micrometers, e.g., 47 micrometers; the dimension of the third effective light-emitting region 2300 may be 38 micrometers to 42 micrometers, e.g., 40 micrometers.

In some examples, as shown in FIG. 7A, shapes of the first sub-effective light-emitting region 2201 and the second sub-effective light-emitting region 2202 are approximately the same. A ratio of a distance from the orthogonal projection of the first sub-power signal line 410 on the base substrate 100 to a center of an orthogonal projection of the first sub-effective light-emitting region 2201 on the base substrate 100 to a distance from the orthogonal projection of the first sub-power signal line 410 on the base substrate 100 to a center of an orthogonal projection of the second sub-effective light-emitting region 2202 on the base substrate 100 is 0.9 to 1.1. For example, the distance from the orthogonal projection of the first sub-power signal line 410 on the base substrate 100 to the center of the orthogonal projection of the first sub-effective light-emitting region 2201 on the base substrate 100 and the distance from the orthogonal projection of the first sub-power signal line 410 on the base substrate 100 to the center of the orthogonal projection of the second sub-effective light-emitting region 2202 on the base substrate 100 are approximately equal. Thus, the first sub-effective light-emitting region 2201 and the second sub-effective light-emitting region 2202 included in the second color sub-pixel pair 220 are symmetrically distributed relative to the first sub-power signal line 410, which is beneficial to ensuring environmental consistency of the first sub-pixel 22-1 and the second sub-pixel 22-2 included in the second color sub-pixel pair 220. But the embodiments of the present disclosure are not limited thereto. For example, the orthogonal projection of the first sub-power signal line 410 on the base substrate 100 may be closer to one sub-pixel in the second color sub-pixel pair 220. Furthermore, optionally, the orthogonal projection of the first sub-power signal line 410 on the base substrate 100 is not overlapped with orthogonal projections of pixel electrodes of the first sub-pixel 22-1 and the second sub-pixel 22-2 in the second color sub-pixel pair 220 on the base substrate 100.

A center of an orthogonal projection refers to a geometric center of orthogonal projection shape, and the shape of the orthogonal projection of the effective light-emitting region on the base substrate is determined by the shape of the effective light-emitting region, which is approximately the same as a shape of an opening of the corresponding pixel defining layer 130.

For example, as shown in FIG. 7A, the shapes of the first sub-effective light-emitting region 2201 and the second sub-effective light-emitting region 2202 included in the second color sub-pixel pair 220 include a pentagon, a circle, or a water-drop shape. For example, FIG. 7A schematically illustrates that the shapes of the first sub-effective light-emitting region 2201 and the second sub-effective light-emitting region 2202 are pentagons, and a pentagon includes a set of parallel opposite edges (parallel to the second direction) and a vertical edge (parallel to the first direction) perpendicular to the set of parallel opposite edges. Two vertical edges of the first sub-effective light-emitting region 2201 and the second sub-effective light-emitting region 2202 in each second color sub-pixel pair 220 are disposed adjacent to each other. For example, the first sub-power signal line 410 is located between the two vertical edges and passes through a midpoint of the shortest line between the two vertical edges.

In addition, although the shapes of the first sub-effective light-emitting region 2201 and the second sub-effective light-emitting region 2202 in FIG. 7A include strict corners each formed by two line segments, in some embodiments, an interfacing shape of two line segments of the first sub-effective light-emitting region 2201 and the second sub-effective light-emitting region 2202 may be a rounded corner pattern, such as a circle or a water-drop shape. That is, corners of the first sub-effective light-emitting region 2201 and the second sub-effective light-emitting region 2202 are rounded on a basis of the pentagonal shape. For example, in a case where openings of the pixel defining layer 130 are formed, corner portions of an opening may be formed into a rounded-corner shape, so that a shape of the formed effective light-emitting region may be a rounded-corner shape.

A partial section of the second color sub-pixel pair 220 is as shown in FIG. 7B. In the second color sub-pixel pair 220, a light-emitting layer 223 and a cathode layer 222 are sequentially stacked and formed on a surface of the pixel defining layer 130 away from the base substrate 100, and the light-emitting layer 223 is in contact with the pixel electrodes 221 exposed by a corresponding opening in the pixel defining layer 130. Some embodiments of the present disclosure are described by taking an example in which the light-emitting layers 223 of the first sub-pixel 22-1 and the second sub-pixel 22-2 included in the second color sub-pixel pair 220 are integrated. For example, the light-emitting layers 223 of the first sub-pixel 22-1 and the second sub-pixel 22-2 in the same second color sub-pixel pair 220 are a connected integral film layer, that is, the light-emitting layers 223 of the first sub-pixel 22-1 and the second sub-pixel 22-2 are a continuously integral pattern; or orthogonal projections of the light-emitting layers 223 of the first sub-pixel 22-1 and the second sub-pixel 22-2 in the same second color sub-pixel pair 220 on the base substrate 100 are continuously integral, and the light-emitting layers 223 of the first sub-pixel 22-1 and the second sub-pixel 22-2 may be manufactured and obtained through an opening. But the embodiments of the present disclosure are not limited thereto. For example, the light-emitting layers of the first sub-pixel 22-1 and the second sub-pixel 22-2 included in the same second color sub-pixel pair 220 may also be separated.

A partial section of the first color sub-pixel 210 is as shown in FIGS. 7C and 7D. In the first color sub-pixel 210, a light-emitting layer 213 and a cathode layer 212 are sequentially stacked and formed on the surface of the pixel defining layer 130 away from the base substrate 100, and the light-emitting layer 213 is in contact with the pixel electrode 211 exposed by a corresponding opening in the pixel defining layer 130.

Another partial section of the first color sub-pixel 210 is as shown in FIG. 7E. In the first color sub-pixel 210, the pixel electrode 211 is electrically connected to the connection electrode 450 through the via hole 1210 passing through the second planarization layer 121. The connection electrode 450 is electrically connected to the driving electrode 343 through the via hole 351 passing through the first planarization layer 122 and the passivation layer 123. The driving electrode 343 is electrically connected to the second electrode T5-2 of the second light-emitting control transistor through the via hole 388 passing through the second interlayer insulating layer 140, the first interlayer insulating layer 150 and the gate insulating layer 160. Orthogonal projections of the via hole 1210, the via hole 351 and the via hole 388 on the base substrate 100 are not overlapped with each other, and there is spacing between every two of the orthogonal projections.

A partial section of the third color sub-pixel 230 is as shown in FIG. 7F. In the third color sub-pixel 230, an orthogonal projection of the pixel electrode 231 on the base substrate 100 is partially overlapped with the orthogonal projection of the first sub-power signal line 410 on the base substrate 100. A light-emitting layer 233 and a cathode layer 232 are sequentially stacked and formed on the surface of the pixel defining layer 130 away from the base substrate 100, and the light-emitting layer 233 is in contact with the pixel electrode 231 exposed by the corresponding opening in the pixel defining layer 130.

A partial section of the first sub-pixel 22-1 is as shown in FIG. 7G. In the first sub-pixel 22-1, the pixel electrode 221-1 includes the main body portion 221-11, the bending portion 2-21 and the compensation portion 2-22. A light-emitting layer 223-1 and a cathode layer 222-1 are sequentially stacked on the surface of the pixel defining layer 130 away from the base substrate 100, and the light-emitting layer 223-1 is in contact with the main body portion 221-11 of the pixel electrode 221-1 exposed by the corresponding opening in the pixel defining layer 130. In the section taken along the R-S line in FIG. 7A, there is spacing both between the main body portion 221-11 of the pixel electrode 221-1 and the bending portion 2-21, and between the bending portion 2-21 and the compensation portion 2-22. The second sub-power signal line 420 of the first power signal line 400 may be electrically connected to the second power signal line 500 through the via hole 352 passing through the first planarization layer 122 and the passivation layer 123. The second power signal line 500 may be electrically connected to the first electrode T4-1 of the first light-emitting control transistor through the via hole 382 passing through the second interlayer insulating layer 140, the first interlayer insulating layer 150 and the gate insulating layer 160.

In some of the above embodiments, a plurality of insulating layers, such as the gate insulating layer 160, the first interlayer insulating layer 150, the second interlayer insulating layer 140, the passivation layer 123, the first planarization layer 122 and the second planarization layer 121 are used for insulating and protecting corresponding conductive layers, such as metal layers or semiconductor layers. Optionally, the gate insulating layer 160, the first interlayer insulating layer 150, the second interlayer insulating layer 140 and the passivation layer 123 are made of an inorganic insulating material, such as silicon nitride or silicon oxide. The first planarization layer 122 and the second planarization layer 121 are made of an organic insulating material, such as organic insulating resin.

Some other embodiments of the present disclosure provide a display apparatus including any one of the above display substrates. The display apparatus may avoid a color shift phenomenon as much as possible, and may also include the fingerprint detection technology. The display apparatus has relatively high fingerprint detection sensitivity.

In the description of the above embodiments, specific features, structures, materials or characteristics may be combined in any suitable manner in any one or more embodiments or examples.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
   a base substrate;
   a plurality of sub-pixels; each sub-pixel of the plurality of sub-pixels including a pixel electrode and an effective light-emitting region, the pixel electrode including a main body portion and a connection portion that are interconnected with each other; shapes of the main body portion and the effective light-emitting region being same, and a portion of a border of the main body portion forming at least partial border of the pixel electrode; the plurality of sub-pixels at least including a first sub-pixel and a second sub-pixel, a color of light emitted by the first sub-pixel and the second sub-pixel being same; and
   a first insulating layer and a plurality of connection electrodes; the first insulating layer being located between all pixel electrodes of the plurality of sub-pixels and the plurality of connection electrodes and having a plurality of first via holes; a pixel electrode of the all pixel electrodes being correspondingly coupled to a connection electrode of the plurality of connection electrodes through a first via hole of the plurality of first via holes;
   wherein areas of orthogonal projections of two pixel electrodes of the first sub-pixel and the second sub-pixel on the base substrate are unequal; and two orthogonal projections of a connection portion and a main body portion of at least one of the first sub-pixel or the second sub-pixel on a straight line extending in a first direction are at least partially non-overlapped;
   an orthogonal projection of a pixel electrode of the second sub-pixel on a straight line extending in a second direction is located within an orthogonal projection of a pixel electrode of the first sub-pixel on the same straight line; and
   the second direction intersects with the first direction, and an included angle between the second direction and the first direction is in a range from 80° to 100°;
   wherein the sub-pixel further includes a pixel circuit, and all pixel circuits of the plurality of sub-pixels are arranged in the first direction to form rows and are arranged in the second direction to form columns, wherein
   orthogonal projections of first via holes corresponding to a same row of pixel circuits on the base substrate are arranged along a first straight line; and
   in sub-pixels corresponding to the same row of pixel circuits, effective light-emitting regions of first sub-pixels and effective light-emitting regions of second sub-pixels are respectively located at opposite sides of the first straight line.

2. The display substrate according to claim 1, wherein the main body portion of the at least one of the first sub-pixel or the second sub-pixel includes a first edge, a second edge and a third edge that are connected in sequence, and the third edge extends in the second direction;
   the connection portion of the at least one of the first sub-pixel or the second sub-pixel is connected to the second edge, and the connection portion of the at least one of the first sub-pixel or the second sub-pixel and the first edge have a spacing therebetween; and
   a region enclosed by the main body portion of the at least one of the first sub-pixel or the second sub-pixel, the connection portion of the at least one of the first sub-pixel or the second sub-pixel and a connecting straight line between any point on the first edge and any point on an edge of the connection portion of the at least one of the first sub-pixel or the second sub-pixel extending in the second direction and away from the third edge in the first direction, is a notch region.

3. The display substrate according to claim 2, further comprising a plurality of layers between the base substrate and the all pixel electrodes of the plurality of sub-pixels, the plurality of layers including at least one metal pattern; wherein
   in a thickness direction of the base substrate, at least portion of the notch region is non-overlapping with the metal pattern; or
   further comprising a plurality of layers between the base substrate and the all pixel electrodes of the plurality of sub-pixels, the plurality of layers including a semiconductor pattern and at least one metal pattern; wherein
   in a thickness direction of the base substrate, at least portion of the notch region is non-overlapping with the semiconductor pattern and the metal pattern; or
   wherein a connection portion of the pixel electrode of the first sub-pixel includes: a bending portion and a compensation portion connected to the bending portion; and
   the compensation portion extends in the second direction, the bending portion is connected to the second edge, and the bending portion and the first edge have a spacing therebetween.

4. The display substrate according to claim 2, wherein a connection portion of the pixel electrode of the first sub-pixel includes: a bending portion and a compensation portion connected to the bending portion;
the compensation portion extends in the second direction, the bending portion is connected to the second edge, and the bending portion and the first edge have a spacing therebetween; and
a ratio of areas of two orthogonal projections of the notch region and the bending portion on the base substrate is in a range from 0.2 to 5; or
a maximum dimension of the compensation portion in the first direction is greater than a maximum dimension of the bending portion in the first direction; or
a maximum dimension of a connection portion of the pixel electrode of the second sub-pixel in the second direction is less than or equal to a maximum dimension of the bending portion of the pixel electrode of the first sub-pixel in the second direction.

5. The display substrate according to claim 1, wherein the pixel circuit including a driving transistor; and
the display substrate further comprises metal patterns at a same potential as a control electrode of the driving transistor, orthogonal projections of the metal patterns on the base substrate being first projections; wherein
an area of a region where an orthogonal projection of the pixel electrode of the first sub-pixel on the base substrate and a first projection corresponding to the first sub-pixel overlap is a first area;
an area of a region where an orthogonal projection of the pixel electrode of the second sub-pixel on the base substrate and a first projection corresponding to the second sub-pixel overlap is a second area; and
a ratio of the first area to the second area is in a range from 0.8 to 1.2.

6. The display substrate according to claim 5, further comprising: a first gate metal layer located between the base substrate and the all pixel electrodes of the plurality of sub-pixels, and a first metal layer located between the first gate metal layer and the all pixel electrodes of the plurality of sub-pixels;
the metal patterns at the same potential as the control electrode of the driving transistor including: first electrodes, located in the first gate metal layer, of capacitors, and first transfer electrodes located in the first metal layer; wherein
an area of a region where orthogonal projections of the pixel electrode of the first sub-pixel and a first electrode of a corresponding capacitor on the base substrate overlap is less than an area of a region where orthogonal projections of the pixel electrode of the second sub-pixel and a first electrode of a corresponding capacitor on the base substrate overlap; and an area of a region where orthogonal projections of the pixel electrode of the first sub-pixel and a corresponding first transfer electrode on the base substrate overlap is greater than an area of a region where orthogonal projections of the pixel electrode of the second sub-pixel and a corresponding first transfer electrode on the base substrate overlap.

7. The display substrate according to claim 1, further comprising: a plurality of signal lines extending in the first direction, an orthogonal projection of the pixel electrode of the first sub-pixel on the base substrate being overlapped with orthogonal projections of at least three signal lines in a same layer on the base substrate; or
further comprising: a plurality of signal lines extending in the first direction, an orthogonal projection of the pixel electrode of the first sub-pixel on the base substrate being overlapped with orthogonal projections of at least three signal lines in a same layer on the base substrate; wherein the at least three signal lines in the same layer include:
at least one gate scanning signal line, at least one light-emitting control signal line, and at least one reset control signal line.

8. The display substrate according to claim 1, further comprising a second insulating layer and a plurality of driving electrodes;
the second insulating layer being located between the plurality of connection electrodes and the plurality of driving electrodes, and having a plurality of second via holes; and the connection electrode being correspondingly coupled to a driving electrode of the plurality of driving electrodes through a second via hole of the plurality of second via holes; wherein
orthogonal projections of a first via hole and a second via hole corresponding to a same connection electrode on the base substrate have a spacing therebetween.

9. The display substrate according to claim 8, wherein orthogonal projections of second via holes corresponding to the same row of pixel circuits on the base substrate are arranged along a second straight line; or
a distance between an orthogonal projection of any one of the first via hole and the second via hole corresponding to the same connection electrode on the base substrate and an effective light-emitting region of a corresponding sub-pixel is greater than 2 μm; or
shapes of orthogonal projections of the first via hole and the second via hole corresponding to the same connection electrode on the base substrate are approximately same, and areas of the orthogonal projections of the first via hole and the second via hole corresponding to the same connection electrode on the base substrate are approximately same; and the orthogonal projections of the first via hole and the second via hole corresponding to the same connection electrode on the base substrate are arranged along a third straight line.

10. The display substrate according to claim 9, wherein shapes of orthogonal projections of the driving electrode and the connection electrode on the base substrate are approximately same, and an area of an orthogonal projection of the connection electrode on the base substrate is greater than an area of an orthogonal projection of the driving electrode on the base substrate.

11. The display substrate according to claim 10, wherein the orthogonal projection of the driving electrode on the base substrate is located within the orthogonal projection of the connection electrode on the base substrate, and partial borders of orthogonal projections of the driving electrode and the connection electrode approximately coincide; or
the orthogonal projection of the driving electrode on the base substrate is located within the orthogonal projection of the connection electrode on the base substrate, and partial borders of orthogonal projections of the driving electrode and the connection electrode approximately coincide; and
the orthogonal projection of the connection electrode on the base substrate has a portion being non-overlapping with the orthogonal projection of the driving electrode on the base substrate, and an orthogonal projection of the first via hole corresponding to the same connection electrode on the base substrate is overlapped with the portion.

12. The display substrate according to claim 8, further comprising a semiconductor pattern layer and a third insulating layer, the semiconductor pattern layer being located between the base substrate and the plurality of driving electrodes; the third insulating layer being located between the plurality of driving electrodes and the semiconductor pattern layer, and having a plurality of third via holes; the driving electrode being coupled to a corresponding portion of the semiconductor pattern layer through a third via hole of the plurality of third via holes; wherein
every two of three orthogonal projections of a third via hole, a second via hole and a first via hole corresponding to a same driving electrode on the base substrate have a spacing therebetween.

13. The display substrate according to claim 12, wherein
a minimum distance between an orthogonal projection of any one of the first via hole and the second via hole corresponding to the same driving electrode on the base substrate and an orthogonal projection of the third via hole corresponding to the same driving electrode on the base substrate is in a range from 0.8 µm to 10 µm; and
a minimum distance between orthogonal projections of the first via hole and the second via hole corresponding to the same driving electrode on the base substrate is in a range from 1 µm to 10 µm; or
a minimum distance between an orthogonal projection of any one of the first via hole and the second via hole corresponding to the same driving electrode on the base substrate and an orthogonal projection of the third via hole corresponding to the same driving electrode on the base substrate is in a range from 0.8 µm to 10 µm; and
a minimum distance between orthogonal projections of the first via hole and the second via hole corresponding to the same driving electrode on the base substrate is in a range from 1 µm to 10 µm;
the display substrate further comprises a plurality of data lines disposed in a same layer with the plurality of driving electrodes; the third insulating layer further has a plurality of fourth via holes; and a data line of the plurality of data lines is connected to a corresponding pixel circuit through a fourth via hole of the plurality of fourth via holes; wherein
the data line extends in the second direction, and includes a plurality of protrusion portions protruding towards the corresponding pixel circuit in the first direction; and
an overlapping area of an orthogonal projection of the fourth via hole on the base substrate and an orthogonal projection of a protrusion portion of the plurality of protrusion portions on the base substrate is 70% to 100% of an area of the orthogonal projection of the fourth via hole on the base substrate.

14. The display substrate according to claim 8, further comprising a plurality of power signal lines, the plurality of power signal lines including at least one first power signal line; the at least one first power signal line and the plurality of connection electrodes being disposed in a same layer; wherein
a first power signal line of the at least one first power signal line includes a plurality of first sub-power signal lines extending in the first direction and a plurality of second sub-power signal lines extending in the second direction; and the plurality of first sub-power signal lines are interconnected with the plurality of second sub-power signal lines;
two effective light-emitting regions of a first sub-pixel and a second sub-pixel closest to each other have a spacing therebetween; and an orthogonal projection of a first sub-power signal line of the plurality of first sub-power signal lines on the base substrate passes through the spacing between the two effective light-emitting regions of the first sub-pixel and the second sub-pixel;
at least one second sub-power signal line of the plurality of second sub-power signal lines have at least one break; and a virtual connection line between two end points of the at least one break in the second direction extends through the two effective light-emitting regions of the first sub-pixel and the second sub-pixel and the spacing therebetween; and
the at least one second sub-power signal line having the at least one break is non-overlapping with orthogonal projections of the two effective light-emitting regions of the first sub-pixel and the second sub-pixel and the spacing therebetween on the base substrate.

15. The display substrate according to claim 14, wherein the plurality of power signal lines further include a plurality of second power signal lines extending in the second direction;
the plurality of second power signal lines and the plurality of driving electrodes are disposed in a same layer; the second insulating layer further has a plurality of fifth via holes; and a second sub-power signal line of the plurality of second sub-power signal lines is correspondingly coupled to a second power signal line of the plurality of second power signal lines through a fifth via hole of the plurality of fifth via holes; and
orthogonal projections of the second power signal line and the second sub-power signal line coupled thereto on the base substrate are at least partially overlapped; and
an orthogonal projection of the second power signal line on the base substrate is partially overlapped with an orthogonal projection of an effective light-emitting region of any one of the first sub-pixel and the second sub-pixel on the base substrate; or
wherein the plurality of power signal lines further include a plurality of second power signal lines extending in the second direction;
the plurality of second power signal lines and the plurality of driving electrodes are disposed in a same layer; the second insulating layer further has a plurality of fifth via holes; and
a second sub-power signal line of the plurality of second sub-power signal lines is correspondingly coupled to a second power signal line of the plurality of second power signal lines through a fifth via hole of the plurality of fifth via holes;
orthogonal projections of the second power signal line and the second sub-power signal line coupled thereto on the base substrate are at least partially overlapped;
an orthogonal projection of the second power signal line on the base substrate is partially overlapped with an orthogonal projection of an effective light-emitting region of any one of the first sub-pixel and the second sub-pixel on the base substrate; and
a distance between an orthogonal projection of the fifth via hole on the base substrate and an orthogonal projection of any effective light-emitting region on the base substrate is greater than 2.5 µm.

16. The display substrate according to claim 14, wherein the first sub-pixel and the second sub-pixel closest to each other form a sub-pixel pair;
the plurality of sub-pixels further include first color sub-pixels and third color sub-pixels; wherein one first color sub-pixel, one sub-pixel pair and one third color sub-pixel that are sequentially arranged in the first direction form a sub-pixel group, and the sub-pixel pair is configured to emit light with a second color; and a center of an orthogonal projection of at least one of a first effective light-emitting region of the first color sub-pixel or a third effective light-emitting region of the third color sub-pixel on the base substrate is located within an orthogonal projection of a corresponding first sub-power signal line on the base substrate.

17. The display substrate according to claim 16, wherein distances from two second sub-power signal lines located at both sides of the first effective light-emitting region of the first color sub-pixel and adjacent to the first effective light-emitting region to a center line of the first effective light-emitting region extending in the second direction are different; and the display substrate further comprises a plurality of pad blocks and a plurality of supporting portions that are disposed in the same layer with the at least one first power signal line; the plurality of pad blocks extend in the second direction; a pad block of the plurality of pad blocks is located between the first effective light-emitting region and the second sub-power signal line, and is correspondingly coupled to the second sub-power signal line through a supporting portion of the plurality of supporting portions; a distance between the second sub-power signal line coupled to the pad block and the center line of the first effective light-emitting region extending in the second direction is greater than a distance between another second sub-power signal line adjacent to the first effective light-emitting region and the center line; and the pad block is further correspondingly coupled to the first sub-power signal line; or wherein distances from two second sub-power signal lines located at both sides of the first effective light-emitting region of the first color sub-pixel and adjacent to the first effective light-emitting region to a center line of the first effective light-emitting region extending in the second direction are different;

the display substrate further comprises a plurality of pad blocks and a plurality of supporting portions that are disposed in a same layer with the at least one first power signal line; the plurality of pad blocks extend in the second direction; a pad block of the plurality of pad blocks is located between the first effective light-emitting region and the second sub-power signal line, and is correspondingly coupled to the second sub-power signal line through a supporting portion of the plurality of supporting portions; a distance between the second sub-power signal line coupled to the pad block and the center line of the first effective light-emitting region extending in the second direction is greater than a distance between another second sub-power signal line adjacent to the first effective light-emitting region and the center line; and the pad block is further correspondingly coupled to the first sub-power signal line; and a shape of the pad block is approximately elongated; and a center of an orthogonal projection of the pad block on the base substrate is located within the orthogonal projection of the first sub-power signal line coupled to the pad block on the base substrate.

18. The display substrate according to claim 16, wherein a ratio of a distance between an orthogonal projection of an effective light-emitting region of the first sub-pixel on the base substrate and the orthogonal projection of the first sub-power signal line on the base substrate and a distance between an orthogonal projection of an effective light-emitting region of the second sub-pixel on the base substrate and the orthogonal projection of the first sub-power signal line on the base substrate is in a range from 0.9 to 1.1, and the first sub-power signal line is located between the two effective light-emitting regions of the first sub-pixel and the second sub-pixel.

19. A display apparatus, comprising the display substrate according to claim 1.

* * * * *